(12) United States Patent
Ohta et al.

(10) Patent No.: US 10,707,404 B2
(45) Date of Patent: Jul. 7, 2020

(54) PIEZOELECTRIC ELEMENT

(71) Applicant: TDK CORPORATION, Tokyo (JP)

(72) Inventors: Yoshiki Ohta, Tokyo (JP); Satoshi Sasaki, Tokyo (JP); Yoshiaki Ohta, Tokyo (JP); Takahiro Kezuka, Tokyo (JP); Katsuya Inaba, Tokyo (JP); Rin Sato, Tokyo (JP); Kazushi Tachimoto, Tokyo (JP); Masayoshi Inoue, Tokyo (JP); Yuzo Komatsu, Tokyo (JP)

(73) Assignee: TDK CORPORATION, Tokyo (JP)

( * ) Notice: Subject to any disclaimer, the term of this patent is extended or adjusted under 35 U.S.C. 154(b) by 454 days.

(21) Appl. No.: 15/640,747

(22) Filed: Jul. 3, 2017

(65) Prior Publication Data

US 2018/0013056 A1    Jan. 11, 2018

(30) Foreign Application Priority Data

Jul. 7, 2016  (JP) ................................. 2016-135277
Jul. 7, 2016  (JP) ................................. 2016-135278
Jul. 7, 2016  (JP) ................................. 2016-135280
Jul. 7, 2016  (JP) ................................. 2016-135283
Jul. 7, 2016  (JP) ................................. 2016-135284

(51) Int. Cl.
*H01L 41/083*     (2006.01)
*H01L 41/047*     (2006.01)

(52) U.S. Cl.
CPC ...... *H01L 41/0838* (2013.01); *H01L 41/0471* (2013.01); *H01L 41/0472* (2013.01)

(58) Field of Classification Search
CPC . H01L 41/0471; H01L 41/047; H01L 41/083; H01L 41/0472; H01L 41/0838
See application file for complete search history.

(56) References Cited

U.S. PATENT DOCUMENTS 5,381,385 A * 1/1995 Greenstein .............. B06B 1/064
                                                    310/334
6,798,059 B1 * 9/2004 Ishihara ................ B06B 1/0622
                                                    257/700

(Continued)

FOREIGN PATENT DOCUMENTS

DE    102010049311 A1    4/2012
JP       2003318457 A  * 11/2003

(Continued)

*Primary Examiner* — J. San Martin
(74) *Attorney, Agent, or Firm* — Oliff PLC

(57) ABSTRACT

In a piezoelectric element, internal stress generated in an inactive portion at the time of sintering when a piezoelectric element is fabricated or stress applied from the outside to the inactive portion is absorbed by a recess of a lower surface of a first through hole conductor and a recess of an upper surface of a second through hole conductor. Accordingly, for example, deformation, rupture, or the like of the through hole conductor is prevented, and conduction failure or disconnection of an electrode layer or a through hole conductor is prevented. Further, in the inactive portion, since a protrusion of the piezoelectric layer enters the recess of the through hole conductor, a holding force of the piezoelectric layer with respect to the through hole conductor increases, and deformation of the through hole conductor is prevented or obstructed.

18 Claims, 55 Drawing Sheets

(56) References Cited

U.S. PATENT DOCUMENTS

| | | | | |
|---|---|---|---|---|
| 7,323,807 B2* | 1/2008 | Sasaki | ............... | H01L 41/0474 310/365 |
| 2005/0122661 A1* | 6/2005 | Sasaki | ............... | H01L 41/083 361/302 |
| 2005/0253270 A1* | 11/2005 | Sasaki | ............... | H01L 41/083 257/758 |
| 2006/0119220 A1 | 6/2006 | Iwase et al. | | |
| 2011/0006645 A1* | 1/2011 | Chen | ............... | H01L 41/0474 310/366 |
| 2013/0214647 A1* | 8/2013 | Ohnishi | ............... | H01L 41/047 310/365 |
| 2015/0137668 A1* | 5/2015 | Hoshino | ............... | H01L 41/333 310/365 |
| 2015/0270476 A1* | 9/2015 | Kim | ............... | H01L 41/0838 310/334 |
| 2016/0156333 A1* | 6/2016 | Hwang | ............... | H01L 41/31 310/313 B |
| 2018/0351074 A1* | 12/2018 | Kubota | ............... | H01L 41/273 |
| 2019/0088851 A1* | 3/2019 | Ohta | ............... | H01L 41/0838 |

FOREIGN PATENT DOCUMENTS

| | | |
|---|---|---|
| JP | 2004-207340 A | 7/2004 |
| JP | 2005-340778 A | 12/2005 |
| JP | 2006-165193 A | 6/2006 |
| JP | 2006-344796 A | 12/2006 |
| JP | 2007-081276 A | 3/2007 |
| JP | 2008-244303 A | 10/2008 |

* cited by examiner

PIEZOELECTRIC ELEMENT

CROSS-REFERENCE TO RELATED APPLICATIONS

This application is based upon and claims the benefit of priority from Japanese Patent Applications No. 2016-135277, No. 2016-135278, No. 2016-135280, No. 2016-135283, and No. 2016-135284, filed on Jul. 7, 2016, the entire contents of which are incorporated herein by reference.

TECHNICAL FIELD

The present disclosure relates to a piezoelectric element.

BACKGROUND

Conventionally, a thin laminated piezoelectric element is known as a piezoelectric element. In such a piezoelectric element, electrode layers such as a surface electrode or an internal electrode are electrically connected via a side electrode or a through hole conductor penetrating a piezoelectric layer.

The side electrode is generally provided through baking, sputtering, deposition, or the like on a side surface of an element body, but such a side electrode is easily damaged or deteriorates due to external factors since the side electrode is exposed to the outside. On the other hand, since the through hole conductor is located inside the element body, the through hole conductor has high resistance to the external factors. Japanese Unexamined Patent Publication No. 2004-207340 (Cited reference 1) discloses an actuator in which electrodes are electrically connected via a through hole conductor.

SUMMARY

The present disclosure is directed to provide a piezoelectric element that improves connection reliability.

A piezoelectric element according to one aspect of the present disclosure is a piezoelectric element including a laminated body having electrode layers and piezoelectric layers laminated alternately, wherein the laminated body has a laminated portion including a first through hole conductor penetrating a first piezoelectric layer laminated on one surface of the electrode layer, and a second through hole conductor penetrating a second piezoelectric layer laminated on the other surface of the electrode layer, and in the laminated portion, the first through hole conductor includes a first recess on an end surface on the second piezoelectric layer side, and the second piezoelectric layer includes a protrusion entering the first recess, and the second through hole conductor includes a second recess on an end surface on the first piezoelectric layer side, and the first piezoelectric layer includes a protrusion entering the second recess.

In the laminated portion of the piezoelectric element, when stress is generated inside the laminated portion or stress is applied from the outside, the stress is absorbed by the first recess of the first through hole conductor on one surface side of the electrode layer and the second recess of the second through hole conductor on the other surface side of the electrode layer. Accordingly, conduction failure or disconnection of the electrode layer or the through hole conductor in the laminated portion is prevented. Further, in the laminated portion, the protrusion of the second piezoelectric layer enters the first recess of the first through hole conductor and the protrusion of the first piezoelectric layer enters the second recess of the second through hole conductor, and therefore, a holding force of the piezoelectric layer with respect to each through hole conductor increases. Accordingly, displacement or deformation of each through hole conductor is prevented, and conduction failure or disconnection in the laminated portion is further prevented.

The piezoelectric element according to another aspect of the present disclosure includes: an active portion configured to be deformed in which an electric field is generated in the piezoelectric layer when a voltage is applied, and an inactive portion in which an electric field is not generated in the piezoelectric layer even when a voltage is applied, wherein the laminated portion is located in the inactive portion, and the first through hole conductor and the second through hole conductor are adjacent in a direction in which the active portion and the inactive portion are aligned when viewed in a laminating direction of the laminated body. The active portion is deformed at the time of polarization or at the time of driving and, stress, strain, or the like due to the deformation of the active portion is applied to the inactive portion. However, since in the laminated portion, the first through hole conductor has the first recess in the end surface on the second piezoelectric layer side and the second through hole conductor has the second recess in the end surface on the first piezoelectric layer side, stress or strain is absorbed, and therefore, conduction failure or disconnection in the laminated portion is further prevented.

In the piezoelectric element according to yet another aspect of the present disclosure, a thickness of the first through hole conductor is smaller than a thickness of the first piezoelectric layer, or a thickness of the second through hole conductor is smaller than a thickness of the second piezoelectric layer.

The piezoelectric element according to one aspect of the present disclosure includes a laminated body having a laminated portion including a pair of electrode layers, a piezoelectric layer interposed between the pair of electrode layers, and a through hole conductor penetrating the piezoelectric layer, wherein the laminated portion includes a void adjacent to the through hole conductor.

In the piezoelectric element, in the laminated portion, the void adjacent to the through hole conductor alleviates stress or strain near the through hole conductor. Accordingly, conduction failure or disconnection of the electrode layer or the through hole conductor in the laminated portion is prevented.

The piezoelectric element according to yet another aspect of the present disclosure includes an active portion configured to be deformed in which an electric field is generated in the piezoelectric layer when a voltage is applied, and an inactive portion in which an electric field is not generated in the piezoelectric layer when a voltage is applied, wherein the laminated portion is located in the inactive portion. Since the active portion is deformed at the time of polarization or at the time of driving, the laminated portion including the through hole conductor is located in the inactive portion in order to avoid an influence of the stress or the strain caused by the deformation as much as possible.

In the piezoelectric element according to yet another aspect of the disclosure, an area of an end surface of the through hole conductor is smaller than an area of a cross section at a center position of the through hole conductor in a laminating direction of the laminated body. According to the through hole conductor having such dimensions and a shape, stress and strain applied to the laminated portion are absorbed.

The piezoelectric element according to one aspect of the present disclosure includes a laminated body having a laminated portion including a pair of electrode layers, a piezoelectric layer interposed between the pair of electrode layers, and a through hole conductor penetrating the piezoelectric layer, wherein in the laminated portion, a recess is formed in each of both end portions of the through hole conductor in the laminating direction of the laminated body.

In the piezoelectric element, since recesses which are close to each other are formed in both end portions of the through hole conductor, a length of the through hole conductor in the laminating direction of the laminated body is short in a portion in which the recesses of the end portions face each other. Since a value of an electrical resistance is proportional to a length of a conductor, the electrical resistance is reduced due to the short length of the through hole conductor as described above. Accordingly, conduction failure in the through hole conductor is prevented, and connection reliability of the piezoelectric element is improved.

The piezoelectric element according to yet another aspect of the present disclosure includes an active portion configured to be deformed in which an electric field is generated in the piezoelectric layer when a voltage is applied, and an inactive portion in which an electric field is not generated in the piezoelectric layer when a voltage is applied, wherein the laminated portion is located in the inactive portion. Since the active portion is deformed at the time of polarization or at the time of driving, the laminated portion including the through hole conductor is located in the inactive portion in order to avoid an influence of the stress or the strain caused by the deformation as much as possible.

In the piezoelectric element according to yet another aspect of the present disclosure, the piezoelectric layer includes a protrusion entering the recess of the through hole conductors. In this case, a holding force of the piezoelectric layer with respect to the through hole conductor increases. Accordingly, displacement or deformation of each through hole conductor is prevented, and conduction failure or disconnection in the laminated portion is further prevented.

In the piezoelectric element according to yet another aspect of the disclosure, an area of end surfaces of both of the end portions of the through hole conductor is smaller than an area of a cross section at a center position of the through hole conductor in the laminating direction of the laminated body. According to the through hole conductor having such dimensions and a shape, stress and strain applied to the laminated portion are absorbed.

A piezoelectric element according to one aspect of the present disclosure includes a laminated body having a laminated portion including a pair of electrode layers, a piezoelectric layer interposed between the pair of electrode layers, and a through hole conductor penetrating the piezoelectric layer, wherein the through hole conductor includes a widened portion in which an area of a cross section perpendicular to a laminating direction of the laminated body is larger than an area of an end surface of the through hole conductor in the laminating direction of the laminated body.

In the piezoelectric element, when strain in the laminating direction of the laminated body is applied to the through hole conductor, the strain is minimized by the widened portion. Therefore, in the piezoelectric element, conduction failure or disconnection of the electrode layer or the through hole conductor in the laminated portion is prevented, unlike in the piezoelectric element of the related art having the through hole conductor including no widened portion.

The piezoelectric element according to yet another aspect of the present disclosure includes an active portion configured to be deformed in which an electric field is generated in the piezoelectric layer when a voltage is applied; and an inactive portion in which an electric field is not generated in the piezoelectric layer when a voltage is applied, wherein the laminated portion is located in the inactive portion. Since the active portion is deformed at the time of polarization or at the time of driving, the laminated portion including the through hole conductor is located in the inactive portion in order to avoid an influence of the stress or the strain caused by the deformation as much as possible.

In the piezoelectric element according to yet another aspect of the present disclosure, the widened portion of the through hole conductor is at a center position of the through hole conductor in the laminating direction of the laminated body.

Further, the piezoelectric layer enters between a protrusion of the widened portion and the electrode layer. In this case, since the portion of the piezoelectric layer entering between the protrusion of the widened portion and the electrode layer minimizes strain of the through hole conductor, conduction failure or disconnection in the laminated portion is further prevented.

A piezoelectric element according to one aspect of the present disclosure is a piezoelectric element including a laminated body having electrode layers and piezoelectric layers laminated alternately, wherein the laminated body includes a laminated portion including a first through hole conductor penetrating a first piezoelectric layer laminated on one surface of the electrode layer, and a second through hole conductor penetrating a second piezoelectric layer laminated on the other surface of the electrode layer, and in the laminated portion, the first through hole conductor includes a first recess on an end surface on the second piezoelectric layer side, and the second piezoelectric layer includes a protrusion entering the first recess, the second through hole conductor includes a second recess on an end surface on the first piezoelectric layer side, and the first piezoelectric layer includes a protrusion entering the second recess, and there is at least one void adjacent to at least one of the first recess of the first through hole conductor and the second recess of the second through hole conductor.

In the laminated portion of the piezoelectric element, when stress is generated inside the laminated portion or stress is applied from the outside, the stress is absorbed by the first recess of the first through hole conductor on one surface side of the electrode layer and the second recess of the second through hole conductor on the other surface side of the electrode layer. Accordingly, conduction failure or disconnection of the electrode layer or the through hole conductor in the laminated portion is prevented. Further, in the laminated portion, the protrusion of the second piezoelectric layer enters the first recess of the first through hole conductor and the protrusion of the first piezoelectric layer enters the second recess of the second through hole conductor, and therefore, a holding force of the piezoelectric layer with respect to each through hole conductor increases. Accordingly, displacement or deformation of each through hole conductor is prevented, and conduction failure or disconnection in the laminated portion is further prevented. Further, since in the laminated portion, the void adjacent to the through hole conductor alleviates stress or strain near the through hole conductor, conduction failure or disconnection of the electrode layer or the through hole conductor is further prevented.

The piezoelectric element according to yet another aspect of the present disclosure includes an active portion configured to be deformed in which an electric field is generated in the piezoelectric layer when a voltage is applied, and an inactive portion in which an electric field is not generated in the piezoelectric layer when a voltage is applied, wherein the laminated portion is located in the inactive portion, and the first through hole conductor and the second through hole conductor are adjacent in a direction in which the active portion and the inactive portion are aligned when viewed in a laminating direction of the laminated body. The active portion is deformed at the time of polarization or at the time of driving and, stress, strain, or the like due to the deformation of the active portion is applied to the inactive portion. However, since in the laminated portion, the first through hole conductor has the first recess in the end surface on the second piezoelectric layer side and the second through hole conductor has the second recess in the end surface on the first piezoelectric layer side, stress or strain is absorbed, and therefore, conduction failure or disconnection in the laminated portion is further prevented.

The piezoelectric element according to yet another aspect of the present disclosure includes a plurality of voids, wherein a void is adjacent to each of the first recess of the first through hole conductor and the second recess of the second through hole conductor. In this case, stress or strain is absorbed in each of the through hole conductors, and conduction failure or disconnection in the laminated portion is further prevented.

DETAILED DESCRIPTION

Figure 1:
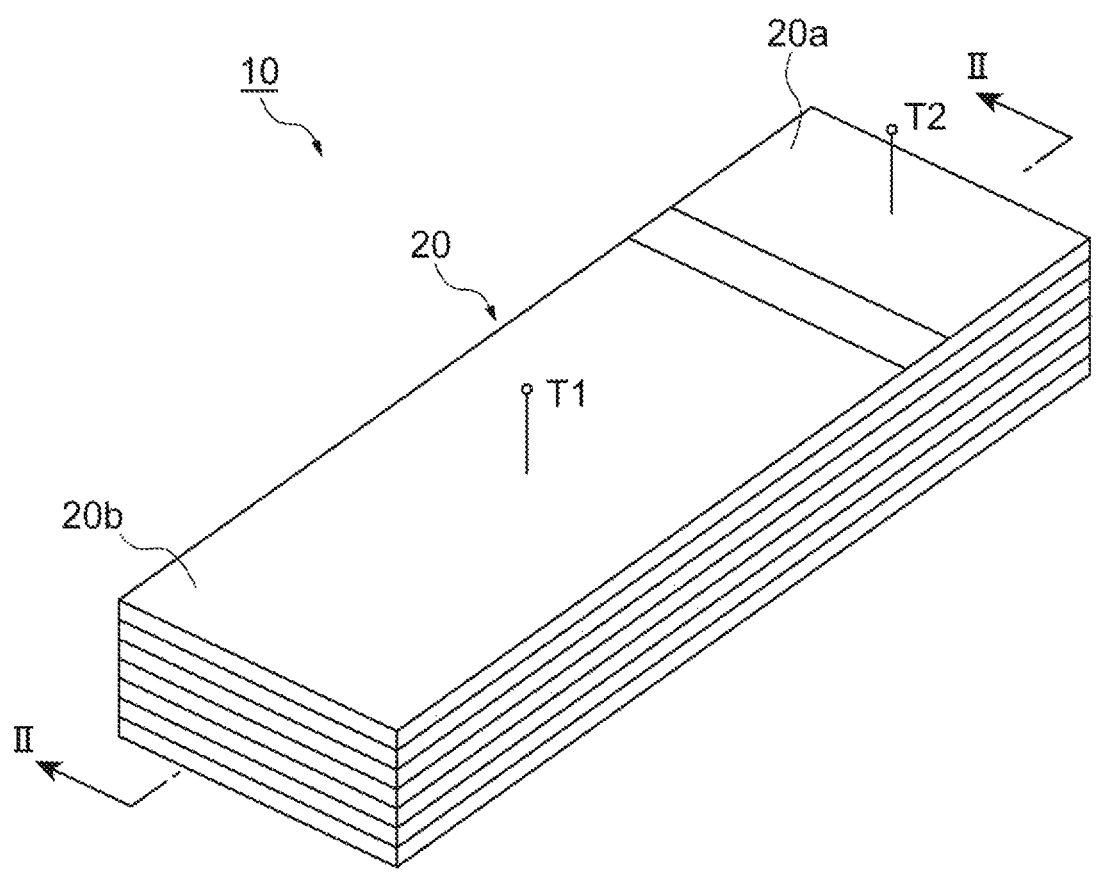
FIG. 1 is a perspective view of a piezoelectric element according to a first embodiment of the present disclosure.

Hereinafter, embodiments of the present disclosure will be described in detail with reference to the accompanying drawings. In the description, the same elements or elements having the same function are denoted with the same reference numerals, and repeated description thereof will be omitted.

First Embodiment

First, a configuration of the piezoelectric element 10 according to a first embodiment will be described with reference to FIGS. 1 and 2.

Figure 2:
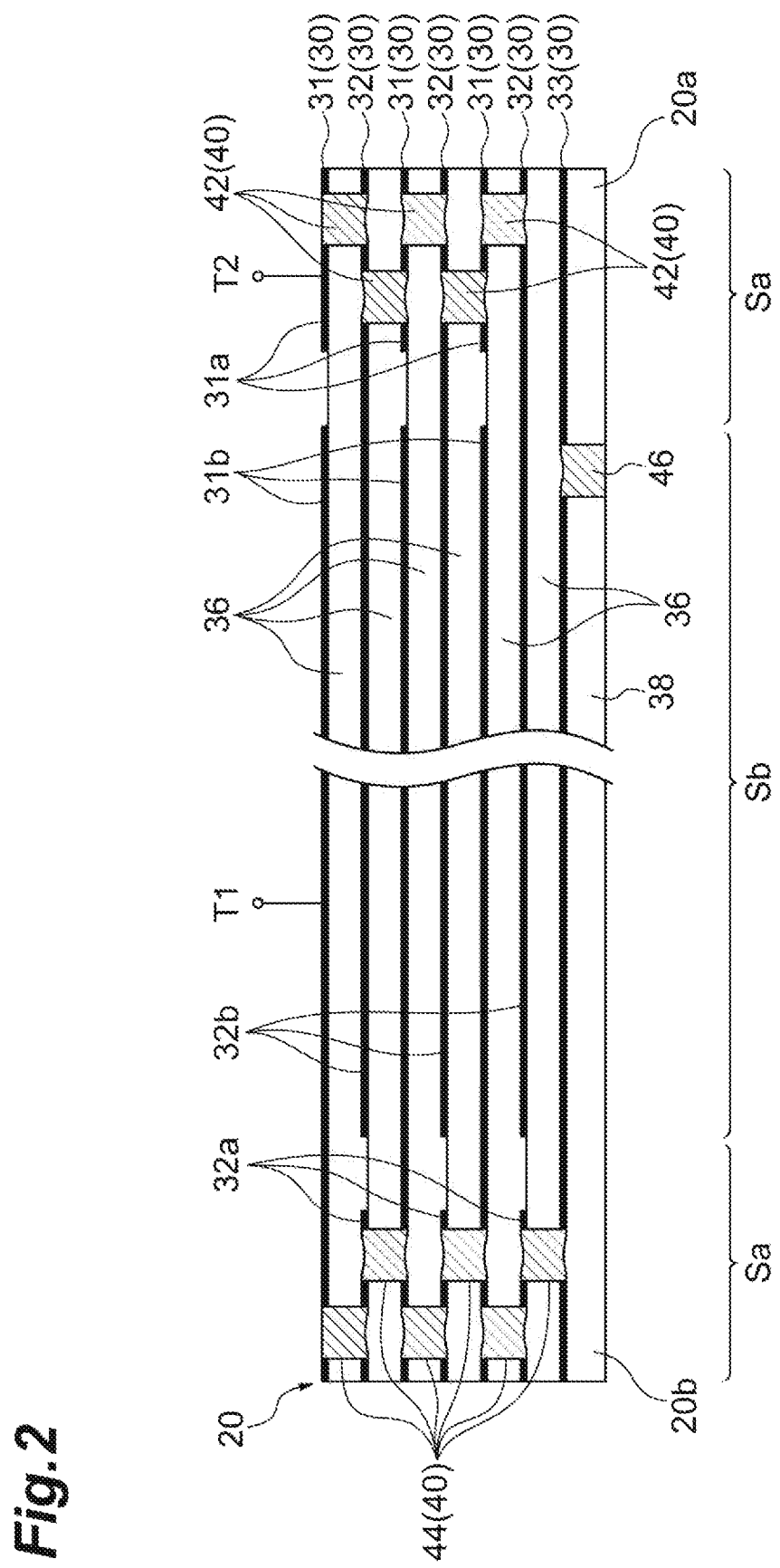
FIG. 2 is a cross-sectional view taken along line II-II of the piezoelectric element illustrated in FIG. 1.

As illustrated in FIG. 1, the piezoelectric element 10 includes a laminated body 20 having an outer shape of a rectangular parallelepiped which extends in one direction. For example, dimensions of the laminated body 20 are 2.0 mm in a longitudinal direction length, 0.5 mm in a lateral direction length, and 0.15 mm in a thickness. As illustrated in FIG. 2, the laminated body 20 includes a plurality of electrode layers 30, and a plurality of piezoelectric layers 36 and 38, and is configured such that the electrode layers 30 and the piezoelectric layers 36 and 38 are alternately laminated. In this embodiment, the laminated body 20 includes three or more electrode layers 30 and two or more piezoelectric layers 36 and 38. In FIGS. 1 and 2, the laminated body 20 includes seven electrode layers 30 and seven piezoelectric layers 36 and 38.

The plurality of electrode layers 30 are formed of Pt, and may be formed of a conductive material (Ag—Pd alloy, Au—Pd alloy, Cu, Ag, Ni, or the like) other than Pt. The plurality of electrode layers 30 are patterned by screen printing or the like. The plurality of electrode layers 30 include a first electrode layer 31, a second electrode layer 32, and a third electrode layer 33 which are different in electrode pattern. In the plurality of electrode layers 30, the first electrode layer 31 and the second electrode layer 32 are alternately arranged in this order from the top, as illustrated in FIG. 2, and the lowermost layer is the third electrode layer 33.

An electrode pattern of the first electrode layer 31 includes a short pattern 31a formed near one end portion 20a of the laminated body 20, and a long pattern 31b extending from the short pattern 31a to the other end portion 20b of the laminated body 20 with a gap. An electrode pattern of the second electrode layer 32 is a pattern symmetrical to the first electrode layer 31 and includes a short pattern 32a formed near the other end portion 20b of the laminated body 20, and a long pattern 32b extending from the short pattern 32a to the one end portion 20a of the laminated body 20 via a predetermined gap. The third electrode layer 33 is a pattern (so-called solid pattern) formed over an entire region.

All of the plurality of piezoelectric layers 36 and 38 have a rectangular flat plate shape and have, for example, a longitudinal direction length of 2.0 mm, a lateral direction length of 0.5 mm, and a thickness of 20 μm. Each of the piezoelectric layers 36 and 38 is formed of, for example, a piezoelectric ceramic material containing lead zirconate titanate as a main component, and contains additives such as Zn or Nb. The plurality of piezoelectric layers 36 and 38 include the piezoelectric layer 36 on and underneath which the electrode layers 30 are located, and the lowermost piezoelectric layer 38 only on which the electrode layer 30 is located.

In the piezoelectric layer 36, a through hole 36a penetrates therethrough at a predetermined position, and a through hole conductor 40 connecting the electrode layers 30 located on and beneath the piezoelectric layer 36 is formed in a region in which each through hole 36a is formed. That is, the through hole conductor 40 is formed by filling the through hole 36a provided in the piezoelectric layer 36 with an electrode material.

The through hole conductor 40 as a through hole conductor 42 connects the short pattern 31a of the first electrode layer 31 and the long pattern 32b of the second electrode layer 32 in the one end portion 20a of the laminated body 20. Therefore, both of the short pattern 31a of the first electrode layer 31 and the long pattern 32b of the second electrode layer 32 are electrically connected to an external connection terminal T2 connected to the short pattern 31a of the first electrode layer 31 of a surface of the laminated body 20, and have the same polarity.

Further, the through hole conductor 40 as a through hole conductor 44 connects the short pattern 32a of the second electrode layer 32 and the long pattern 31b of the first electrode layer 31 in the other end portion 20b of the laminated body 20. Further, the through hole conductor 40 as the through hole conductor 44 connects the short pattern 32a of the second electrode layer 32 and the third electrode layer 33 in the other end portion 20b of the laminated body 20. Therefore, the short pattern 32a of the second electrode layer 32, the long pattern 31b of the first electrode layer 31, and the third electrode layer 33 are all electrically connected to an external connection terminal T1 connected to the long pattern 31b of the first electrode layer 31 of the surface of the laminated body 20, and have the same polarity.

In the piezoelectric element 10, a pair of external connection terminals T1 and T2 are provided on the surface of the laminated body 20, and since the terminals for two polarities are exposed on one side, conduction can be obtained from this one side.

When a voltage is applied between the pair of external connection terminals T1 and T2, an electrode group (that is, the short pattern 31a of the first electrode layer 31 and the long pattern 32b of the second electrode layer 32) connected on the one end portion 20a side of the laminated body 20 and an electrode group (that is, the long pattern 31b of the first electrode layer 31, the short pattern 32a of the second electrode layer 32, and the third electrode layer 33) connected on the other end portion 20b side have different polarities. In this case, an electric field is generated between the long pattern 31b of the first electrode layer 31 and the long pattern 32b of the second electrode layer 32 overlapping in a portion sandwiched between both of the end portions 20a and 20b of the laminated body 20, such as near a center, and a portion of the piezoelectric layer 36 located therebetween is deformed (extends or contracts) according to the polarization direction. Therefore, the portion sandwiched between both of the end portions 20a and 20b of the laminated body 20 is an active portion Sb that is deformed when a voltage is applied between the pair of external connection terminals T1 and T2.

Since the vicinity of the one end portion 20a of the laminated body 20 is a laminated portion in which the electrode layer portions 31a and 32b having the same polarity overlap, deformation hardly occurs even when a voltage is applied between the pair of external connection terminals T1 and T2. Therefore, the vicinity of the one end portion 20a of the laminated body 20 is an inactive portion Sa which is not deformed even when a voltage is applied. The inactive portion Sa is suitable for installation of the above-described through hole conductor 40 because no large displacement occurs. Since the vicinity of the other end portion 20b of the laminated body 20 is a laminated portion in which the electrode layer portions 31b and 32a having the same polarity overlap, the vicinity of the other end portion 20b of the laminated body 20 is an inactive portion Sa which is not deformed even when a voltage is applied, similar to the vicinity of the one end portion 20a. Thus, in the piezoelectric element 10, the inactive portions Sa and the active portion Sb are arranged side by side in the longitudinal direction of the laminated body 20.

Since the third electrode layer 33 is located only on the piezoelectric layer 38, deformation hardly occurs even when a voltage is applied between the pair of external connection terminals T1 and T2, similar to both the end portions 20a and 20b of the laminated body 20. A through hole conductor 46 is penetrating through the piezoelectric layer 38. The through hole conductor 46 can be formed by filling the through hole provided in the piezoelectric layer 38 with an electrode material. The through hole conductor 46 is a dummy through hole conductor which is not intended to allow conduction to the electrode layer 30, and can be used for identifying, for example, a front and a back or a polarity of a component.

In the laminated body 20, the through hole conductors 42, 44, and 46 are provided only in a portion in which deformation does not substantially occur even when a voltage is applied between the pair of external connection terminals T1 and T2 (that is, both the end portions 20a and 20b and the piezoelectric layer 38 as the lowermost layer).

Figure 3:
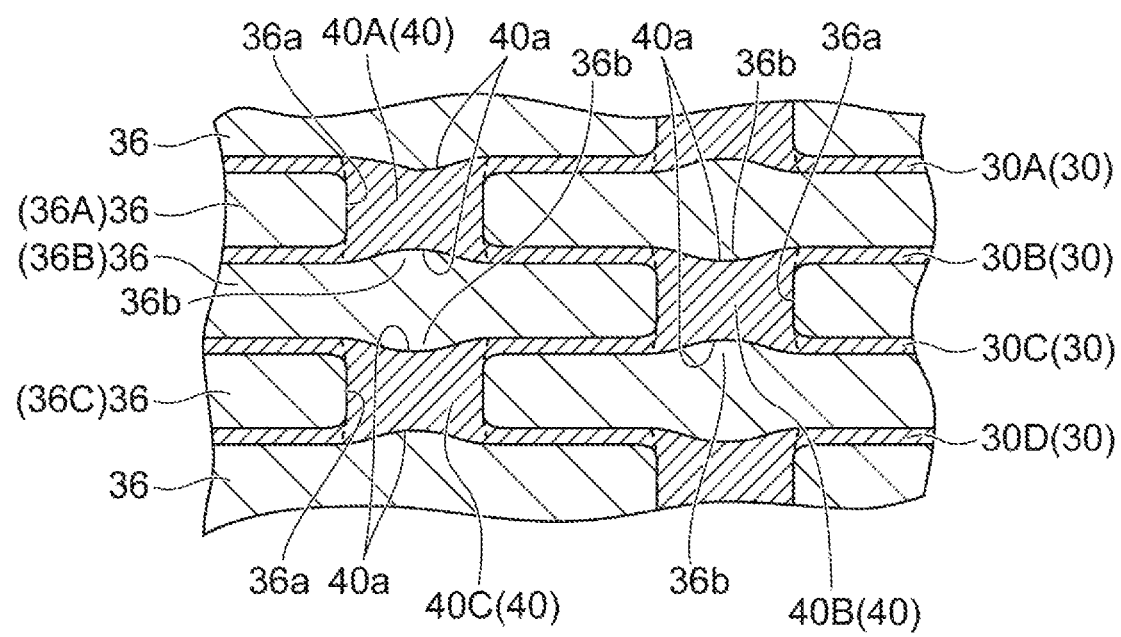
FIG. 3 is an enlarged view of main portions of an inactive portion of the piezoelectric element illustrated in FIG. 1.

Next, a configuration of the electrode layer 30 and the piezoelectric layer 36 in the inactive portion Sa will be described with reference to FIG. 3. FIG. 3 illustrates a cross section of the inactive portion Sa on the side of the other end portion 20b of the laminated body 20.

As illustrated in FIG. 3, in the inactive portion Sa, the electrode layers 30 (more specifically, the electrode layers 31b and 32a) having the same polarity overlap via the piezoelectric layer 36. For convenience of description, the overlapping electrode layers 30 are also referred to as a first layer 30A, a second layer 30B, a third layer 30C, and a fourth layer 30D in this order from the upper side. Further, the piezoelectric layer 36 interposed between the first layer 30A and the second layer 30B is particularly referred to as a first piezoelectric layer 36A, the piezoelectric layer 36 interposed between the second layer 30B and the third layer 30C is particularly referred to as a second piezoelectric layer 36B, and the piezoelectric layer 36 interposed between the third layer 30C and the fourth layer 30D is particularly referred to as a third piezoelectric layer 36C.

The first layer 30A, the second layer 30B, the third layer 30C, and the fourth layer 30D that are adjacent are connected by the through hole conductors 40 penetrating the piezoelectric layers 36. For example, the first through hole conductor 40A penetrating the first piezoelectric layer 36A connects the first layer 30A and the second layer 30B located on and beneath the first through hole conductor 40A. The second through hole conductor 40B penetrating the second piezoelectric layer 36B connects the second layer 30B and the third layer 30C located on and beneath the second through hole conductor 40B. The third through hole conductor 40C penetrating the third piezoelectric layer 36C connects the third layer 30C and the fourth layer 30D located on and beneath the third through hole conductor 40C.

However, vertically adjacent through hole conductors 40 do not overlap when viewed in the thickness direction (the laminating direction of the laminated body 20) and are adjacent. Specifically, the first through hole conductor 40A of the first piezoelectric layer 36A and the second through hole conductor 40B of the second piezoelectric layer 36B do not overlap when viewed in the thickness direction and are arranged to be misaligned in the longitudinal direction (that is, the horizontal direction in FIG. 3) of the laminated body 20. Further, the second through hole conductor 40B of the second piezoelectric layer 36B and the third through hole conductor 40C of the third piezoelectric layer 36C do not overlap when viewed in the thickness direction and are arranged to be misaligned in a horizontal direction in FIG. 3. The third through hole conductor 40C of the third piezoelectric layer 36C overlaps the first through hole conductor 40A of the first piezoelectric layer 36A when viewed in the thickness direction. The amount of misalignment of the through hole conductors 40 is, for example, equal to or larger than a maximum radius of the through hole conductor 40, or equal to or larger than a maximum diameter of the through hole conductor 40.

Next, a procedure for fabricating the above-described piezoelectric element 10 will be described.

First, a binder, an organic solvent, or the like is applied to piezoelectric ceramic powder that is used for formation of the piezoelectric layer 36, resulting in a paste. With the obtained paste, a plurality of green sheets having a predetermined size are fabricated, for example, using a doctor blade method. In this case, a plasticizer to binder ratio is adjusted so that sufficient deformation is obtained.

In each green sheet, a through hole is formed in a portion in which the through hole conductor 40 is formed, using a YAG laser.

An electrode paste serving as the electrode layer 30 (for example, a Pd—Ag alloy (Pd:Ag=3:7)) is coated on each green sheet using a screen printing method and formed so that the electrode paste becomes the above-described pattern. When the electrode paste is applied, the through hole formed in the green sheet is filled with the electrode paste, but a rate of filling of the through hole with the electrode paste is adjusted according to a contraction rate of the electrode paste.

Subsequently, a plurality of green sheets on which the electrode paste has been printed are overlapped, and press processing such as warm isostatic pressing (WIP) is performed to obtain a green laminated body. In the warm isostatic pressing, pressing is performed, for example, at about 50 MPa at a temperature of about 80° C. In this case, a portion that becomes the electrode layer near the through hole portion is bent at a high temperature and under an isostatic pressure.

The obtained green laminated body is sintered. Specifically, the green laminated body is placed on a setter including stabilized zirconia, a binder removal process is performed, and the setter having the green laminated body placed thereon is put into a stabilized zirconia sagger and sintered at about 1100° C.

After sintering, a predetermined polarization process is performed to complete the piezoelectric element 10. In the polarization process, for example, a voltage with an electric field intensity of 2 kV/mm is applied for 3 minutes at a temperature of 100° C.

In the piezoelectric element 10 obtained by the above-described procedure, upper and lower surfaces of the through hole conductors 40 are recessed toward the through hole conductor 40 and recesses 40a are formed, as illustrated in FIG. 3. For example, the first through hole conductor 40A penetrating the first piezoelectric layer 36A includes the recess 40a recessed toward the first through hole conductor 40A (downward in FIG. 3) on the upper surface, and includes the recess 40a recessed toward the first through hole conductor 40A (upward in FIG. 3) on the lower surface (an end surface on the second piezoelectric layer 36B side). Similarly, the second through hole conductor 40B and the third through hole conductor 40C include recesses 40a on upper and lower surfaces thereof. As illustrated in FIG. 3, all of a thickness of the first through hole conductor 40A, a thickness of the second through hole conductor 40B, and a thickness of the third through hole conductor 40C are smaller than a thickness of the piezoelectric layer 36.

Further, a protrusion 36b of the piezoelectric layer 36 enters the recess 40a formed in each through hole conductor 40. For example, the upward protrusion 36b of the second piezoelectric layer 36B enters the recess (first recess) 40a of the lower surface of the first through hole conductor 40A. Further, the downward protrusion 36b of the first piezoelectric layer 36A enters the recess (second recess) 40a of the upper surface of the second through hole conductor 40B.

A shape of the through hole conductor 40, a shape of the electrode layer 30, and a shape of the piezoelectric layer 36 are considered to be obtained by bending the electrode layer near the through hole at a high temperature and isostatic pressure at the time of fabrication of the piezoelectric element 10.

As described above, the piezoelectric element 10 is a piezoelectric element including the laminated body 20 in which the plurality of electrode layers 30 and the plurality of piezoelectric layers 36 are alternately laminated, and the laminated body 20 is a laminated portion including the first through hole conductor 40A penetrating the first piezoelectric layer 36A laminated on one surface of the electrode layer 30B and the second through hole conductor 40B penetrating the second piezoelectric layer 36B laminated on the other surface of the electrode layer 30B, and includes the inactive portion Sa. In the inactive portion Sa, the first through hole conductor 40A includes the first recess 40a on the lower surface (the end surface on the second piezoelectric layer 36B side), the second piezoelectric layer 36B includes the protrusion 36b that enters the first recess 40a, the second through hole conductor 40B includes the second recess 40a on the upper surface (the end surface on the first piezoelectric layer 36A side), and the first piezoelectric layer 36A includes the protrusion 36b that enters the second recess 40a.

In the piezoelectric element 10 described above, internal stress generated in the inactive portion Sa at the time of sintering (that is, residual stress due to contraction at the time of sintering) when the piezoelectric element 10 is fabricated or stress applied from the outside to the inactive portion Sa is absorbed by the recess 40a of the lower surface of the first through hole conductor 40A and the recess 40a of the upper surface of the second through hole conductor 40B. Thus, for example, deformation, rupture, or the like of the through hole conductor 40 is prevented, and conduction failure or disconnection of the electrode layer 30 or the through hole conductor 40 in the inactive portion Sa is prevented.

In addition, in the inactive portion Sa, since the protrusion 36b of the piezoelectric layer 36 enters the recess 40a of the through hole conductor 40, a holding force of the piezoelectric layer 36 with respect to the through hole conductor 40 increases. In the configuration in which the protrusion 36b of the piezoelectric layer 36 enters the recess 40a of the through hole conductor 40, displacement or deformation of the through hole conductor 40 is prevented or obstructed, unlike in a configuration in which the upper and lower surfaces of the through hole conductor 40 are flat and the piezoelectric layer does not enter. Accordingly, conduction failure or disconnection in the inactive portion Sa is further prevented.

Particularly, in the inactive portion Sa described above, since the first through hole conductor 40A and the second through hole conductor 40B are adjacent when viewed in a laminating direction of the laminated body 20, the downward protrusion 36b of the first piezoelectric layer 36A and the upward protrusion 36b of the second piezoelectric layer 36B are adjacent when viewed in the laminating direction of the laminated body 20. Therefore, both of these protrusions 36b suited for and displaced from each other effectively function as wedges, and movement of the second layer 30B sandwiched between the first piezoelectric layer 36A and the second piezoelectric layer 36B (that is, movement in the laminating direction and a planar direction of the laminated body 20) is effectively restrained. Therefore, conduction failure or disconnection in the inactive portion Sa is further prevented.

In the piezoelectric element 10, since the inactive portion Sa of the one end portion 20a side of the laminated body 20 has the same configuration of the electrode layer 30, the piezoelectric layer 36, and the through hole conductor 40 as the inactive portion Sa on the other end portion 20b side described above, the same effects as described above can be obtained also in the inactive portion Sa on the one end portion 20a side.

Further, in the piezoelectric element 10, when stress or the strain is applied from the active portion Sb to the inactive portion Sa with the deformation such as extension, contraction, or vibration in the active portion Sb, such stress or strain is absorbed.

Stress or strain that is applied from the active portion Sb to the inactive portion Sa will be described herein with reference to FIGS. 4 and 5.

Figure 4:
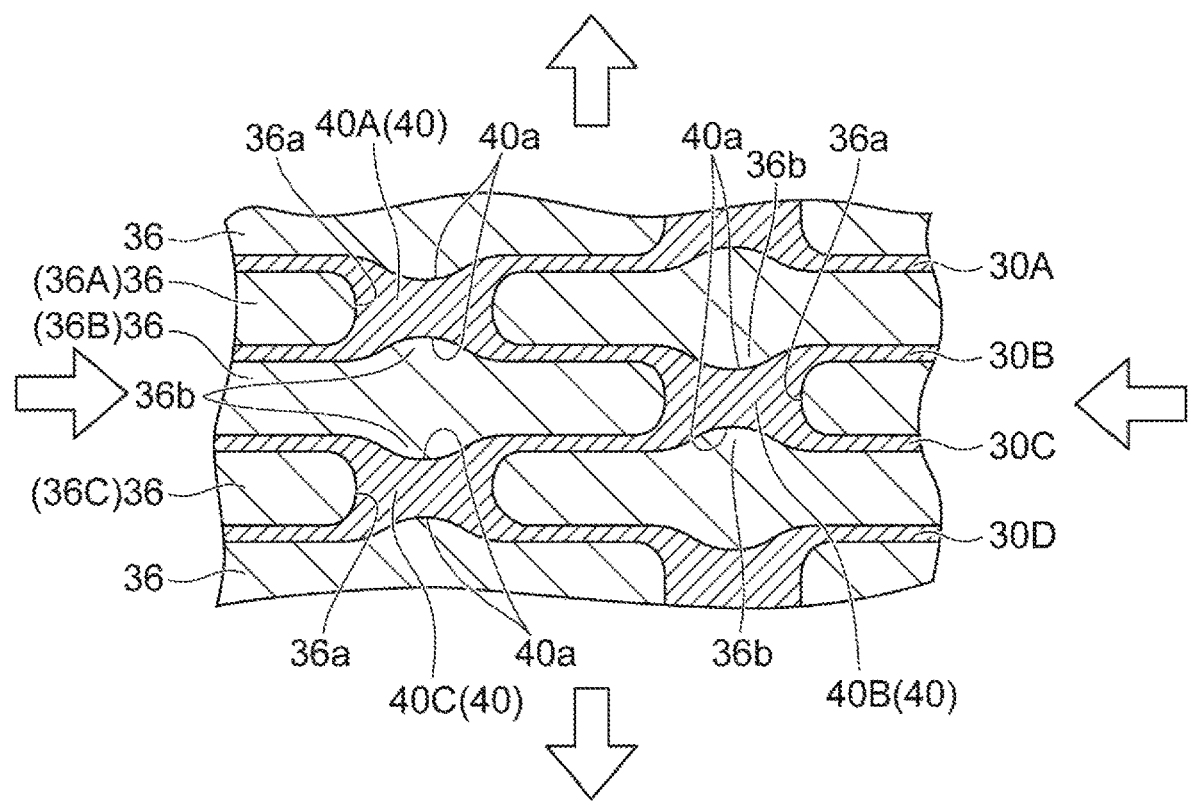
FIG. 4 is a view illustrating a state in which pressure is applied to the piezoelectric element.

FIG. 4 illustrates a state of the inactive portion Sa when the active portion Sb extends in the longitudinal direction of the laminated body 20 due to the voltage application between the pair of external connection terminals T1 and T2. In this case, compressive stress or compressive strain in the longitudinal direction of the laminated body 20 that is an alignment direction of the active portion Sb and the inactive portion Sa is applied to the inactive portion Sa. Therefore, the inactive portion Sa generally contracts in the longitudinal direction of the laminated body 20. However, since the through hole conductor 40 and the piezoelectric layer 36 in the inactive portion Sa have the above-described configuration, a depth of the recess 40a is increased according to the contraction of the inactive portion Sa. Thus, the compressive stress and compressive strain with respect to the electrode layer 30 are absorbed. Such deepening of the recess 40a of the through hole conductors 40 may occur even when the inactive portion Sa is pulled in the height direction.

Figure 5:
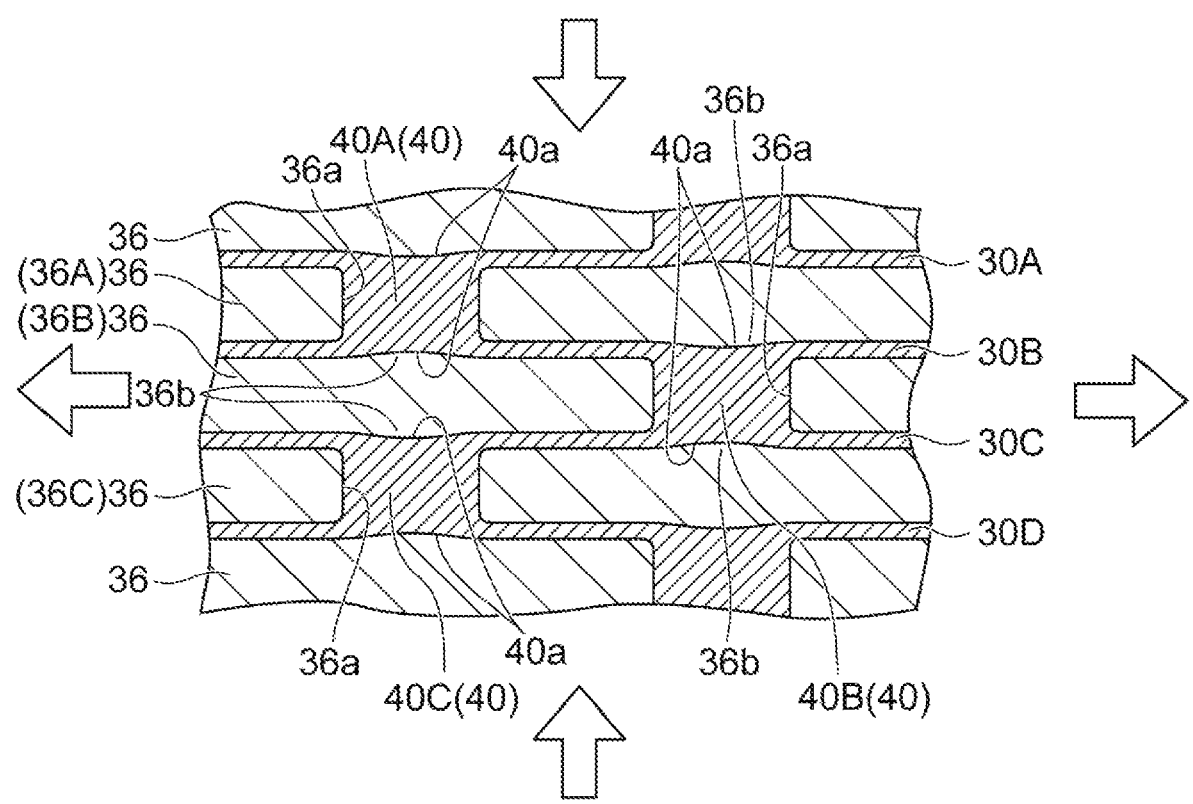
FIG. 5 is a view illustrating a state in which pressure is applied to the piezoelectric element.

FIG. 5 illustrates a state of the inactive portion Sa when the active portion Sb contracts in the longitudinal direction of the laminated body 20 due to application of a voltage between the pair of external connection terminals T1 and T2. In this case, tensile stress or tensile strain in the longitudinal direction of the laminated body 20 that is a direction of alignment of the active portion Sb and the inactive portion Sa is applied to the inactive portion Sa. Therefore, the inactive portion Sa generally extends in the longitudinal direction of the laminated body 20. However, since the through hole conductor 40 and the piezoelectric layer 36 in the inactive portion Sa have the above-described configuration, a depth of the recess 40a is reduced according to the elongation of the inactive portion Sa. Thus, the tensile stress and tensile strain with respect to the electrode layer 30 are absorbed. Such flattening of the recess 40a of the through hole conductors 40 may occur even when the inactive portion Sa is compressed in the height direction.

Figure 6:
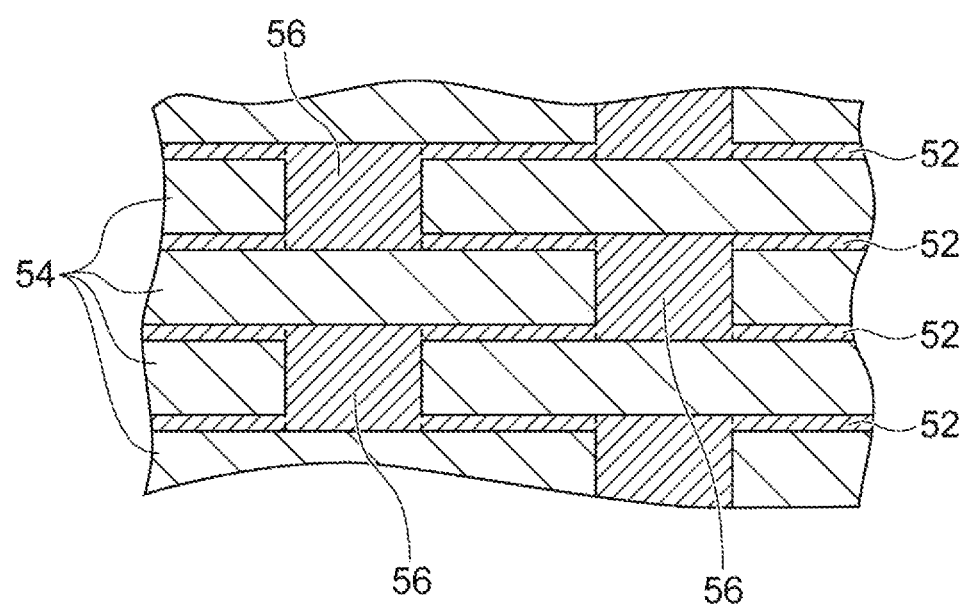
FIG. 6 illustrates an enlarged cross-sectional view of main portions of an inactive portion of the piezoelectric element according to the related art.

FIG. 6 illustrates an enlarged cross-sectional view of main portions in the inactive portion of the piezoelectric element according to the related art. In FIG. 6, reference numerals 52, 54, and 56 indicate the electrode layer, the piezoelectric layer, and the through hole conductor, respectively. As illustrated in FIG. 6, upper and lower surfaces of the through hole conductor 56 in the inactive portion of the piezoelectric element according to the related art are flat and have no recesses. Therefore, in the piezoelectric element according to the related art, it is not possible to alleviate the stress or the strain that is applied to the inactive portion. As a result, the electrode layer 52 may detach or be disconnected from the through hole conductor 56.

That is, the piezoelectric element according to the related art includes the laminated body in which the electrode layer 52 and the piezoelectric layer 54 alternately overlap each other, and the laminated body is obtained by sintering an object obtained by overlapping the electrode materials and the piezoelectric materials, but it is easy for residual stress caused by contraction at the time of sintering to be generated inside the laminated body. Particularly, since constituent materials or physical properties are different between the electrode layer 52 and the piezoelectric layer 54, there is a tendency for stress to be concentrated on an interface therebetween or near the interface. The stress generated at the time of sintering or the like may cause conduction failure or disconnection in the electrode layers 52 or the through hole conductors 56 and degrade connection reliability of the piezoelectric element.

In the piezoelectric element 10 described above, the stress or the strain that is applied from the active portion Sb to the inactive portion Sa at the time of polarization or at the time of driving is absorbed. Accordingly, conduction failure or disconnection of the electrode layer 30 or the through hole conductor 40 in the laminated portion is prevented.

Second Embodiment

Next, a configuration of the piezoelectric element 100 according to a second embodiment will be described with reference to FIGS. 7 to 10.

Figure 7:
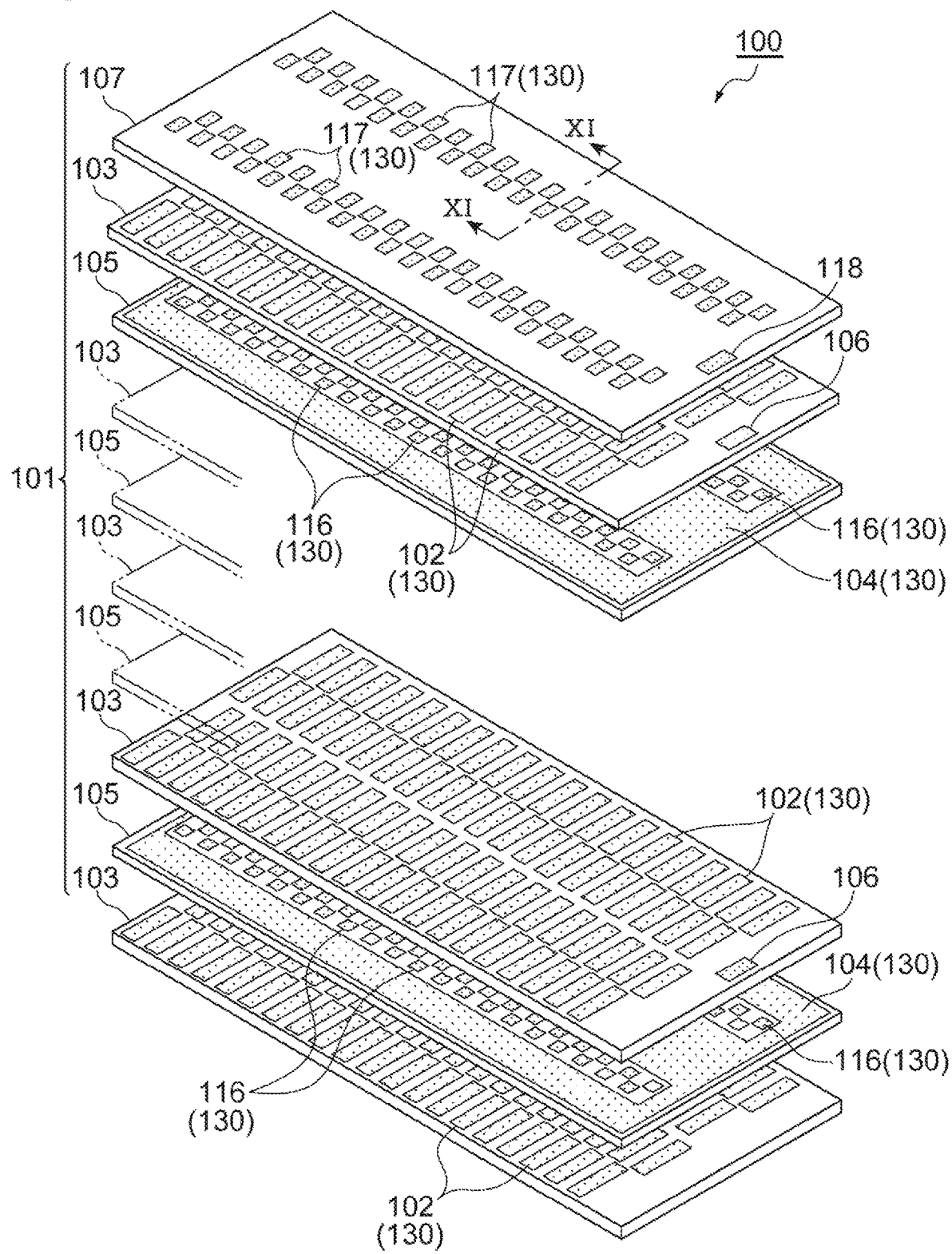
FIG. 7 is an exploded perspective view of a piezoelectric element according to a second embodiment of the present disclosure.

As illustrated in FIG. 7, the piezoelectric element 100 is configured such that a plurality of piezoelectric layers 103 having individual electrodes 102 formed therein and a plurality of piezoelectric layers 105 having a common electrode 104 formed therein are alternately laminated, and a piezoelectric layer 107 having terminal electrodes 117 and 118 formed thereon is laminated on an uppermost layer.

The piezoelectric element 100 includes a laminated body 101 having an outer shape of a rectangular parallelepiped which extends in one direction. The dimensions of the laminated body 101 are, for example, 30.0 mm in a longitudinal direction length, 15.0 mm in a lateral direction length, and 0.30 mm in a thickness.

All of the piezoelectric layers 103, 105, and 307 have a rectangular flat plate shape and have, for example, a longitudinal direction length of 30.0 mm, a lateral direction length of 15.0 mm, and a thickness of 30 μm. Each of the piezoelectric layers 103, 105, and 307 is formed of, for example, a piezoelectric ceramic material mainly containing lead zirconate titanate, and contains additives such as Nb and Sr.

Each of the piezoelectric layers 103, 105, and 107 is formed of a piezoelectric ceramic material mainly containing lead zirconate titanate and is formed, for example, in a rectangular thin plate shape of "15 mm×30 mm and a thickness of 30 μm". Further, the individual electrode 102, the common electrode 104, and the terminal electrodes 117 and 118 are formed of an Ag—Pd alloy (Ag 70 wt % and Pd 30 wt %), and may be formed of a conductive material (Ag—Pt alloy, Au—Pd alloy, Cu, Ni, or the like) other than an Ag—Pd alloy. The electrodes may be patterned by screen printing.

Figure 8:
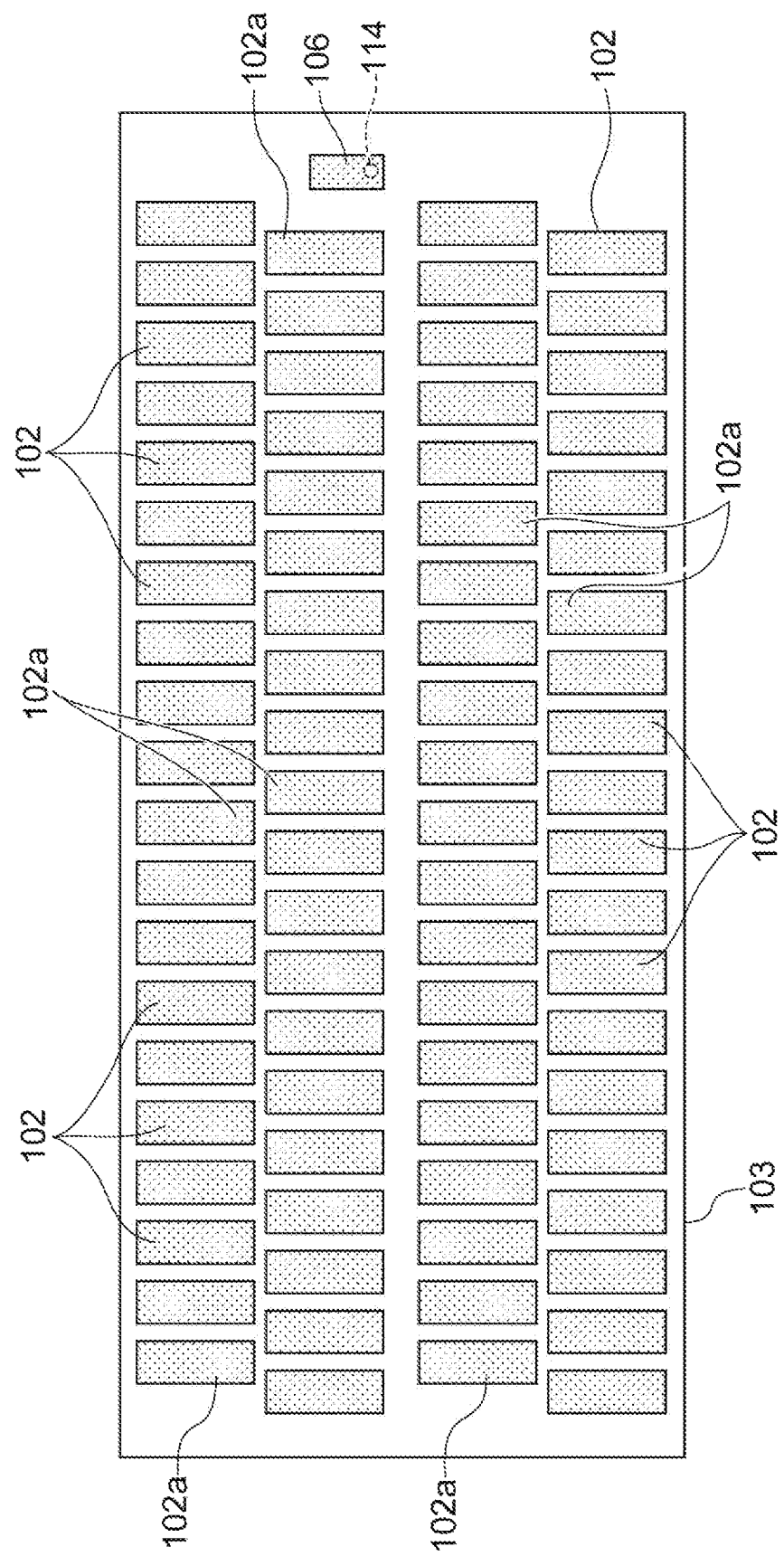
FIG. 8 is a plan view of piezoelectric layers which are second, fourth, sixth, and eighth layers of the piezoelectric element illustrated in FIG. 7.

A plurality of rectangular individual electrodes 102 are arranged in a zigzag manner on the upper surfaces of the piezoelectric layers 103 as the second layer, the fourth layer, the sixth layer, and the eighth layer counting from the piezoelectric layer 107 that is an uppermost layer, as illustrated in FIG. 8. The longitudinal direction of each individual electrode 102 is arranged to be orthogonal to the longitudinal direction of the piezoelectric layer 103, and adjacent individual electrodes 102 and 102 are arranged at a predetermined interval such that the adjacent individual electrodes are electrically independent from each other and are prevented from being affected by each other's vibration.

Here, when the longitudinal direction of the piezoelectric layer 103 is a column direction and a direction orthogonal to the longitudinal direction is a row direction, the individual electrodes 102 are arranged, for example, side by side in a zigzag shape in four rows. By arranging the plurality of individual electrodes 102 in a zigzag shape, it becomes possible to efficiently arrange individual electrodes 102 on the piezoelectric layers 103. Thus, it is possible to achieve a small size for the piezoelectric element 100 and high integration of the individual electrodes 102 while maintaining an area of the active portion contributing to deformation in the piezoelectric layer 103.

Figure 11:
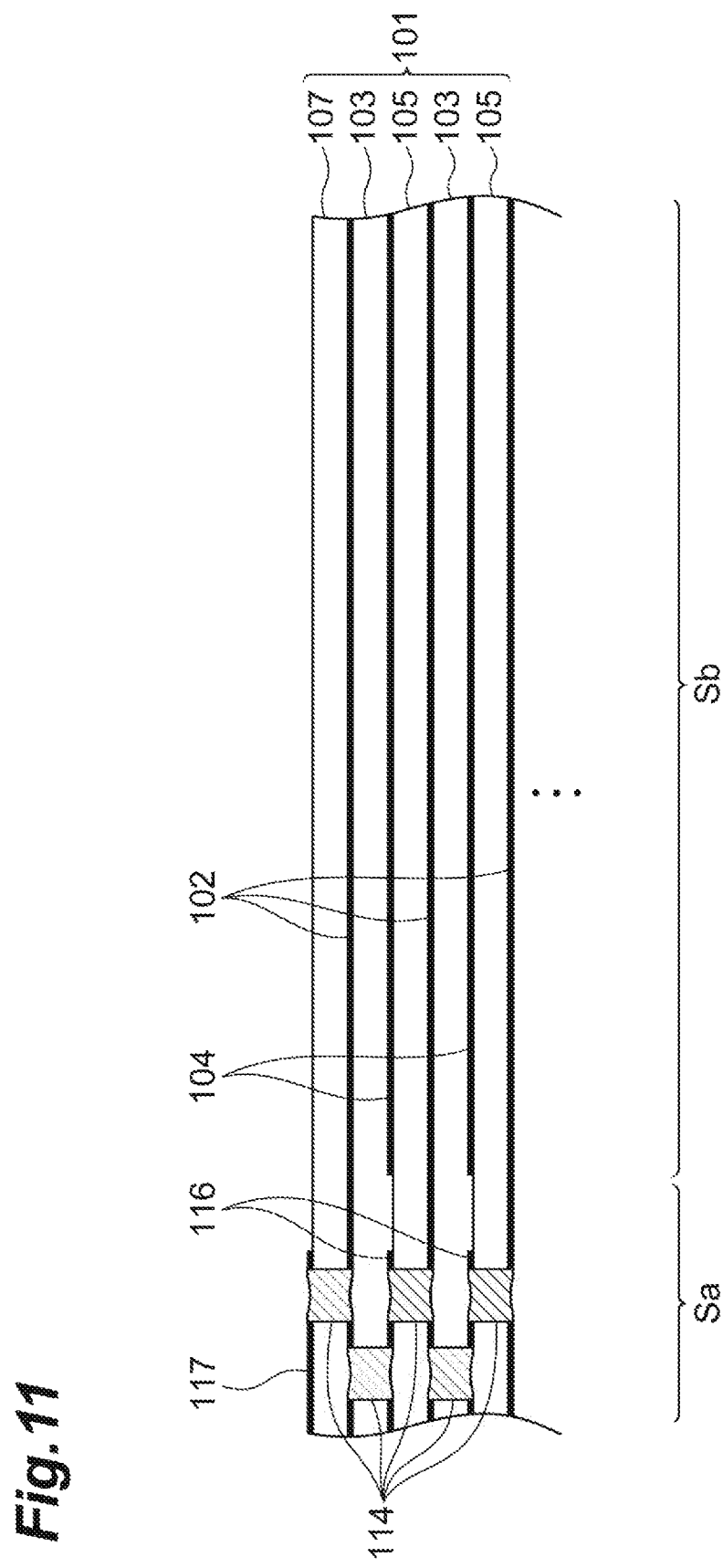
FIG. 11 is a cross-sectional view taken along the line XI-XI of the piezoelectric element illustrated in FIG. 7.

Each individual electrode 102 has an end portion facing the adjacent individual electrode as a connection end portion 102a, and is connected to the through hole conductor 114 penetrating the piezoelectric layer 103, as illustrated in FIG. 11, immediately below the connection end portion 102a. The through hole conductor 114 is formed by filling the through hole 103a provided in the piezoelectric layer 103 with an electrode material.

Further, a relay electrode 106 for electrically connecting the common electrodes 104 of the piezoelectric layers 105 located on and beneath the piezoelectric layer 103 is formed in an edge portion of the upper surface of the piezoelectric layer 103. The relay electrode 106 is connected to the through hole conductor 114 penetrating the piezoelectric layer 103 immediately below the relay electrode 106.

The individual electrodes 102 are arranged in a zigzag manner on the upper surface of the piezoelectric layer 103 as the lowermost layer, similar to the piezoelectric layers 103 as the second layer, the fourth layer, the sixth layer, and the eighth layer described above. However, the piezoelectric layer 103 as the lowermost layer is different from the piezoelectric layers 103 of the second layer, fourth layer, the sixth layer, and the eighth layer in that the relay electrode 106 and the through hole conductors 114 are not formed.

Figure 9:
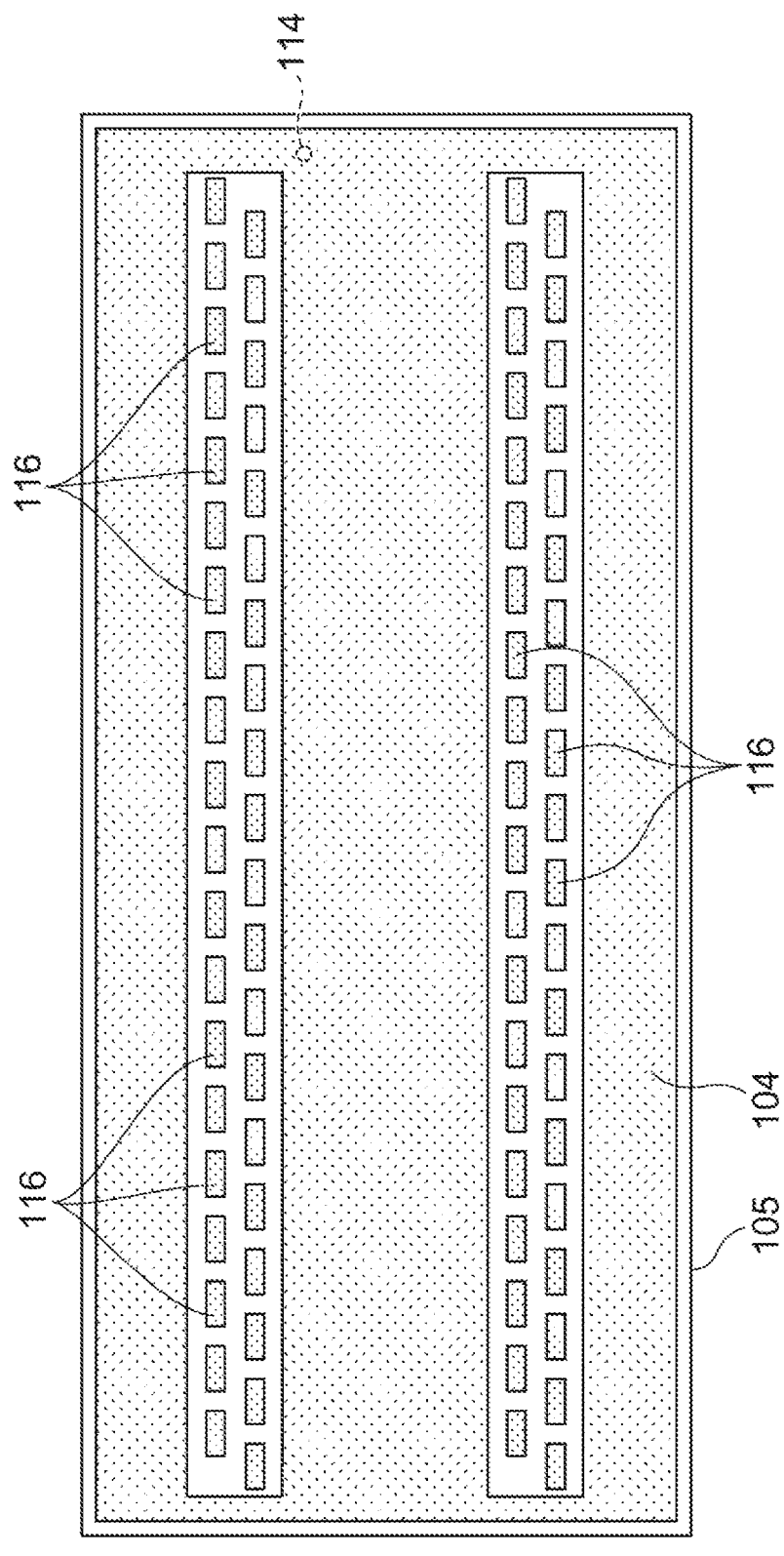
FIG. 9 is a plan view of piezoelectric layers as third, fifth, and seventh layers of the piezoelectric element illustrated in FIG. 7.

Further, a relay electrode 116 is formed to face each connection end portion 102a of the piezoelectric layer 103 in the laminating direction of the laminated body 101 (that is, a thickness direction of the laminated piezoelectric element 100), as illustrated in FIG. 9, on the upper surfaces of the piezoelectric layers 105 of the third layer, the fifth layer, the seventh layer, and the ninth layer from the piezoelectric layer 107 as the uppermost layer. Each relay electrode 116 is connected to the through hole conductor 114 penetrating the piezoelectric layer 105, as illustrated in FIG. 11, directly below the relay electrode 116. The through hole conductor 114 is formed by filling the through hole 105a provided in the piezoelectric layer 105 with an electrode material.

Further, the common electrode 104 is formed on the upper surface of the piezoelectric layer 105. The common electrode 104 surrounds includes a set of relay electrodes 116 in first and second rows and a set of relay electrodes 116 in third and fourth rows with a predetermined interval therebetween, and overlaps a portion other than the connection end portions 102a of each individual electrode 102 when viewed in the laminating direction. Thus, an entire portion facing the portion other than the connection end portions 102a of each individual electrode 102 in the piezoelectric layers 103 and 105 can be effectively used as an active portion (the active portion Sb in FIG. 11) contributing to the deformation. Further, the common electrode 104 is formed at a predetermined interval from the outer circumferential portion of the piezoelectric layer 105, and is connected to the through hole conductor 114 penetrating the piezoelectric layer 105 to face the relay electrode 106 of the piezoelectric layer 103 in the laminating direction.

The relay electrodes 116 and the common electrode 104 are formed on the upper surface of the piezoelectric layer 105 of the ninth layer, similar to the piezoelectric layers 105 of the third layer, the fifth layer, and the seventh layer described above. However, the piezoelectric layer 105 of the ninth layer is different from the piezoelectric layers 105 of the third layer, the fifth layer, and the seventh layer in that the through hole conductor 114 facing the relay electrode 106 of the piezoelectric layer 103 in the laminating direction is not formed.

Figure 10:
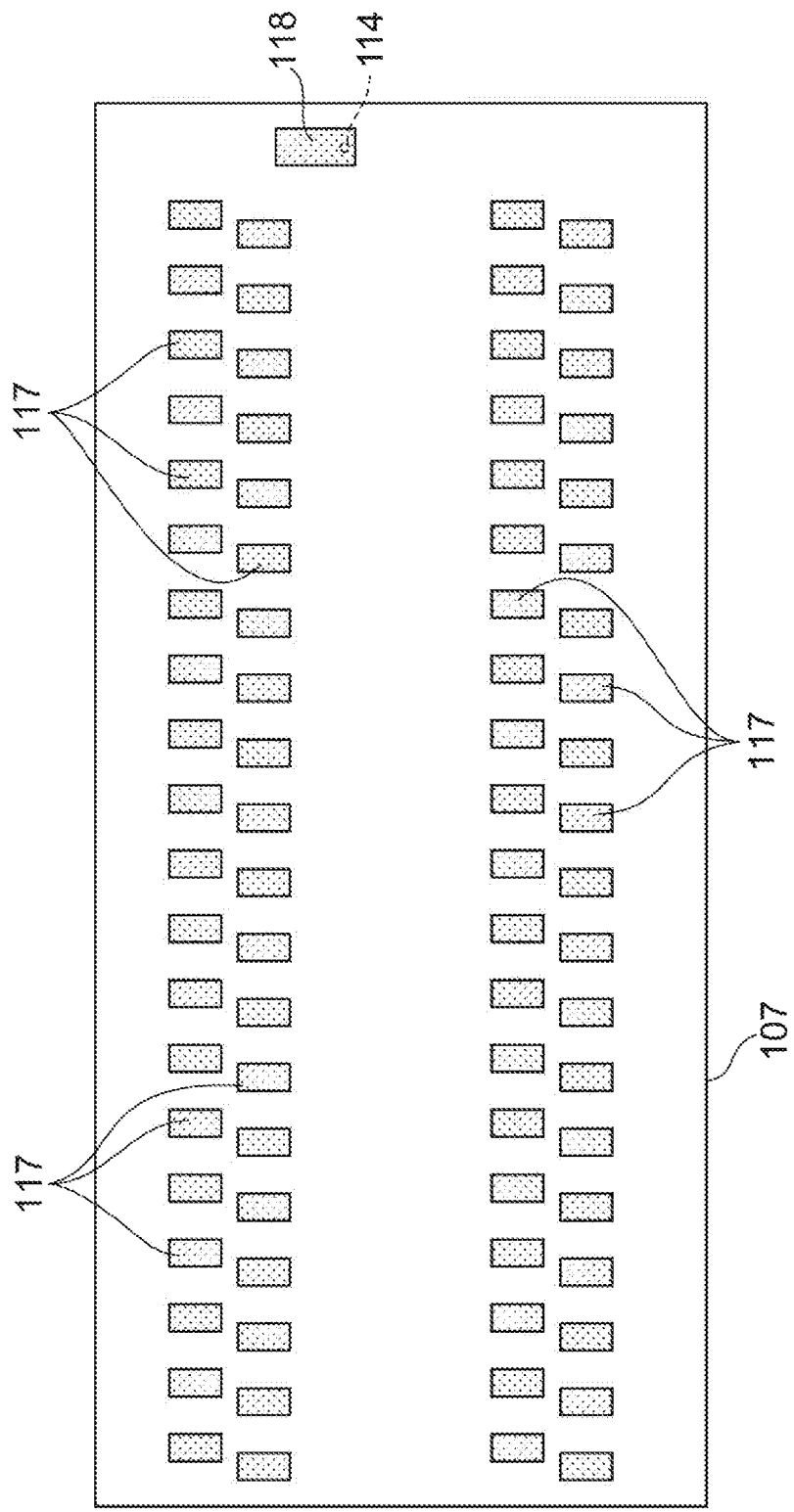
FIG. 10 is a plan view of a piezoelectric layer as an uppermost layer of the piezoelectric element illustrated in FIG. 7.

Further, the terminal electrode 117 is formed to face the connection end portion 102a of each individual electrode 102 of the piezoelectric layer 103 in the laminating direction, as illustrated in FIG. 10, on the upper surface of the piezoelectric layer 107 as the uppermost layer, and the terminal electrode 118 is formed to face the relay electrode 106 of the piezoelectric layer 103 in the laminating direction. The respective terminal electrodes 117 and 118 are connected to the through hole conductor 114 penetrating the piezoelectric layer 107 immediately below the terminal electrodes 117 and 118.

Lead wires of a flexible printed circuit board (FPC) or the like for connection to a driving power supply are soldered to the terminal electrodes 117 and 118. Therefore, in order to easily place solder when lead wires are soldered, a surface electrode layer formed of a conductive material including Ag in order to improve solder wettability in the terminal electrodes 117 and 118 is formed on an underlying electrode layer formed of a conductive material including Ag and Pd.

The thickness of the terminal electrodes 117 and 118 formed on the piezoelectric layer 107 as the uppermost layer is greater than the thickness of the other electrode layers 102, 104, and 116 and is about 1 to 2 µm. The thickness of the terminal electrodes 117 and 118 is, for example, 5 to 50%, or 10 to 30% greater than the thickness of the other electrode layer 102, 104, and 116.

A dummy electrode pattern may be arranged in a circumferential portion of the upper surface of the piezoelectric layer 107 as the uppermost layer. By arranging the dummy electrode pattern in the circumferential portion, an effect that a deviation of pressure is reduced at the time of pressing and variation in a green density after pressing can be reduced is obtained.

By laminating the piezoelectric layers 103, 105, and 107 on which the electrode pattern has been formed as described above, four common electrodes 104 are aligned with the relay electrode 106 interposed therebetween in a laminating direction with respect to the terminal electrode 118 as the uppermost layer, and the respective aligned electrode layers 104 and 106 are electrically connected by the through hole conductor 114.

Further, five individual electrodes 102 are aligned with the relay electrode 116 interposed therebetween in the laminating direction with respect to the respective terminal electrodes 117 as the uppermost layer, and the respective aligned electrode layers 102 and 116 are electrically connected by the through hole conductors 114, as illustrated in FIG. 11.

The through hole conductors 114 which are adjacent when viewed in the laminating direction of the laminated body 101 are designed so that central axes thereof do not overlap, as illustrated in FIG. 11, and are formed on the piezoelectric layers 103 and 105 to be adjacent in the extension direction of the individual electrodes 102 at a predetermined interval when viewed in the laminating direction. By arranging adjacent through hole conductors 114 as described above, electrical connection is reliably made by the through hole conductors 114.

The laminated piezoelectric element 100 has the electrical connection as described above. Accordingly, when a voltage is applied between a predetermined terminal electrode 117 and the terminal electrode 118, a voltage is applied between the individual electrodes 102 and the common electrode 104, and the active portion Sb that is a portion in which the piezoelectric layers 103 and 105 are interposed between the individual electrodes 102 and the common electrodes 104 is displaced. Thus, by selecting the terminal electrode 117 to which the voltage is applied, the active portion Sb aligned under the selected terminal electrode 117 among the active portions Sb corresponding to the respective individual electrodes 102 arranged in a matrix form can be displaced in the laminating direction. Such a laminated piezoelectric element 100 is applied to a driving source for various devices requiring small displacement, such as in valve control of a micropump.

On the other hand, since the portion in which the connection end portions 102a of the individual electrodes 102 and the relay electrodes 116 overlap is a laminated portion in which electrode layers with the same polarity overlap, the portion is hardly deformed even when a voltage is applied. Therefore, as illustrated in FIG. 11, the portion in which the connection end portions 102a of the individual electrodes 102 and the relay electrodes 116 overlap is the inactive portion Sa which does not contribute to the deformation. Further, deformation of the piezoelectric layer 107 as the uppermost layer hardly occurs even when a voltage is applied since the individual electrodes 102 are located only under the piezoelectric layer 107 as the uppermost layer. In the laminated body 101, the through hole conductor 114 is provided only in the portion in which deformation does not substantially occur when a voltage is applied (that is, the portion in which the connection end portions 102a of the individual electrodes 102 and the relay electrodes 116 overlap).

Figure 12:
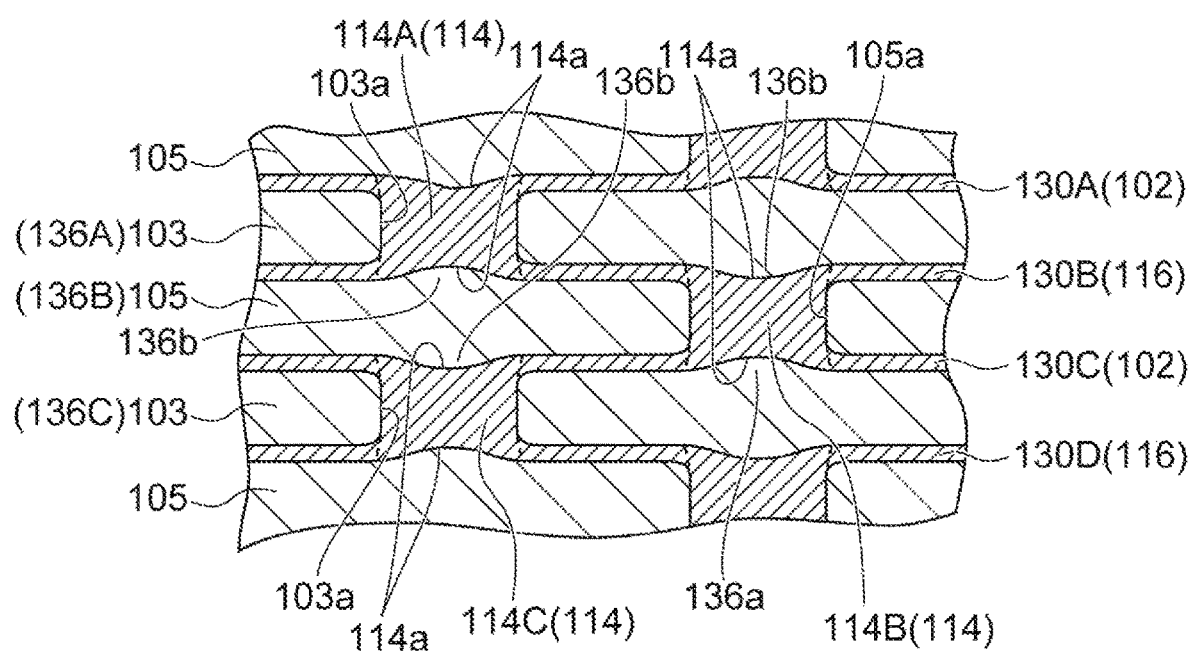
FIG. 12 is an enlarged cross-sectional view of main portions in an inactive portion of the piezoelectric element illustrated in FIG. 7.

As illustrated in FIGS. 11 and 12, in the inactive portion Sa, the electrode layers 130 (more specifically, the individual electrodes 102 and the relay electrodes 116) having the same polarity overlap via the piezoelectric layers 103 and 105. For convenience of description, the overlapping electrode layers 130 are also referred to as a first layer 130A, a second layer 130B, a third layer 130C, and a fourth layer 130D in this order from the upper side. Further, the piezoelectric layer 103 interposed between the first layer 130A and the second layer 130B is particularly referred to as a first piezoelectric layer 136A, the piezoelectric layer 105 interposed between the second layer 130B and the third layer 130C is particularly referred to as a second piezoelectric layer 136B, and the piezoelectric layer 103 interposed between the third layer 130C and the fourth layer 130D is particularly referred to as a third piezoelectric layer 136C.

The first layer 130A, the second layer 130B, the third layer 130C, and the fourth layer 130D that are adjacent are connected by the through hole conductor 114 penetrating the piezoelectric layers 103 and 105. However, vertically adjacent through hole conductors 114 do not overlap when viewed in the thickness direction (the laminating direction of the laminated body 101) and are adjacent. Specifically, the first through hole conductor 114A of the first piezoelectric layer 136A and the second through hole conductor 114B of the second piezoelectric layer 136B do not overlap when viewed in the thickness direction and are arranged to be misaligned in the horizontal direction (that is, the extension direction of the individual electrode 102) in FIG. 11. Further, the second through hole conductor 114B of the second piezoelectric layer 136B and the third through hole conductor 114C of the third piezoelectric layer 136C do not overlap when viewed in the thickness direction and are arranged to be misaligned in a horizontal direction in FIG. 11. The third through hole conductor 114C overlaps the first through hole conductor 114A when viewed in the thickness direction. The amount of misalignment of the through hole conductors 114 is, for example, equal to or larger than a maximum radius of the through hole conductor 114, or equal to or larger than a maximum diameter of the through hole conductor 114.

A procedure of fabricating the piezoelectric element 100 is the same as the procedure of fabricating the piezoelectric element 10 described above. That is, green sheets coated with a predetermined pattern of electrode paste are overlapped, and press processing such as warm isostatic pressing is performed to obtain a laminated green sheet. In this case, a portion to be the electrode layer near the through hole is bent at a high temperature and isostatic pressure. The obtained green laminated body is sintered and a predetermined polarization process is performed to complete the piezoelectric element 100.

In the piezoelectric element 100 obtained by the above-described procedure, upper and lower surfaces of the through hole conductors 114 are recessed toward the through hole conductor 114 and recesses 114a are formed, as illustrated in FIG. 12. For example, the first through hole conductor 114A penetrating the first piezoelectric layer 136A includes the recess 114a recessed toward the first through hole conductor 114A (downward in FIG. 12) on the upper surface, and includes the recess 114a recessed toward the first through hole conductor 114A (upward in FIG. 12) on the lower surface (an end surface on the second piezoelectric layer 136B side). Similarly, the second through hole conductor 114B and the third through hole conductor 114C include recesses 114a on upper and lower surfaces thereof. As illustrated in FIG. 12, all of a thickness of the first through hole conductor 114A, a thickness of the second through hole conductor 114B, and a thickness of the third through hole conductor 114C are smaller than thicknesses of the piezoelectric layers 103 and 105.

A shape of the through hole conductor 114, a shape of the electrode layer 130, and shapes of the piezoelectric layers 103 and 105 are considered to be obtained by bending the electrode layer near the through hole at a high temperature and isostatic pressure at the time of fabrication of the piezoelectric element 100.

The piezoelectric element 100 according to the second embodiment is a piezoelectric element including the laminated body 101 in which the plurality of electrode layers 130 and the plurality of piezoelectric layers 136 and 105 are alternately laminated, and the laminated body 101 is a laminated portion including the first through hole conductor 114A penetrating the first piezoelectric layer 136A laminated on one surface of the electrode layer 130B and the second through hole conductor 114B penetrating the second piezoelectric layer 136B laminated on the other surface of the electrode layer 130B, and includes the inactive portion Sa. In the inactive portion Sa, the first through hole conductor 114A includes the first recess 114a on the lower surface (the end surface on the second piezoelectric layer 136B side), the second piezoelectric layer 136B includes the protrusion 136b that enters the first recess 114a, the second through hole conductor 114B includes the second recess 114a on the upper surface (the end surface on the first piezoelectric layer 136A side), and the first piezoelectric layer 136A includes the protrusion 136*b* that enters the second recess 114*a*.

In the piezoelectric element 100 according to the second embodiment, internal stress generated in the inactive portion Sa at the time of sintering when the piezoelectric element 100 is fabricated or stress applied from the outside to the inactive portion Sa is absorbed by the recess 114*a* of the lower surface of the first through hole conductor 114A and the recess 114*a* of the upper surface of the second through hole conductor 140B, similar to the piezoelectric element 10 according to the first embodiment. Thus, for example, deformation, rupture, or the like of the through hole conductor 114 is prevented, and conduction failure or disconnection of the electrode layer 130 or the through hole conductor 114 is prevented.

In addition, in the inactive portion Sa, since the protrusions 136*b* of the piezoelectric layers 103 and 105 enter the recesses 114*a* of the through hole conductor 114, a holding force of the piezoelectric layers 103 and 105 with respect to the through hole conductor 114 increases. In the configuration in which the protrusions 136*b* of the piezoelectric layers 103 and 105 enter the recesses 114*a* of the through hole conductor 114, displacement or deformation of the through hole conductor 114 is prevented or obstructed, unlike in a configuration in which the upper and lower surfaces of the through hole conductor 114 are flat and the piezoelectric layer does not enter. Accordingly, conduction failure or disconnection in the inactive portion Sa is further prevented.

Particularly, in the inactive portion Sa described above, since the first through hole conductor 114A and the second through hole conductor 114B are adjacent when viewed in a laminating direction of the laminated body 101, the downward protrusion 136*b* of the first piezoelectric layer 136A and the upward protrusion 136*b* of the second piezoelectric layer 136B are adjacent when viewed in the laminating direction of the laminated body 101. Therefore, both of the protrusions 136*b* suited for and displaced from each other effectively function as wedges, and movement of the second layer 130B sandwiched between the first piezoelectric layer 136A and the second piezoelectric layer 136B (that is, movement in the laminating direction and a planar direction of the laminated body 101) is effectively restrained. Therefore, conduction failure or disconnection in the inactive portion Sa is further prevented.

Further, in the piezoelectric element 100 according to the second embodiment, the stress or the strain that is applied from the active portion Sb to the inactive portion Sa at the time of polarization or at the time of driving is absorbed, similar to the piezoelectric element 10 according to the first embodiment described above. Accordingly, conduction failure or disconnection of the electrode layer 130 or the through hole conductor 114 in the laminated portion is prevented.

The present disclosure is not limited to the first embodiment and the second embodiment described above. For example, the number of electrode layers or piezoelectric layers of the laminated body of the piezoelectric element can be appropriately increased or decreased as long as the number is equal to or greater than a required minimum number of layers constituting the above-described laminated portion (that is, three or more electrode layers and two or more piezoelectric layers). Further, a total thickness of the laminated body, a thickness of the electrode layer, and a thickness of the piezoelectric layer can be appropriately increased or decreased. Further, the present disclosure is not limited to an aspect in which a thickness of the first through hole conductor, a thickness of the second through hole conductor, and a thickness of the third through hole conductor are all smaller than the thickness of the piezoelectric layer, and may be an aspect in which any of the thickness of the first through hole conductor, the thickness of the second through hole conductor, and the thickness of the third through hole conductor is smaller than the thickness of the piezoelectric layer.

Third Embodiment

Next, a configuration of the piezoelectric element 210 according to the third embodiment will be described with reference to FIGS. 13 and 14.

Figure 13:
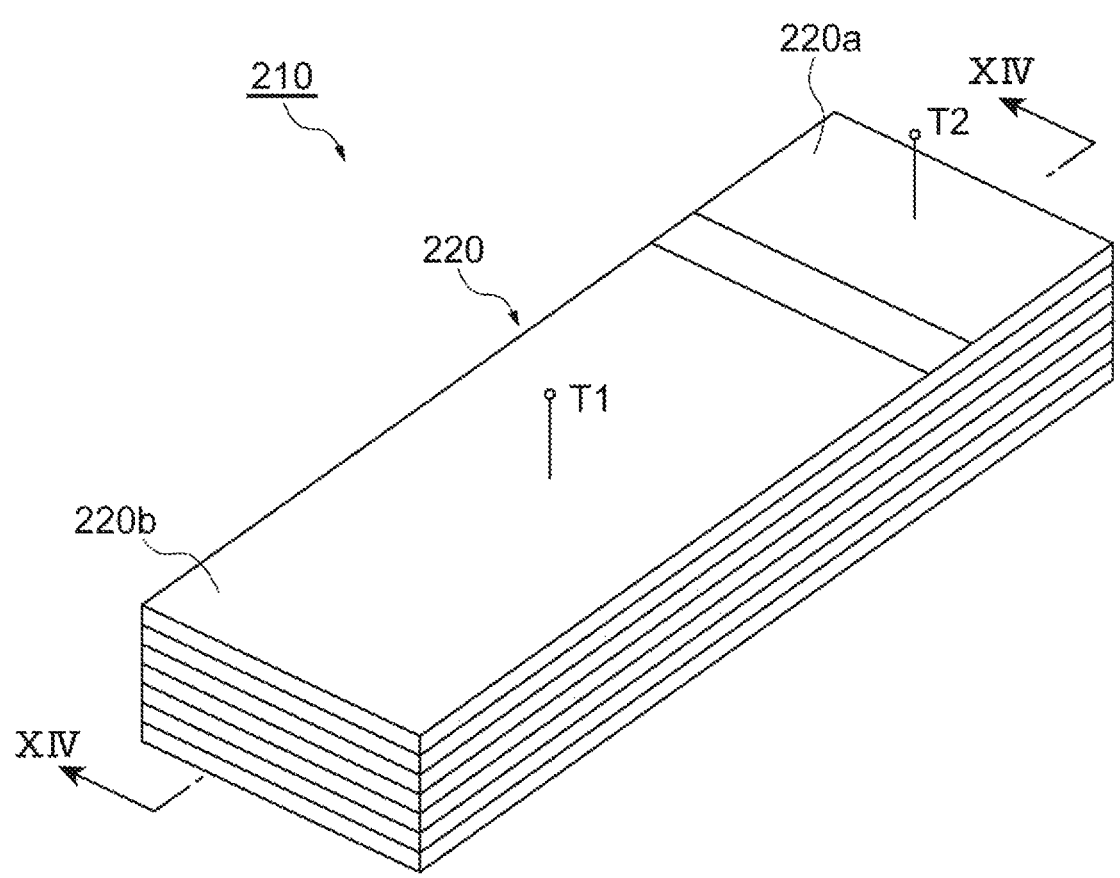
FIG. 13 is a perspective view of a piezoelectric element according to a third embodiment of the present disclosure.
Figure 14:
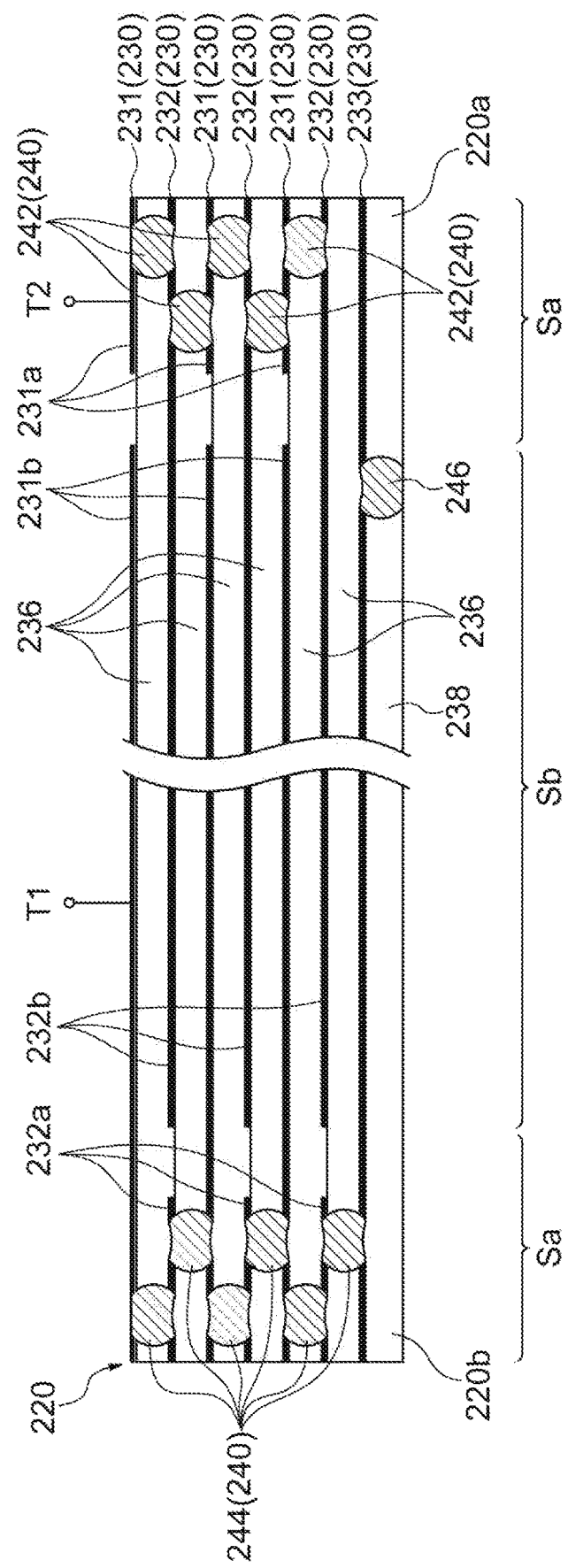
FIG. 14 is a cross-sectional view taken along line XIV-XIV of the piezoelectric element illustrated in FIG. 13.

As illustrated in FIG. 13, the piezoelectric element 210 includes a laminated body 220 having an outer shape of a rectangular parallelepiped which extends in one direction. For example, dimensions of the laminated body 220 are 2.0 mm in a longitudinal direction length, 0.5 mm in a lateral direction length, and 0.15 mm in a thickness. As illustrated in FIG. 14, the laminated body 220 includes a plurality of electrode layers 230, and a plurality of piezoelectric layers 236 and 238, and is configured such that the electrode layers 230 and the piezoelectric layers 236 and 238 are alternately laminated. In this embodiment, the laminated body 320 includes three or more electrode layers 230 and two or more piezoelectric layers 236 and 238. In FIGS. 13 and 14, the laminated body 230 includes seven electrode layers 230 and seven piezoelectric layers 236 and 238.

The plurality of electrode layers 230 are formed of Pt, and may be formed of a conductive material (Ag—Pd alloy, Au—Pd alloy, Cu, Ag, Ni, or the like) other than Pt. The plurality of electrode layers 230 are patterned by screen printing or the like. The plurality of electrode layers 230 include a first electrode layer 231, a second electrode layer 232, and a third electrode layer 233 which are different in electrode pattern. In the plurality of electrode layers 230, the first electrode layer 231 and the second electrode layer 232 are alternately arranged in this order from the top, as illustrated in FIG. 14, and the lowermost layer is the third electrode layer 233.

An electrode pattern of the first electrode layer 231 includes a short pattern 231*a* formed near one end portion 220*a* of the laminated body 220, and a long pattern 231*b* extending from the short pattern 231*a* to the other end portion 220*b* of the laminated body 220 via a predetermined gap. An electrode pattern of the second electrode layer 232 is a pattern symmetrical to the first electrode layer 231 and includes a short pattern 232*a* formed near the other end portion 220*b* of the laminated body 220, and a long pattern 232*b* extending from the short pattern 232*a* to the one end portion 220*a* of the laminated body 220 via a predetermined gap. The third electrode layer 233 is a pattern (so-called solid pattern) formed over an entire region.

All of the plurality of piezoelectric layers 236 and 238 have a rectangular flat plate shape and have, for example, a longitudinal direction length of 2.0 mm, a lateral direction length of 0.5 mm, and a thickness of 20 μm. Each of the piezoelectric layers 236 and 238 is formed of, for example, a piezoelectric ceramic material containing lead zirconate titanate as a main component, and contains additives such as Zn or Nb. The plurality of piezoelectric layers 236 and 238 include the piezoelectric layer 236 on and underneath which the electrode layers 230 are located, and the lowermost piezoelectric layer 238 only on which the electrode layer 230 is located.

In the piezoelectric layer 236, a through hole 236*a* penetrates therethrough at a predetermined position, and a through hole conductor 240 connecting the electrode layers 230 located on and beneath the piezoelectric layer 236 is formed in a region in which each through hole 236a is formed. That is, the through hole conductor 240 is formed by filling the through hole 236a provided in the piezoelectric layer 236 with an electrode material.

The through hole conductor 240 as the through hole conductor 242 connects the short pattern 231a of the first electrode layer 231 and the long pattern 232b of the second electrode layer 232 in the one end portion 220a of the laminated body 220. Therefore, both of the short pattern 231a of the first electrode layer 231 and the long pattern 232b of the second electrode layer 232 are electrically connected to an external connection terminal T2 connected to the short pattern 231a of the first electrode layer 231 of a surface of the laminated body 220, and have the same polarity.

Further, the through hole conductor 240 as the through hole conductor 244 connects the short pattern 232a of the second electrode layer 232 and the long pattern 231b of the first electrode layer 231 in the other end portion 220b of the laminated body 220. Further, the through hole conductor 240 as the through hole conductor 244 connects the short pattern 232a of the second electrode layer 232 and the third electrode layer 233 in the other end portion 220b of the laminated body 220. Therefore, the short pattern 232a of the second electrode layer 232, the long pattern 231b of the first electrode layer 231, and the third electrode layer 233 are all electrically connected to an external connection terminal T1 connected to the long pattern 231b of the first electrode layer 231 of the surface of the laminated body 220, and have the same polarity.

In the piezoelectric element 210, a pair of external connection terminals T1 and T2 are provided on the surface of the laminated body 220, and since the terminals for two polarities are exposed on one side, conduction can be taken from the one side.

When a voltage is applied between the pair of external connection terminals T1 and T2, an electrode group (that is, the short pattern 231a of the first electrode layer 231 and the long pattern 232b of the second electrode layer 232) connected on the one end portion 220a side of the laminated body 220 and an electrode group (that is, the long pattern 231b of the first electrode layer 231, the short pattern 232a of the second electrode layer 232, and the third electrode layer 233) connected on the other end portion 220b side have different polarities. In this case, an electric field is generated between the long pattern 231b of the first electrode layer 231 and the long pattern 232b of the second electrode layer 232 overlapping in a portion sandwiched between both of the end portions 220a and 220b of the laminated body 220, such as near a center, and a portion of the piezoelectric layer 236 located therebetween is deformed (extends or contracts) according to the polarization direction. Therefore, the portion sandwiched between both of the end portions 220a and 220b of the laminated body 220 is the active portion Sb that is deformed when a voltage is applied between the pair of external connection terminals T1 and T2.

Since the vicinity of the one end portion 220a of the laminated body 220 is a laminated portion in which the electrode layer portions 231a and 232b having the same polarity overlap, deformation hardly occurs even when a voltage is applied between the pair of external connection terminals T1 and T2. Therefore, the vicinity of the one end portion 220a of the laminated body 220 is an inactive portion Sa which is not deformed even when a voltage is applied. The inactive portion Sa is suitable for installation of the above-described through hole conductor 240 because no large displacement occurs. Since the vicinity of the other end portion 220b of the laminated body 220 is a laminated portion in which the electrode layer portions 231b and 232a having the same polarity overlap, the vicinity of the other end portion 220b of the laminated body 220 is an inactive portion Sa which is not deformed even when a voltage is applied, similar to the vicinity of the one end portion 220a. Thus, in the piezoelectric element 210, the inactive portions Sa and the active portion Sb are arranged side by side in the longitudinal direction of the laminated body 220.

Since the third electrode layer 233 is located only on the piezoelectric layer 238, deformation hardly occurs even when a voltage is applied between the pair of external connection terminals T1 and T2, similar to both the end portions 220a and 220b of the laminated body 220. A through hole conductor 246 is penetrating through the piezoelectric layer 238. The through hole conductor 246 can be formed by filling the through hole provided in the piezoelectric layer 238 with an electrode material. The through hole conductor 246 is a dummy through hole conductor which is not intended to allow conduction to the electrode layer 230, and can be used for identifying, for example, a front and a back or a polarity of a component.

In the laminated body 220, the through hole conductors 242, 244, and 246 are provided only in a portion in which deformation does not substantially occur even when a voltage is applied between the pair of external connection terminals T1 and T2 (that is, both the end portions 220a and 220b and the piezoelectric layer 38 as the lowermost layer).

Figure 15:
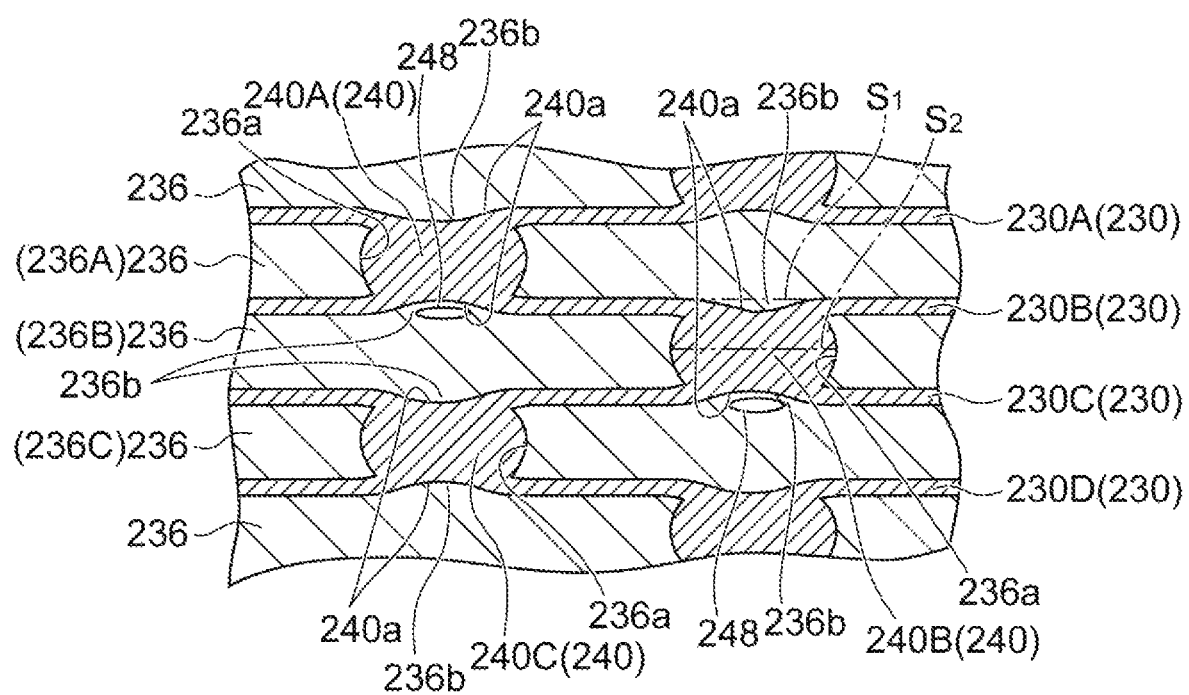
FIG. 15 is an enlarged view of main portions in an inactive portion of the piezoelectric element illustrated in FIG. 13.

Next, a configuration of the electrode layer 230 and the piezoelectric layer 236 in the inactive portion Sa will be described with reference to FIG. 15. FIG. 15 illustrates a cross section of the inactive portion Sa on the side of the other end portion 220b of the laminated body 220.

As illustrated in FIG. 15, in the inactive portion Sa, the electrode layers 230 (more specifically, the electrode layers 231b and 232b) having the same polarity overlap via the piezoelectric layers 236. For convenience of description, the overlapping electrode layers 230 are also referred to as a first layer 230A, a second layer 230B, a third layer 230C, and a fourth layer 230D in this order from the upper side. Further, the piezoelectric layer 236 interposed between the first layer 230A and the second layer 230B is particularly referred to as a first piezoelectric layer 236A, the piezoelectric layer 236 interposed between the second layer 230B and the third layer 230C is particularly referred to as a second piezoelectric layer 236B, and the piezoelectric layer 236 interposed between the third layer 230C and the fourth layer 230D is particularly referred to as a third piezoelectric layer 236C.

The first layer 230A, the second layer 230B, the third layer 230C, and the fourth layer 230D that are adjacent are connected by the through hole conductors 240 penetrating the piezoelectric layers 236. For example, the first through hole conductor 240A penetrating the first piezoelectric layer 236A connects the first layer 230A and the second layer 230B located on and beneath the first through hole conductor 240A. The second through hole conductor 240B penetrating the second piezoelectric layer 236B connects the second layer 230B and the third layer 230C located on and beneath the second through hole conductor 240B. The third through hole conductor 240C penetrating the third piezoelectric layer 236C connects the third layer 230C and the fourth layer 230D located on and beneath the third through hole conductor 240C.

However, vertically adjacent through hole conductors 240 do not overlap when viewed in the thickness direction (the laminating direction of the laminated body 220) and are adjacent. Specifically, the first through hole conductor 240A of the first piezoelectric layer 236A and the second through hole conductor 240B of the second piezoelectric layer 236B do not overlap when viewed in the thickness direction and are arranged to be misaligned in the longitudinal direction (that is, the horizontal direction in FIG. 15) of the laminated body 220. Further, the second through hole conductor 240B and the third through hole conductor 240C of the third piezoelectric layer 236C do not overlap when viewed in the thickness direction and are arranged to be misaligned in a horizontal direction in FIG. 15. The third through hole conductor 240C of the third piezoelectric layer 236C overlaps the first through hole conductor 240A of the first piezoelectric layer 236A when viewed in the thickness direction. The amount of misalignment of the through hole conductors 240 is, for example, equal to or larger than a maximum radius of the through hole conductor 240, or equal to or larger than a maximum diameter of the through hole conductor 240.

Next, a procedure for fabricating the above-described piezoelectric element 210 will be described.

First, a binder, an organic solvent, or the like is applied to piezoelectric ceramic powder that is used for formation of the piezoelectric layer 236, resulting in a paste. With the obtained paste, a plurality of green sheets having a predetermined size are fabricated, for example, using a doctor blade method. In this case, a plasticizer to binder ratio is adjusted so that sufficient deformation is obtained.

In each green sheet, a through hole is formed in a portion in which the through hole conductor 240 is formed, using a YAG laser.

An electrode paste serving as the electrode layer 230 (for example, a Pd—Ag alloy (Pd:Ag=3:7)) is coated on each green sheet using a screen printing method and formed so that the electrode paste becomes the above-described pattern. When the electrode paste is applied, the through hole formed in the green sheet is filled with the electrode paste, but a rate of filling of the through hole with the electrode paste is adjusted according to a viscosity or a drying time of the electrode paste.

Subsequently, a plurality of green sheets on which the electrode paste has been printed are overlapped, and press processing such as warm isostatic pressing (WIP) is performed to obtain a green laminated body. In the warm isostatic pressing, pressing is performed, for example, at about 50 MPa at a temperature of about 80° C. In this case, a portion that becomes the electrode layer near the through hole portion is bent at a high temperature and under an isostatic pressure.

The obtained green laminated body is sintered. Specifically, the green laminated body is placed on a setter including stabilized zirconia, a binder removal process is performed, and the setter having the green laminated body placed thereon is put into a stabilized zirconia sagger and sintered at about 1100° C.

After sintering, a predetermined polarization process is performed to complete the piezoelectric element 210. In the polarization process, for example, a voltage with an electric field intensity of 2 kV/mm is applied for 3 minutes at a temperature of 100° C.

In the piezoelectric element 210 obtained by the above-described procedure, the recesses 240*a* are formed in both end portions of the through hole conductor 240 in the laminating direction of the laminated body 220, as illustrated in FIG. 15. For example, the first through hole conductor 240A penetrating the first piezoelectric layer 236A includes the recess 240*a* recessed toward the first through hole conductor 240A (downward in FIG. 15) on the upper surface, and includes the recess 240*a* recessed toward the first through hole conductor 240A (upward in FIG. 15) on the lower surface (an end surface on the second piezoelectric layer 236B side). Similarly, the second through hole conductor 240B and the third through hole conductor 240C include recesses 240*a* on upper and lower surfaces thereof.

The through hole conductor 240 is partially thinned (that is, a length in a laminating direction is made shorter) due to the recesses 240*a*. As illustrated in FIG. 15, thicknesses at portions of the recesses 240*a* of the respective through hole conductors 240A, 240B, and 240C are smaller than the thickness of the piezoelectric layer 236.

Further, a protrusion 236*b* of the piezoelectric layer 236 enters the recess 240*a* formed in each through hole conductor 240. For example, the upward protrusion 236*b* of the second piezoelectric layer 236B enters the recess 240*a* of the lower surface of the first through hole conductor 240A. Further, the downward protrusion 236*b* of the first piezoelectric layer 236A enters the recess 240*a* of the upper surface of the second through hole conductor 240B.

A shape of such a through hole conductor 240, a shape of the electrode layer 230, and a shape of the piezoelectric layer 236 are considered to be obtained by bending the electrode layer near the through hole at a high temperature and isostatic pressure at the time of fabrication of the piezoelectric element 210.

Further, in the piezoelectric element 210 obtained in the above-described procedure, a plurality of voids 248 adjacent to the respective through hole conductors 240 are formed. More particularly, each of the plurality of voids 248 is adjacent to the end portion of each through hole conductor 240 in the laminating direction of the laminated body 220, and is located to enter the recess 240*a* of each through hole conductor 240. More particularly, the void 248 is located at the protrusion 236*b* of the piezoelectric layer 236 entering the recess 240*a* of the through hole conductor 240. Each void 248 has a cross section extending in one direction along the extension direction of the electrode layer 230, as illustrated in FIG. 15. Further, the inside of each void 248 is filled with an inert gas.

Further, in the piezoelectric element 210 obtained by the above-described procedure, the through hole conductor 240 has a shape bulging at a center position in the thickness direction. In the through hole conductor 240, an area S1 of the end surfaces of both end portions of the through hole conductor 240 is smaller than an area S2 of the cross section at the center position in the thickness direction of the through hole conductor 240.

As described above, the piezoelectric element 210 includes a laminated body 220 having the inactive portion Sa as a laminated portion including a pair of electrode layers 230 (for example, the first layer 230A and the second layer 230B in FIG. 15), the piezoelectric layer 236 interposed between the pair of electrode layers 230, and the through hole conductor 240 (for example, the first through hole conductor 240A in FIG. 15) penetrating the piezoelectric layer 236. The inactive portion Sa includes a void 248 adjacent to the through hole conductor 240.

In the piezoelectric element 210, the void 248 adjacent to the through hole conductors 240 alleviates stress or strain around the through hole conductors 240 in the inactive portion Sa. Accordingly, conduction failure or disconnection of the electrode layer 230 or the through hole conductor 240 in the inactive portion Sa is prevented. Particularly, in the above-described embodiment, there are the plurality of voids 248 in the inactive portion Sa, and the void 248 is adjacent to each of a plurality of through hole conductors 240. Therefore, stress or strain is absorbed in each of the plurality of through hole conductors 240, and conduction failure or disconnection in the inactive portion Sa is further prevented.

Figure 16:
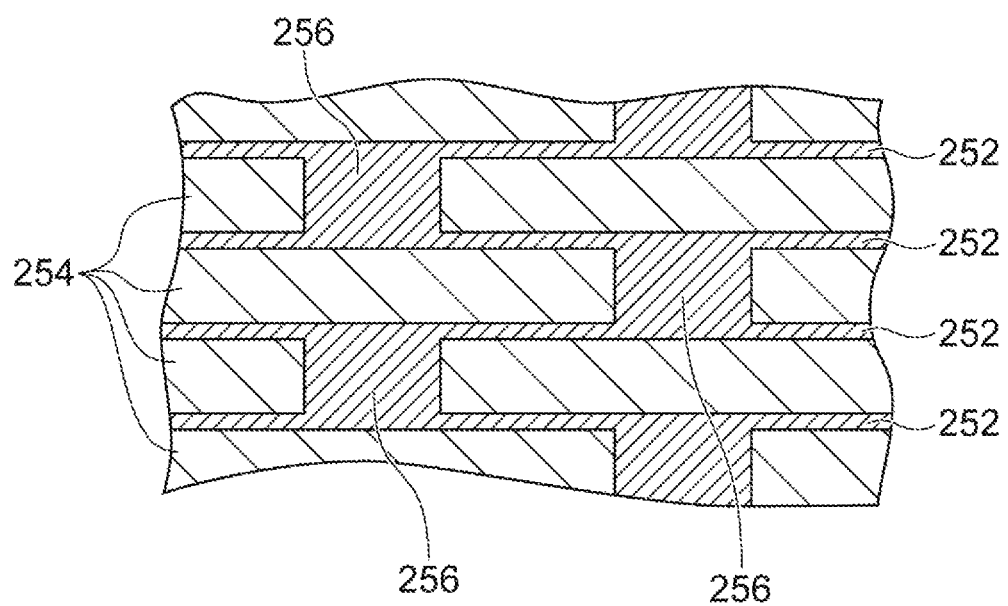
FIG. 16 illustrates an enlarged cross-sectional view of main portions of an inactive portion of the piezoelectric element according to the related art.

FIG. 16 illustrates an enlarged cross-sectional view of main portions in the inactive portion of the piezoelectric element according to the related art. In FIG. 16, reference numerals 252, 254, and 256 indicate the electrode layer, the piezoelectric layer, and the through hole conductor, respectively. As illustrated in FIG. 16, in the inactive portion of the piezoelectric element according to the related art, there is no void that alleviates stress or strain caused near the through hole conductors 256. Therefore, in the piezoelectric element according to the related art, stress or strain in the through hole conductor 256 is not absorbed, and conductive failure or disconnection of the electrode layer 252 or the through hole conductor 256 in the inactive portion may occur.

That is, the piezoelectric element according to the related art includes the laminated body in which the electrode layer 252 and the piezoelectric layer 254 alternately overlap each other, and the laminated body is obtained by sintering an object obtained by overlapping the electrode materials and the piezoelectric materials, but it is easy for residual stress caused by contraction at the time of sintering to be generated inside the laminated body. Particularly, since constituent materials or physical properties are different between the electrode layer 252 and the piezoelectric layer 254, there is a tendency for stress to be concentrated on an interface therebetween or near the interface. The stress generated at the time of sintering or the like may cause conduction failure or disconnection in the electrode layers 252 or the through hole conductors 256 and degrade connection reliability of the piezoelectric element.

A position of the void 248 is not limited to the position adjacent to the through hole conductors 240 in the laminating direction of the laminated body 220 (that is, a vertically-aligned position), and may be a position adjacent to the through hole conductors 240 in a direction orthogonal to the laminating direction (that is, a horizontally-aligned position).

In order to alleviate stresses or strains having a variety of directions or magnitudes, positions (positions relative to the through hole conductors 240) or dimensions of the plurality of voids 248 may not be uniform, and can be nonuniform and irregular. The position is not limited to the position adjacent to the through hole conductor 240 in the laminating direction of the laminated body 220 (that is, a vertically-aligned position), and may be a position adjacent to the through hole conductor 240 in a direction orthogonal to the laminating direction (that is, a horizontally-aligned position).

However, since the above-described void 248 located to enter the recess 240a of the through hole conductor 240 can effectively alleviate stress or strain, at least some of the plurality of voids 248 can be present in the above positions.

Further, the piezoelectric element 210 includes the active portion Sb that is deformed due to an electric field generated in the piezoelectric layer 236 when a voltage is applied, and the inactive portion Sa in which an electric field is not generated in the piezoelectric layer 236 when a voltage is applied, and in the piezoelectric element 210, the above-described laminated portion is located in the inactive portion Sa. As described above, since the active portion Sb is deformed at the time of polarization or at the time of driving and internal stress or strain is generated, the laminated portion including the through hole conductor 240 is located in the inactive portion Sa in order to avoid an influence of the stress or the strain caused by the deformation as much as possible.

In the piezoelectric element 210, internal stress generated in the inactive portion Sa at the time of sintering (that is, residual stress due to contraction at the time of sintering) when the piezoelectric element 210 is fabricated or stress applied from the outside to the inactive portion Sa is absorbed by the recess 240a of the lower surface of the first through hole conductor 240A and the recess 240a of the upper surface of the second through hole conductor 240B. Thus, for example, deformation, rupture, or the like of the through hole conductor 240 is prevented, and conduction failure or disconnection of the electrode layer 230 or the through hole conductor 240 in the inactive portion Sa is prevented.

Further, in the inactive portion Sa, since the protrusion 236b of the piezoelectric layer 236 enters the recess 240a of the through hole conductor 240, a holding force of the piezoelectric layer 236 with respect to the through hole conductor 240 increases. Therefore, in the configuration in which the protrusion 236b of the piezoelectric layer 236 enters the recess 240a of the through hole conductor 240, displacement or deformation of the through hole conductor 240 is prevented or obstructed, unlike in a configuration in which the end surfaces (the upper and lower surfaces) of the through hole conductor 256 are flat and the piezoelectric layer 254 does not enter (see FIG. 16). As a result, conduction failure or disconnection in the inactive portion Sa is prevented.

Further, in the piezoelectric element 210 described above, the through hole conductor 240 has a shape bulging at a center position in the thickness direction, and an area S1 of the end surfaces of both end portions of the through hole conductor 240 is smaller than a cross-sectional area S2 at the center position in the thickness direction of the through hole conductor 240. According to the through hole conductor 240 having such a shape, the stress or the strain that is applied to the inactive portion Sa is absorbed. Further, since electric field concentration on a through hole central portion which easily becomes disconnected when viewed in the thickness direction of the through hole conductor 240 is avoided, it is possible to inhibit disconnection due to electric field concentration. Further, since an area S2 of a cross section at a center position in the thickness direction of the through hole conductor 240 is greater than an area S1 of the end surfaces of both end portions of the through hole conductor 240, a through hole structure in which an anchor effect within the piezoelectric layer 236 is great is obtained, and unnecessary deformation of the through hole conductor 240 is prevented and strain of the end surface is absorbed.

In the piezoelectric element 210, since the inactive portion Sa of the one end portion 220a side of the laminated body 220 has the same configuration of the electrode layer 230, the piezoelectric layer 236, and the through hole conductor 240 as the inactive portion Sa on the other end portion 220b side described above, the same effects as described above can be obtained also in the inactive portion Sa on the one end portion 220a side.

Fourth Embodiment

Next, a configuration of a piezoelectric element according to a fourth embodiment 300 will be described with reference to FIGS. 17 to 20.

Figure 17:
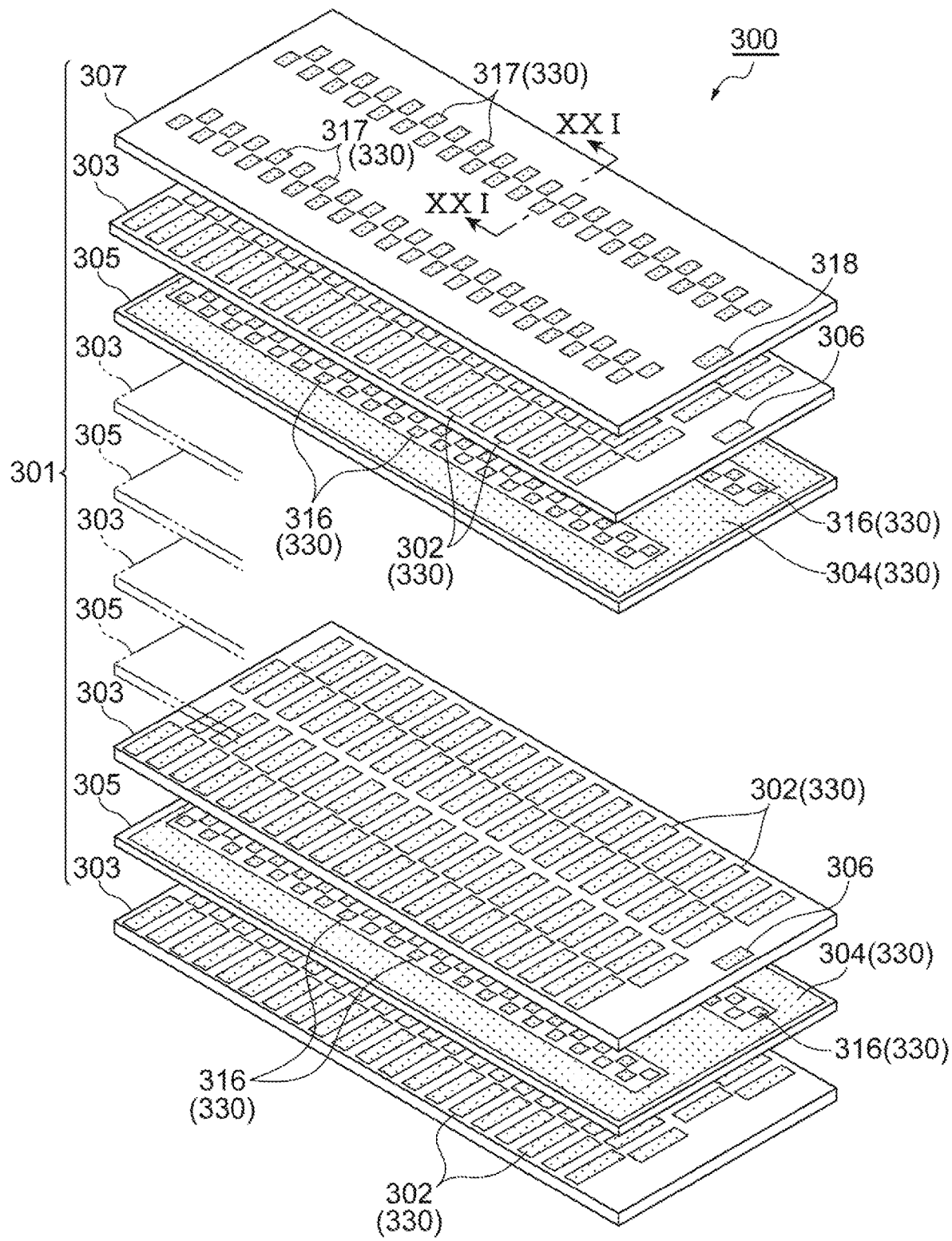
FIG. 17 is an exploded perspective view of a piezoelectric element according to a fourth embodiment of the present disclosure.
Figure 18:
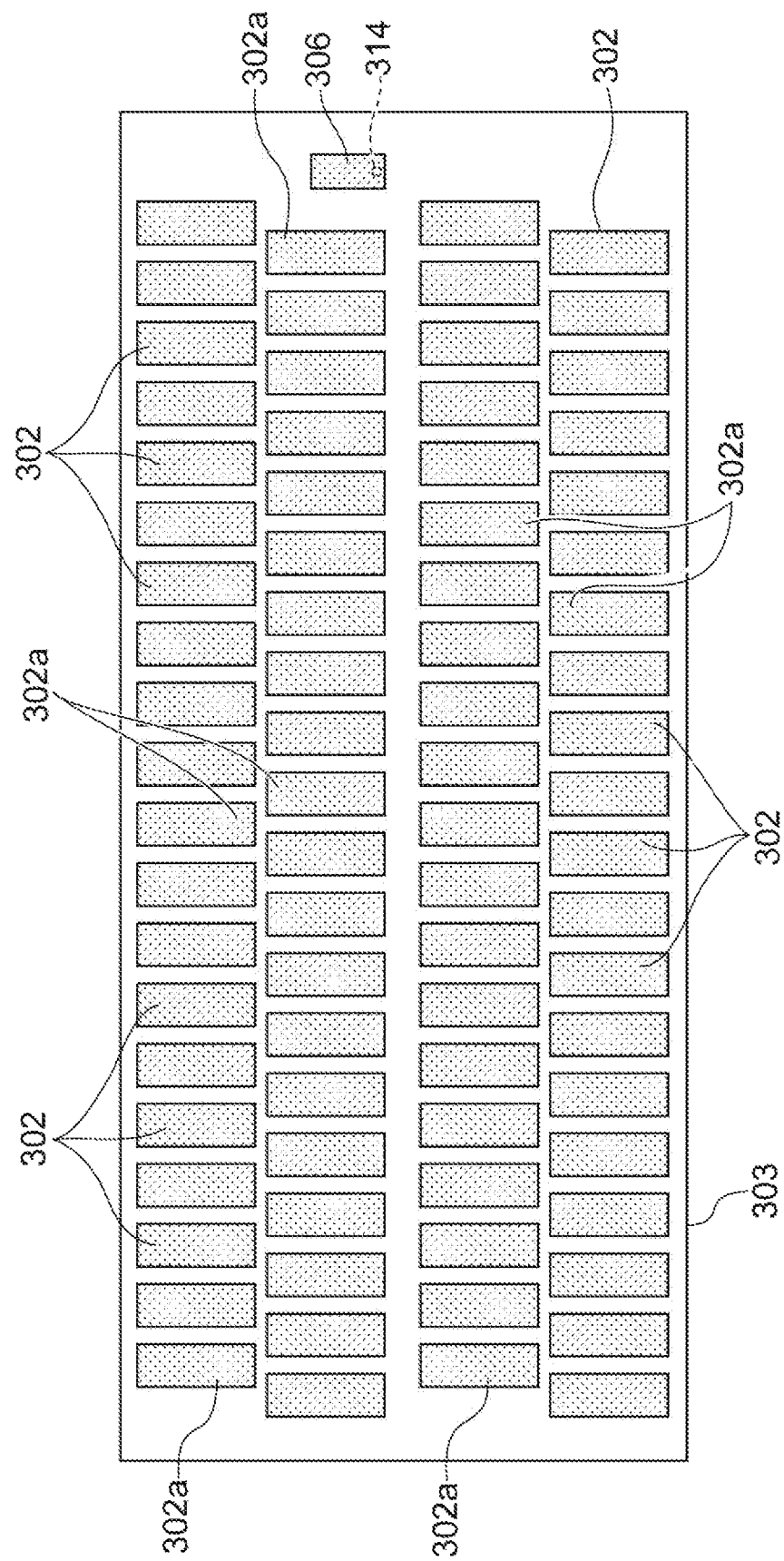
FIG. 18 is a plan view of piezoelectric layers of second, fourth, sixth, and eighth layers of the piezoelectric element illustrated in FIG. 17.

As illustrated in FIG. 17, the piezoelectric element 300 is configured such that a plurality of piezoelectric layers 303 having individual electrodes 302 formed therein and a plurality of piezoelectric layers 305 having a common electrode 304 formed therein are alternately laminated, and a piezoelectric layer 307 having terminal electrodes 317 and 318 formed thereon is laminated on an uppermost layer.

The piezoelectric element 300 includes a laminated body 301 having an outer shape of a rectangular parallelepiped which extends in one direction. The dimensions of the laminated body 301 are, for example, 30.0 mm in a longitudinal direction length, 15.0 mm in a lateral direction length, and 0.30 mm in a thickness.

All of the plurality of piezoelectric layers 303 and 307 have a rectangular flat plate shape and have, for example, a longitudinal direction length of 30.0 mm, a lateral direction length of 15.0 mm, and a thickness of 30 µm. Each piezoelectric layer 36 is formed of, for example, a piezoelectric ceramic material mainly containing lead zirconate titanate, and contains additives such as Nb and Sr.

Each of the piezoelectric layers 303, 305, and 307 is formed of a piezoelectric ceramic material mainly containing lead zirconate titanate and is formed, for example, in a rectangular thin plate shape of "15 mm×30 mm and a thickness of 30 µm". Further, the individual electrode 302, the common electrode 304, and the terminal electrodes 317 and 318 are formed of an Ag—Pd alloy (Ag 70 wt % and Pd 30 wt %), and may be formed of a conductive material (Ag—Pt alloy, Au—Pd alloy, Cu, Ni, or the like) other than an Ag—Pd alloy. The electrodes may be patterned by screen printing.

Figure 19:
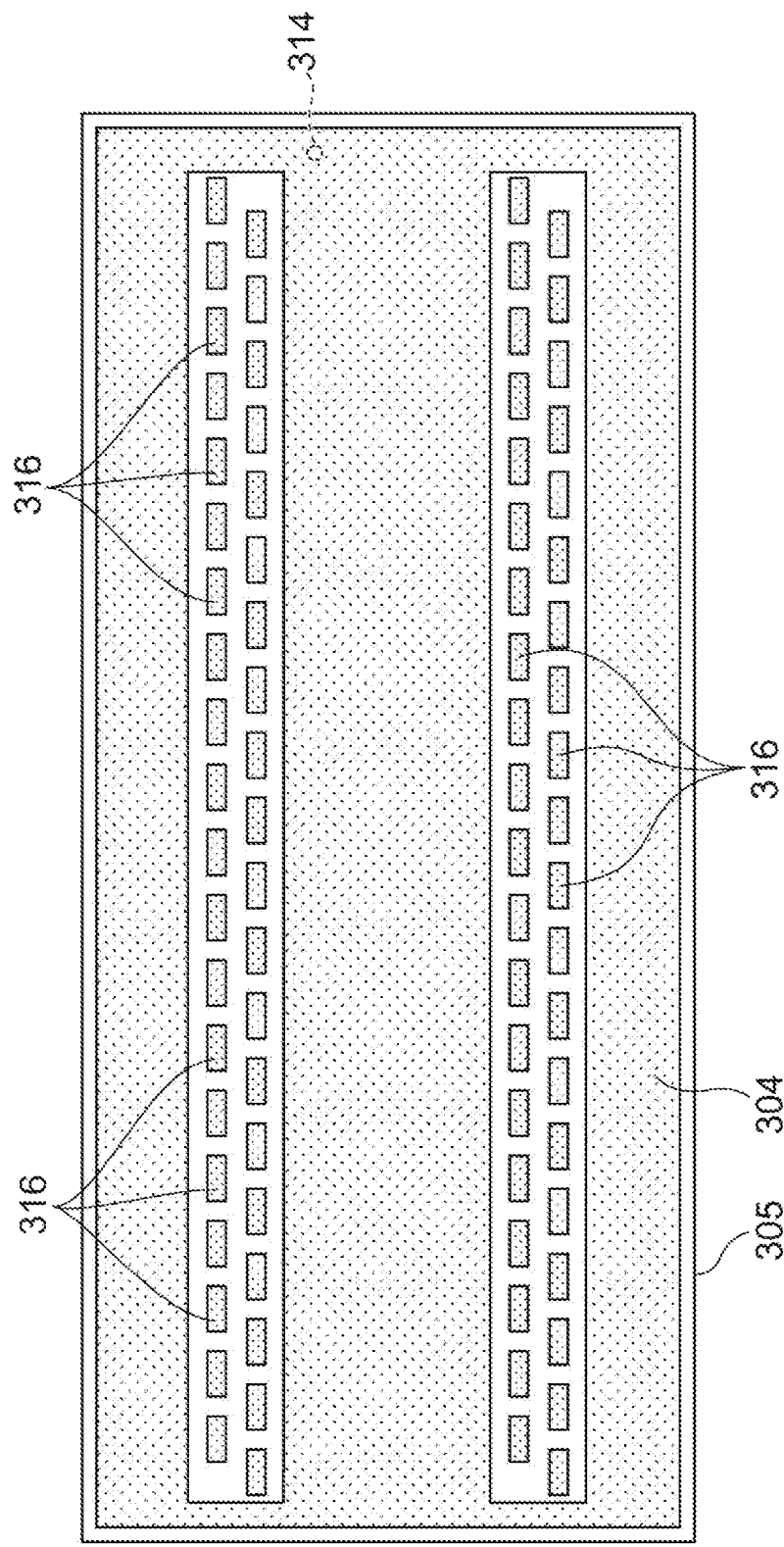
FIG. 19 is a plan view of piezoelectric layers as third, fifth, and seventh layers of the piezoelectric element illustrated in FIG. 17.

A plurality of rectangular individual electrodes 302 are arranged in a zigzag manner on the upper surfaces of the piezoelectric layers 303 as the second layer, the fourth layer, the sixth layer, and the eighth layer from the piezoelectric layer 307 that is an uppermost layer, as illustrated in FIG. 19. The longitudinal direction of each individual electrode 302 is arranged to be orthogonal to the longitudinal direction of the piezoelectric layer 303, and adjacent individual electrodes 302 and 302 are arranged at a predetermined interval such that the adjacent individual electrodes are electrically independent from each other and are prevented from being affected by each other's vibration.

Here, when the longitudinal direction of the piezoelectric layer 3 is a column direction and a direction orthogonal to the longitudinal direction is a row direction, the individual electrodes 302 are arranged, for example, side by side in a zigzag shape in four rows. By arranging the plurality of individual electrodes 302 in a zigzag shape, it becomes possible to efficiently arrange individual electrodes 102 on the piezoelectric layers 103. Thus, it is possible to achieve a small size of the piezoelectric element 300 and high integration of the individual electrodes 302 while maintaining an area of the active portion contributing to deformation in the piezoelectric layer 303.

Figure 21:
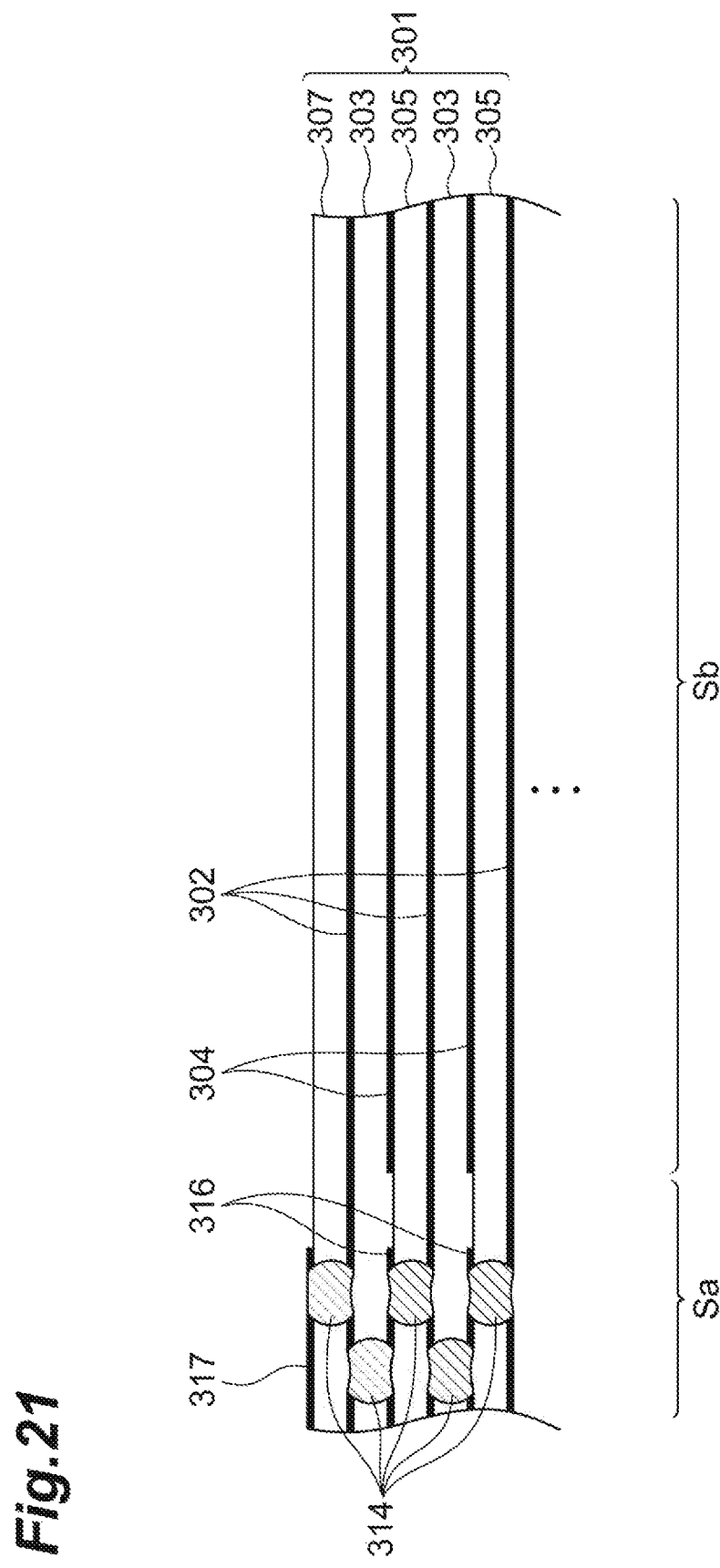
FIG. 21 is a cross-sectional view taken along line XXI-XXI of the piezoelectric element illustrated in FIG. 17.

Each individual electrode 302 has an end portion facing the adjacent individual electrode as a connection end portion 302a, and is connected to the through hole conductor 314 penetrating the piezoelectric layer 303, as illustrated in FIG. 21, immediately below the connection end portion 302a. The through hole conductor 314 is formed by filling the through hole 336a provided in the piezoelectric layer 303 with an electrode material.

Further, a relay electrode 306 for electrically connecting the common electrodes 304 of the piezoelectric layers 305 located on and beneath the piezoelectric layer 303 is formed in an edge portion of the upper surface of the piezoelectric layer 303. The relay electrode 306 is connected to the through hole conductor 314 penetrating the piezoelectric layer 303 immediately below the relay electrode 306.

The individual electrodes 302 are arranged in a zigzag manner on the upper surface of the piezoelectric layer 303 as the lowermost layer, similar to the piezoelectric layers 303 as the second layer, the fourth layer, the sixth layer, and the eighth layer described above. However, the piezoelectric layer 303 as the lowermost layer is different from the piezoelectric layers 303 of the second layer, fourth layer, the sixth layer, and the eighth layer in that the relay electrode 306 and the through hole conductor 314 are not formed.

Further, a relay electrode 316 is formed to face each connection end portion 302a of the piezoelectric layer 103 in the laminating direction of the laminated body 301 (that is, a thickness direction of the laminated piezoelectric element 300), as illustrated in FIG. 19, on the upper surfaces of the piezoelectric layers 305 of the third layer, the fifth layer, the seventh layer, and the ninth layer from the piezoelectric layer 307 as the uppermost layer. Each relay electrode 316 is connected to the through hole conductor 314 penetrating the piezoelectric layer 305, as illustrated in FIG. 21, directly below the relay electrode 316. The through hole conductor 314 is formed by filling the through hole 336a provided in the piezoelectric layer 305 with an electrode material.

Further, the common electrode 304 is formed on the upper surface of the piezoelectric layer 305. The common electrode 304 surrounds a set of relay electrodes 316 in first and second rows and a set of relay electrodes 316 in the third and fourth rows at a predetermined interval, and overlaps a portion other than the connection end portion 302a of each individual electrode 302 when viewed in the laminating direction. Thus, an entire portion facing the portion other than the connection end portions 302a of each individual electrode 302 in the piezoelectric layers 303 and 305 can be effectively used as an active portion (the active portion Sb in FIG. 21) contributing to the deformation. Further, the common electrode 304 is formed at a predetermined interval from the outer circumferential portion of the piezoelectric layer 305, and is connected to the through hole conductor 314 penetrating the piezoelectric layer 305 to face the relay electrode 306 of the piezoelectric layer 303 in the laminating direction.

The relay electrodes 316 and the common electrode 304 are formed on the upper surface of the piezoelectric layer 305 of the ninth layer, similar to the piezoelectric layers 305 of the third layer, the fifth layer, and the seventh layer described above. However, the piezoelectric layer 305 of the ninth layer is different from the piezoelectric layers 305 of the third layer, the fifth layer, and the seventh layer in that the through hole conductor 314 facing the relay electrode 306 of the piezoelectric layer 303 in the laminating direction is not formed.

Figure 20:
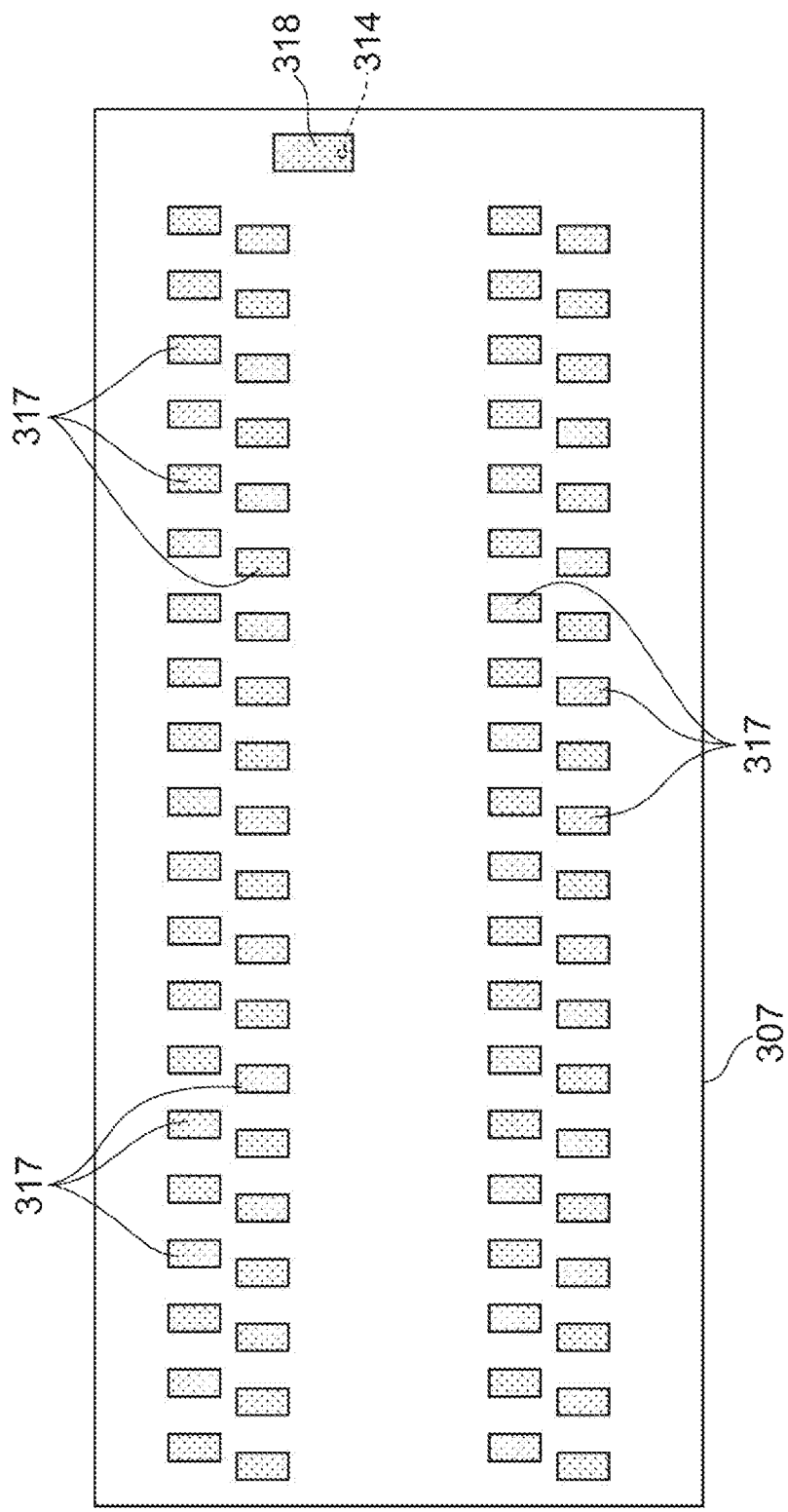
FIG. 20 is a plan view of a piezoelectric layer of an uppermost layer of the piezoelectric element illustrated in FIG. 17.

Further, the terminal electrode 317 is formed to face the connection end portion 302a of each individual electrode 302 of the piezoelectric layer 303 in the laminating direction, as illustrated in FIG. 20, on the upper surface of the piezoelectric layer 307 as the uppermost layer, and the terminal electrode 318 is formed to face the relay electrode 306 of the piezoelectric layer 303 in the laminating direction. The respective terminal electrodes 317 and 318 are connected to the through hole conductor 314 penetrating the piezoelectric layer 307 immediately below the terminal electrodes 317 and 318.

Lead wires of a flexible printed circuit board (FPC) or the like for connection to a driving power supply are soldered to the terminal electrodes 317 and 318. Therefore, in order to easily place solder when lead wires are soldered, a surface electrode layer formed of a conductive material including Ag in order to improve solder wettability in the terminal electrodes 317 and 318 is formed on an underlying electrode layer formed of a conductive material including Ag and Pd.

The thickness of the terminal electrodes 317 and 318 formed on the piezoelectric layer 307 as the uppermost layer is greater than the thickness of the other electrode layers 302, 304, and 316 and is about 1 to 2 µm. The thickness of the terminal electrodes 317 and 318 is, for example, 5 to 50% or 10 to 30% greater than the thickness of the other electrode layer 302, 304, and 316.

A dummy electrode pattern may be arranged in a circumferential portion of the upper surface of the piezoelectric layer 107 as the uppermost layer. By arranging the dummy electrode pattern in the circumferential portion, an effect that a deviation of pressure is reduced at the time of pressing and variation in a green density after pressing can be reduced is obtained.

By laminating the piezoelectric layers 303, 305, and 307 on which the electrode pattern has been formed as described above, four common electrodes 304 are aligned with the relay electrode 306 interposed therebetween in a laminating direction with respect to the terminal electrode 318 as the uppermost layer, and the respective aligned electrode layers 304 and 306 are electrically connected by the through hole conductor 314.

Further, five individual electrodes 302 are aligned with the relay electrode 316 interposed therebetween in the laminating direction with respect to the respective terminal electrodes 317 as the uppermost layer, and the respective aligned electrode layers 302 and 316 are electrically connected by the through hole conductors 314, as illustrated in FIG. 21.

The through hole conductors 314 which are adjacent when viewed in the laminating direction of the laminated body 301 are designed so that central axes thereof do not overlap, as illustrated in FIG. 11, and are formed on the piezoelectric layers 303 and 305 to be adjacent in the extension direction of the individual electrodes 302 at a predetermined interval when viewed in the laminating direction. By arranging adjacent through hole conductors 314 as described above, electrical connection is reliably made by the through hole conductors 314.

The laminated piezoelectric element 300 has the electrical connection as described above. Accordingly, when a voltage is applied between a predetermined terminal electrode 317 and the terminal electrode 318, a voltage is applied between the individual electrodes 302 and the common electrode 304, and the active portion Sb that is a portion in which the piezoelectric layers 303 and 305 are interposed between the individual electrodes 302 and the common electrodes 304 is displaced. Thus, by selecting the terminal electrode 317 to which the voltage is applied, the active portion Sb aligned under the selected terminal electrode 317 among the active portions Sb corresponding to the respective individual electrodes 302 arranged in a matrix form can be displaced in the laminating direction. Such a laminated piezoelectric element 300 is applied to a driving source for various devices requiring small displacement, such as in valve control of a micropump.

On the other hand, since the portion in which the connection end portion 302a of the individual electrode 302 and the relay electrode 316 overlap is a laminated portion in which the electrode layers with the same polarity overlap, the portion is hardly deformed even when a voltage is applied. Therefore, as illustrated in FIG. 21, the portion in which the connection end portion 302a of the individual electrode 302 and the relay electrode 316 overlap is the inactive portion Sa which does not contribute to the deformation. Further, deformation of the piezoelectric layer 307 as the uppermost layer hardly occurs even when a voltage is applied since the individual electrode 302 is located only under the piezoelectric layer 307 as the uppermost layer. In the laminated body 101, the through hole conductor 314 is provided only in the portion in which the deformation does not substantially occur when a voltage is applied (that is, the portion in which the connection end portions 302a of the individual electrodes 302 and the relay electrodes 316 overlap).

Figure 22:
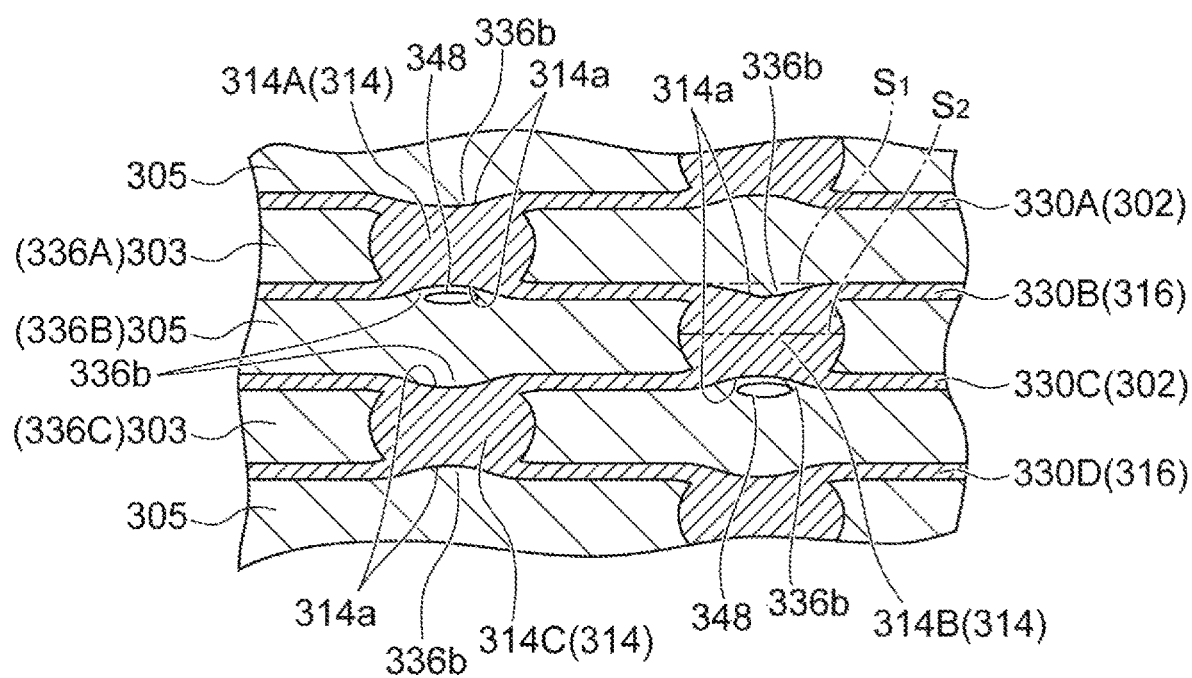
FIG. 22 is an enlarged cross-sectional view of main portions in an inactive portion of the piezoelectric element illustrated in FIG. 17.

As illustrated in FIGS. 21 and 22, in the inactive portion Sa, the electrode layers 330 (more specifically, the individual electrodes 302 and the relay electrodes 316) having the same polarity overlap via the piezoelectric layers 303 and 305. For convenience of description, the overlapping electrode layers 330 are also referred to as a first layer 330A, a second layer 330B, a third layer 330C, and a fourth layer 330D in this order from the upper side. Further, the piezoelectric layer 303 interposed between the first layer 330A and the second layer 330B is particularly referred to as a first piezoelectric layer 336A, the piezoelectric layer 305 interposed between the second layer 330B and the third layer 330C is particularly referred to as a second piezoelectric layer 336B, and the piezoelectric layer 303 interposed between the third layer 330C and the fourth layer 330D is particularly referred to as a third piezoelectric layer 336C.

The first layer 330A, the second layer 330B, the third layer 330C, and the fourth layer 330D that are adjacent are connected by the through hole conductor 314 penetrating the piezoelectric layers 303 and 305. However, vertically adjacent through hole conductors 314 do not overlap when viewed in the thickness direction (the laminating direction of the laminated body 301) and are adjacent. Specifically, the first through hole conductor 314A of the first piezoelectric layer 336A and the second through hole conductor 314B of the second piezoelectric layer 336B do not overlap when viewed in the thickness direction and are arranged to be misaligned in the horizontal direction (that is, the extension direction of the individual electrode 302) in FIG. 21. Further, the second through hole conductor 314B and the third through hole conductor 314C of the third piezoelectric layer 336C do not overlap when viewed in the thickness direction and are arranged to be misaligned in a horizontal direction in FIG. 21. The third through hole conductor 314C of the third piezoelectric layer 336C overlaps the first through hole conductor 314A of the first piezoelectric layer 336A when viewed in the thickness direction. The amount of misalignment of the through hole conductors 114 is, for example, equal to or larger than a maximum radius of the through hole conductor 314, or equal to or larger than a maximum diameter of the through hole conductor 314.

A procedure of fabricating the piezoelectric element 300 is the same as the procedure of fabricating the piezoelectric element 210 described above. That is, green sheets coated with a predetermined pattern of electrode paste overlap, and press processing such as warm isostatic pressing is performed to obtain a laminated green sheet. In this case, a portion to be the electrode layer near the through hole is bent at a high temperature and isostatic pressure. The obtained green laminated body is sintered and a predetermined polarization process is performed to complete the piezoelectric element 300.

In the piezoelectric element 300 obtained by the above-described procedure, the recesses 314a are formed in both end portions of the through hole conductor 314 in the laminating direction of the laminated body 301, as illustrated in FIG. 22. For example, the first through hole conductor 314A penetrating the first piezoelectric layer 336A includes the recess 314a recessed toward the first through hole conductor 314A (downward in FIG. 22) on the upper surface, and includes the recess 314a recessed toward the first through hole conductor 314A (upward in FIG. 22) on the lower surface (an end surface on the second piezoelectric layer 336B side). Similarly, the second through hole conductor 314B and the third through hole conductor 314C include recesses 314a on upper and lower surfaces thereof.

The through hole conductor 314 is partially thinned (that is, a length in a laminating direction is made shorter) due to the recess 314a. As illustrated in FIG. 22, thicknesses at portions of the recesses 314a of the respective through hole conductors 314A, 314B, and 314C are smaller than the thicknesses of the piezoelectric layers 336A, 336B, and 336C.

Further, the protrusions 336b of the piezoelectric layer 366A, 366B, and 366C enter the recesses 314a formed in the respective through hole conductors 314. For example, the upward protrusion 336b of the second piezoelectric layer 336B enters the recess 314a of the lower surface of the first through hole conductor 314A. Further, the downward protrusion 336b of the first piezoelectric layer 336A enters the recess 314a of the upper surface of the second through hole conductor 314B.

A shape of such a through hole conductor 314, a shape of the electrode layer 430, and shapes of the piezoelectric layers 303 and 305 are considered to be obtained by bending the electrode layer near the through hole at a high temperature and isostatic pressure at the time of fabrication of the piezoelectric element 300.

The piezoelectric element 300 according to the fourth embodiment includes a laminated body 301 having the inactive portion Sa as a laminated portion including a pair of electrode layers 330 (for example, the first layer 330A and the second layer 330B in FIG. 22), the piezoelectric layer 303 interposed between the pair of electrode layers 330, and the through hole conductor 314 (for example, the first through hole conductor 314A in FIG. 22) penetrating the piezoelectric layer 303. The inactive portion Sa includes a void 348 adjacent to the through hole conductor 314.

In the piezoelectric element 300, the void 348 adjacent to the through hole conductors 314 alleviates stress or strain around the through hole conductors 314 in the inactive portion Sa, similar to the piezoelectric element 210 according to the third embodiment described above. Accordingly, conduction failure or disconnection of the electrode layer 330 or the through hole conductor 314 in the inactive portion Sa is prevented. Particularly, in the above-described embodiment, there are a plurality of voids 348 in the inactive portion Sa, and the void 248 is adjacent to each of a plurality of through hole conductors 314. Therefore, stress or strain is absorbed in each of the plurality of through hole conductors 314, and conduction failure or disconnection in the inactive portion Sa is further prevented.

A position of the void 348 may be a vertically-aligned position or a horizontally-aligned position with respect to the through hole conductor 314, similar to the position of the void 248 of the third embodiment described above. A position or dimension of each of the plurality of voids 348 can be nonuniform or irregular, similar to the position or dimension of the void 248 of the third embodiment described above. However, since the above-described void 348 located to enter the recess 314a of the through hole conductor 314 can effectively alleviate stress or strain, at least some of the plurality of voids 348 can be present in the above positions.

Further, the piezoelectric element 300 includes the active portion Sb that is deformed due to an electric field generated in the piezoelectric layers 303 and 305 when a voltage is applied, and the inactive portion Sa in which an electric field is not generated in the piezoelectric layers 303 and 305 when a voltage is applied, and in the piezoelectric element 300, the above-described laminated portion is located in the inactive portion Sa. As described above, since the active portion Sb is deformed at the time of polarization or at the time of driving and internal stress or strain is generated, the laminated portion including the through hole conductor 314 is located in the inactive portion Sa in order to avoid an influence of the stress or the strain caused by the deformation as much as possible.

In the piezoelectric element 300, internal stress generated in the inactive portion Sa at the time of sintering (that is, residual stress due to contraction at the time of sintering) when the piezoelectric element 300 is fabricated or stress applied from the outside to the inactive portion Sa is absorbed by the recess 314a of the lower surface of the first through hole conductor 314A and the recess 314a of the upper surface of the second through hole conductor 340B. Thus, for example, deformation, rupture, or the like of the through hole conductor 314 is prevented, and conduction failure or disconnection of the electrode layer 330 or the through hole conductor 314 in the inactive portion Sa is prevented.

Further, in the inactive portion Sa, since the protrusion 336b of the piezoelectric layers 336A, 336B, and 336C enters the recess 314a of the through hole conductor 314, a holding force of the piezoelectric layers 303 and 305 with respect to the through hole conductor 314 increases. Therefore, in the configuration in which the protrusion 336b of the piezoelectric layers 336A, 336B, and 336C enters the recess 314a of the through hole conductor 314, deformation of the through hole conductor 314 is prevented or obstructed, unlike in a configuration in which the end surfaces of the through hole conductor 56 are flat and the piezoelectric layer 54 does not enter (see FIG. 16). As a result, conduction failure or disconnection in the inactive portion Sa is prevented.

The present disclosure is not limited to the third embodiment and the fourth embodiment described above. For example, the number of electrode layers or piezoelectric layers of the laminated body of the piezoelectric element can be appropriately increased or decreased as long as the number is equal to or greater than a required minimum number of layers constituting the above-described laminated portion (that is, three or more electrode layers and two or more piezoelectric layers). Further, a total thickness of the laminated body, a thickness of the electrode layer, and a thickness of the piezoelectric layer can be appropriately increased or decreased. Further, the present disclosure is not limited to an aspect in which a thickness of the first through hole conductor, a thickness of the second through hole conductor, and a thickness of the third through hole conductor are all smaller than the thickness of the piezoelectric layer, and may be an aspect in which any of the thickness of the first through hole conductor, the thickness of the second through hole conductor, and the thickness of the third through hole conductor is smaller than the thickness of the piezoelectric layer.

Fifth Embodiment

Next, a configuration of the piezoelectric element 410 according to a fifth embodiment will be described with reference to FIGS. 23 and 24.

Figure 23:
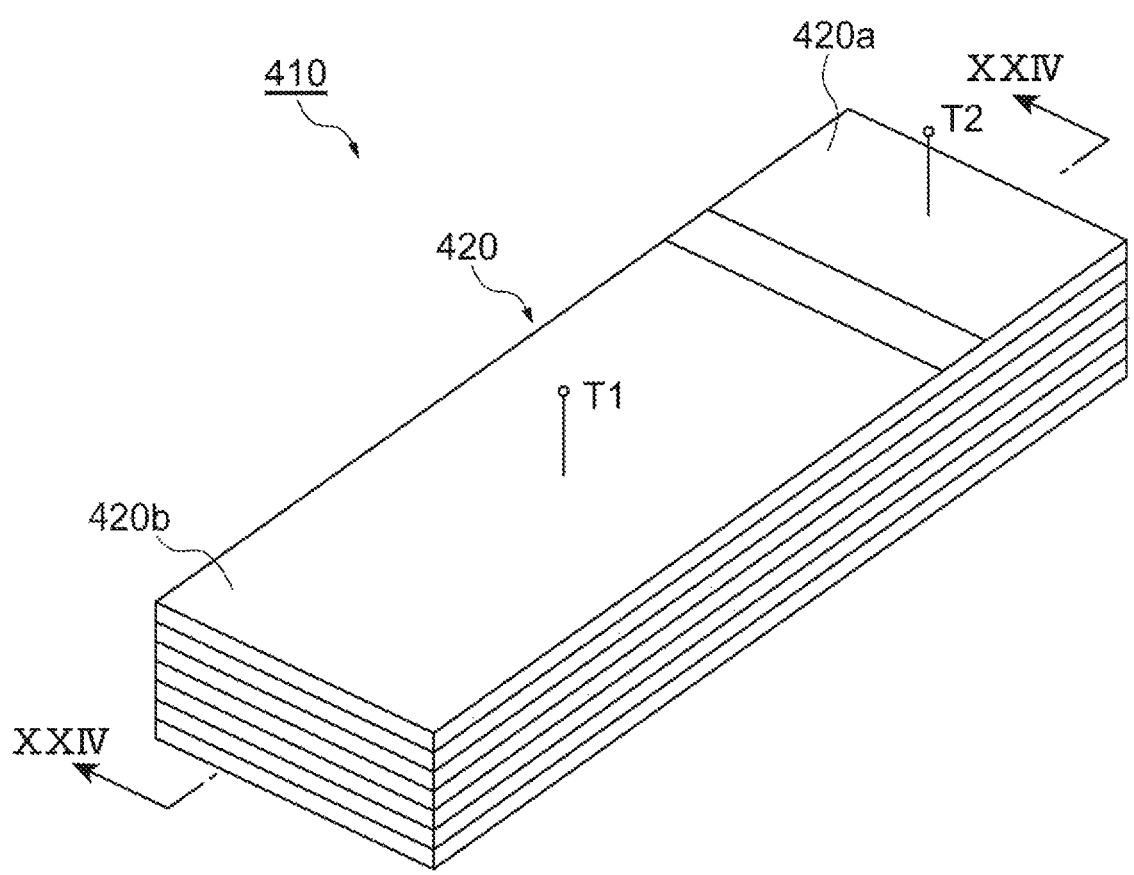
FIG. 23 is a perspective view of a piezoelectric element according to a fifth embodiment of the present disclosure.
Figure 24:
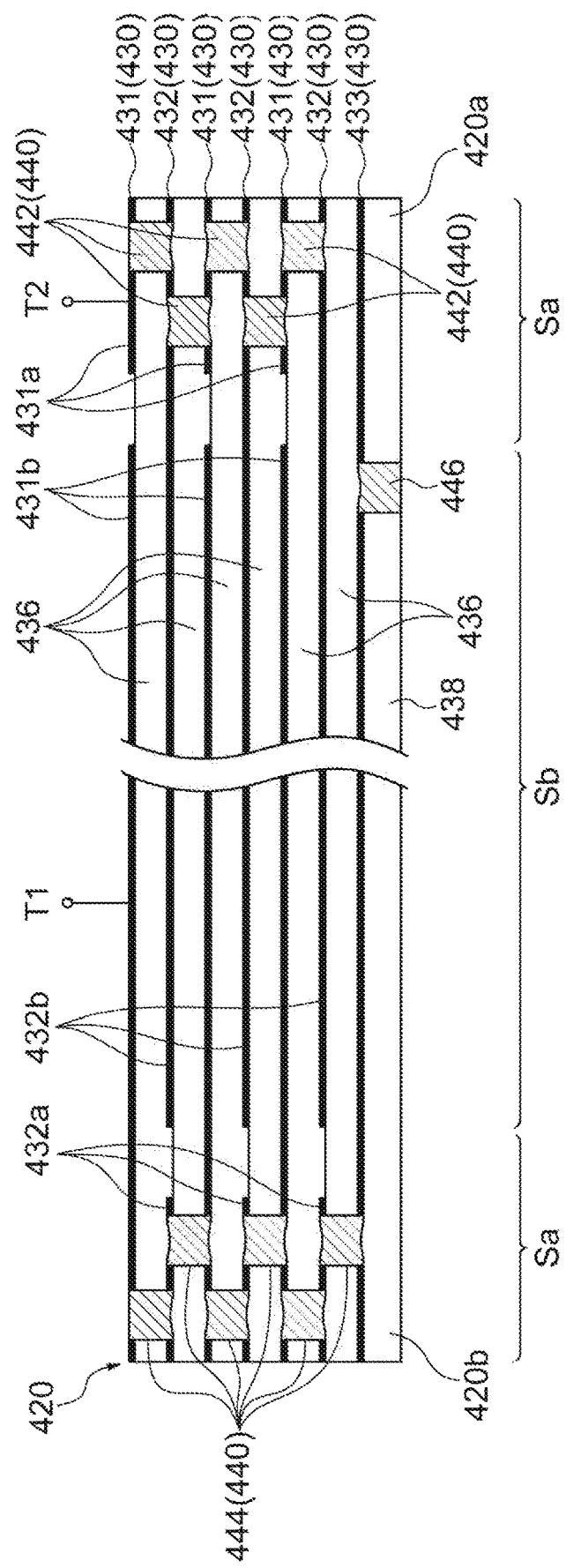
FIG. 24 is a cross-sectional view taken along line XXIV-XXIV of the piezoelectric element illustrated in FIG. 23.

As illustrated in FIG. 23, the piezoelectric element 410 includes a laminated body 420 having an outer shape of a rectangular parallelepiped which extends in one direction. For example, dimensions of the laminated body 420 are 2.0 mm in a longitudinal direction length, 0.5 mm in a lateral direction length, and 0.15 mm in a thickness. As illustrated in FIG. 24, the laminated body 420 includes a plurality of electrode layers 430, and a plurality of piezoelectric layers 436 and 438, and is configured such that the electrode layers 430 and the piezoelectric layers 436 and 438 are alternately laminated. In this embodiment, the laminated body 420 includes three or more electrode layers 430 and two or more piezoelectric layers 436 and 438. In FIGS. 23 and 24, the laminated body 420 includes seven electrode layers 430 and seven piezoelectric layers 436 and 438.

The plurality of electrode layers 430 are formed of Pt, and may be formed of a conductive material (Ag—Pd alloy, Au—Pd alloy, Cu, Ag, Ni, or the like) other than Pt. The plurality of electrode layers 430 are patterned by screen printing or the like. The plurality of electrode layers 430 include a first electrode layer 431, a second electrode layer 432, and a third electrode layer 433 which are different in electrode pattern. In the plurality of electrode layers 430, the first electrode layer 431 and the second electrode layer 432 are alternately arranged in this order from the top, as illustrated in FIG. 24, and the lowermost layer is the third electrode layer 433.

An electrode pattern of the first electrode layer 431 includes a short pattern 431a formed near one end portion 420a of the laminated body 420, and a long pattern 431b extending from the short pattern 431a to the other end portion 420b of the laminated body 420 via a predetermined gap. An electrode pattern of the second electrode layer 432 is a pattern symmetrical to the first electrode layer 431 and includes a short pattern 432a formed near the other end portion 420b of the laminated body 420, and a long pattern 432b extending from the short pattern 432a to the one end portion 420a of the laminated body 420 via a predetermined gap. The third electrode layer 433 is a pattern (so-called solid pattern) formed over an entire region.

All of the plurality of piezoelectric layers 436 and 438 have a rectangular flat plate shape and have, for example, a longitudinal direction length of 2.0 mm, a lateral direction length of 0.5 mm, and a thickness of 20 μm. Each of the piezoelectric layers 436 and 438 is formed of, for example, a piezoelectric ceramic material containing lead zirconate titanate as a main component, and contains additives such as Zn or Nb. The plurality of piezoelectric layers 436 and 438 include the piezoelectric layer 436 on and underneath which the electrode layers 430 are located, and the lowermost piezoelectric layer 438 only on which the electrode layer 430 is located.

In the piezoelectric layer 436, a through hole 436a penetrates therethrough at a predetermined position, and a through hole conductor 440 connecting the electrode layers 430 located on and beneath the piezoelectric layer 436 is formed in a region in which each through hole 436a is formed. That is, the through hole conductor 440 is formed by filling the through hole 436a provided in the piezoelectric layer 436 with an electrode material.

The through hole conductor 440 as the through hole conductor 442 connects the short pattern 431a of the first electrode layer 431 and the long pattern 432b of the second electrode layer 432 in the one end portion 420a of the laminated body 420. Therefore, both of the short pattern 431a of the first electrode layer 431 and the long pattern 432b of the second electrode layer 432 are electrically connected to an external connection terminal T2 connected to the short pattern 431a of the first electrode layer 431 of a surface of the laminated body 420, and have the same polarity.

Further, the through hole conductor 440 as the through hole conductor 444 connects the short pattern 432a of the second electrode layer 432 and the long pattern 431b of the first electrode layer 431 in the other end portion 420b of the laminated body 420. Further, the through hole conductor 440 as the through hole conductor 444 connects the short pattern 432a of the second electrode layer 432 and the third electrode layer 433 in the other end portion 420b of the laminated body 420. Therefore, the short pattern 432a of the second electrode layer 432, the long pattern 431b of the first electrode layer 431, and the third electrode layer 433 are all electrically connected to an external connection terminal T1 connected to the long pattern 431b of the first electrode layer 431 of the surface of the laminated body 420, and have the same polarity.

In the piezoelectric element 410, a pair of external connection terminals T1 and T2 are provided on the surface of the laminated body 420, and since the terminals for two polarities are exposed on one side, conduction can be taken from the one side.

When a voltage is applied between the pair of external connection terminals T1 and T2, an electrode group (that is, the short pattern 431a of the first electrode layer 431 and the long pattern 432b of the second electrode layer 432) connected on the one end portion 420a side of the laminated body 420 and an electrode group (that is, the long pattern 431b of the first electrode layer 431, the short pattern 432a of the second electrode layer 432, and the third electrode layer 433) connected on the other end portion 420b side have different polarities. In this case, an electric field is generated between the long pattern 431b of the first electrode layer 431 and the long pattern 432b of the second electrode layer 432 overlapping in a portion sandwiched between both of the end portions 420a and 420b of the laminated body 420, such as near a center, and a portion of the piezoelectric layer 436 located therebetween is deformed (extends or contracts) according to the polarization direction. Therefore, the portion sandwiched between both of the end portions 420a and 420b of the laminated body 420 is the active portion Sb that is deformed when a voltage is applied between the pair of external connection terminals T1 and T2.

Since the vicinity of the one end portion 420a of the laminated body 420 is a laminated portion in which the electrode layer portions 431a and 432b having the same polarity overlap, deformation hardly occurs even when a voltage is applied between the pair of external connection terminals T1 and T2. Therefore, the vicinity of the one end portion 420a of the laminated body 420 is an inactive portion Sa which is not deformed even when a voltage is applied. The inactive portion Sa is suitable for installation of the above-described through hole conductor 440 because no large displacement occurs. Since the vicinity of the other end portion 420b of the laminated body 420 is a laminated portion in which the electrode layer portions 431b and 432a having the same polarity overlap, the vicinity of the other end portion 420b of the laminated body 420 is an inactive portion Sa which is not deformed even when a voltage is applied, similar to the vicinity of the one end portion 420a.

Thus, in the piezoelectric element 410, the inactive portions Sa and the active portion Sb are arranged side by side in the longitudinal direction of the laminated body 420.

Since the third electrode layer 433 is located only on the piezoelectric layer 438, deformation hardly occurs even when a voltage is applied between the pair of external connection terminals T1 and T2, similar to both the end portions 420a and 420b of the laminated body 420. A through hole conductor 446 is penetrating through the piezoelectric layer 438. The through hole conductor 446 can be formed by filling the through hole provided in the piezoelectric layer 438 with an electrode material. The through hole conductor 446 is a dummy through hole conductor which is not intended to allow conduction to the electrode layer 430, and can be used for identifying, for example, a front and a back or a polarity of a component.

In the laminated body 420, the through hole conductors 442, 444, and 446 are provided only in a portion in which deformation does not substantially occur even when a voltage is applied between the pair of external connection terminals T1 and T2 (that is, both the end portions 420a and 420b and the piezoelectric layer 438 as the lowermost layer).

Figure 25:
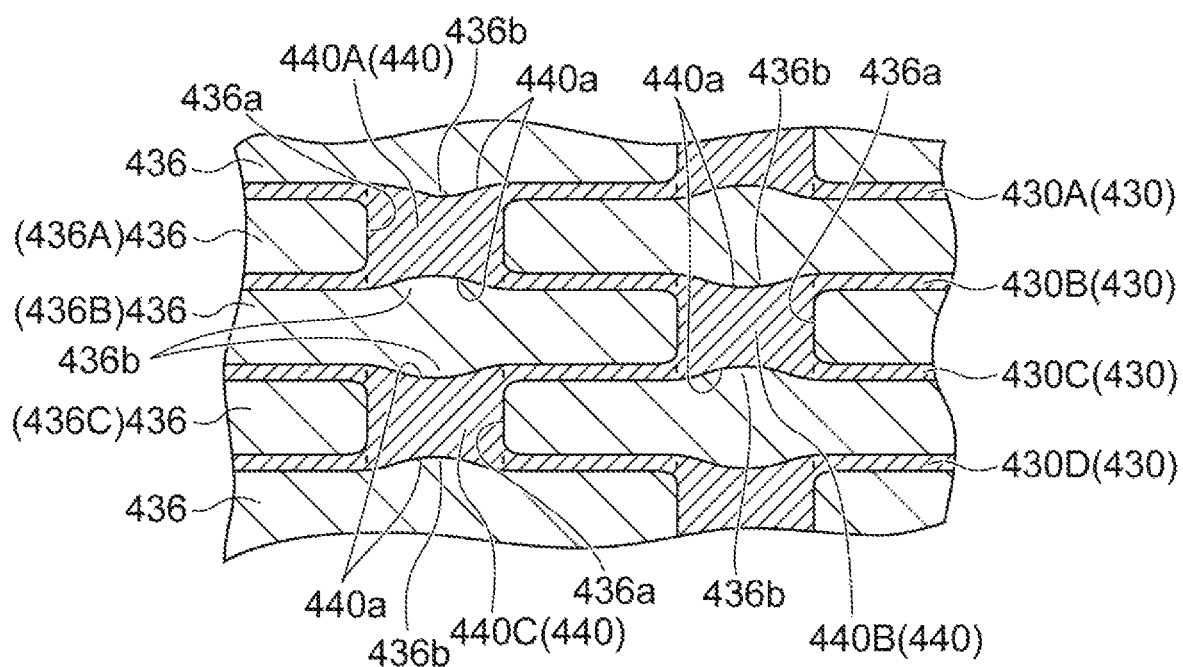
FIG. 25 is an enlarged view of main portions in an inactive portion of the piezoelectric element illustrated in FIG. 23.

Next, a configuration of the electrode layer 430 and the piezoelectric layer 436 in the inactive portion Sa will be described with reference to FIG. 25. FIG. 25 illustrates a cross section of the inactive portion Sa on the side of the other end portion 420b of the laminated body 420.

As illustrated in FIG. 25, in the inactive portion Sa, the electrode layers 430 (more specifically, the electrode layers 431b and 432a) having the same polarity overlap via the piezoelectric layers 436. For convenience of description, the overlapping electrode layers 430 are also referred to as a first layer 430A, a second layer 430B, a third layer 430C, and a fourth layer 430D in this order from the upper side. Further, the piezoelectric layer 436 interposed between the first layer 430A and the second layer 430B is particularly referred to as a first piezoelectric layer 436A, the piezoelectric layer 436 interposed between the second layer 430B and the third layer 430C is particularly referred to as a second piezoelectric layer 436B, and the piezoelectric layer 436 interposed between the third layer 430C and the fourth layer 430D is particularly referred to as a third piezoelectric layer 436C.

The first layer 430A, the second layer 430B, the third layer 430C, and the fourth layer 430D that are adjacent are connected by the through hole conductors 440 penetrating the piezoelectric layers 436. For example, the first through hole conductor 440A penetrating the first piezoelectric layer 436A connects the first layer 430A and the second layer 430B located on and beneath the first through hole conductor 440A. The second through hole conductor 440B penetrating the second piezoelectric layer 436B connects the second layer 430B and the third layer 430C located on and beneath the second through hole conductor 440B. The third through hole conductor 440C penetrating the third piezoelectric layer 436C connects the third layer 430C and the fourth layer 430D located on and beneath the third through hole conductor 440C.

However, vertically adjacent through hole conductors 440 do not overlap when viewed in the thickness direction (the laminating direction of the laminated body 420) and are adjacent. Specifically, the first through hole conductor 440A for connection with the first piezoelectric layer 436A and the second through hole conductor 440B of the second piezoelectric layer 436B do not overlap when viewed in the thickness direction and are arranged to be misaligned in the longitudinal direction (that is, the horizontal direction in FIG. 25) of the laminated body 420. Further, the second through hole conductor 440B of the second piezoelectric layer 436B and the third through hole conductor 440C of the third piezoelectric layer 436C do not overlap when viewed in the thickness direction and are arranged to be misaligned in a horizontal direction in FIG. 25. The third through hole conductor 440C of the third piezoelectric layer 436C overlaps the first through hole conductor 440A of the first piezoelectric layer 436A when viewed in the thickness direction. The amount of misalignment of the through hole conductors 440 is, for example, equal to or larger than a maximum radius of the through hole conductor 440, or equal to or larger than a maximum diameter of the through hole conductor 440.

Next, a procedure for fabricating the above-described piezoelectric element 410 will be described.

First, a binder, an organic solvent, or the like is applied to piezoelectric ceramic powder that is used for formation of the piezoelectric layer 436, resulting in a paste. With the obtained paste, a plurality of green sheets having a predetermined size are fabricated, for example, using a doctor blade method. In this case, a plasticizer to binder ratio is adjusted so that sufficient deformation is obtained.

In each green sheet, a through hole is formed in a portion in which the through hole conductor 440 is formed, using a YAG laser.

An electrode paste serving as the electrode layer 430 (for example, a Pd—Ag alloy (Pd:Ag=3:7)) is coated on each green sheet using a screen printing method and formed so that the electrode paste becomes the above-described pattern. When the electrode paste is applied, the through hole formed in the green sheet is filled with the electrode paste, but a rate of filling of the through hole with the electrode paste is adjusted according to a contraction rate at the time of drying of the electrode paste.

Subsequently, a plurality of green sheets on which the electrode paste has been printed are overlapped, and press processing such as warm isostatic pressing (WIP) is performed to obtain a green laminated body. In the warm isostatic pressing, pressing is performed, for example, at about 50 MPa at a temperature of about 80° C. In this case, a portion that becomes the electrode layer near the through hole portion is bent at a high temperature and under an isostatic pressure.

The obtained green laminated body is sintered. Specifically, the green laminated body is placed on a setter including stabilized zirconia, a binder removal process is performed, and the setter having the green laminated body placed thereon is put into a stabilized zirconia sagger and sintered at about 1100° C.

After sintering, a predetermined polarization process is performed to complete the piezoelectric element 410. In the polarization process, for example, a voltage with an electric field intensity of 2 kV/mm is applied for 3 minutes at a temperature of 100° C.

In the piezoelectric element 10 obtained by the above-described procedure, the recesses 440a are formed in both end portions of the through hole conductor 440 in the laminating direction of the laminated body 420, as illustrated in FIG. 25. For example, the first through hole conductor 440A penetrating the first piezoelectric layer 436A includes the recess 440a recessed toward the first through hole conductor 440A (downward in FIG. 25) on the upper surface, and includes the recess 440a recessed toward the first through hole conductor 440A (upward in FIG. 25) on the lower surface (an end surface on the second piezoelectric layer 436B side). Similarly, the second through hole conductor 440B and the third through hole conductor 440C include recesses 440a on upper and lower surfaces thereof.

The through hole conductor 440 is partially thinned (that is, a length in a laminating direction is made shorter) due to the recess 440a. As illustrated in FIG. 25, thicknesses at portions of the recesses 440a of the respective through hole conductors 440A, 440B, and 440C are smaller than the thickness of the piezoelectric layer 336.

Further, a protrusion 436b of the piezoelectric layer 436 enters the recess 440a formed in each through hole conductor 440. For example, the upward protrusion 436b of the second piezoelectric layer 436B enters the recess 440a of the lower surface of the first through hole conductor 440A. Further, the downward protrusion 436b of the first piezoelectric layer 436A enters the recess 440a of the upper surface of the second through hole conductor 440B.

A shape of such a through hole conductor 440, a shape of the electrode layer 430, and a shape of the piezoelectric layer 436 are considered to be obtained by bending the electrode layer near the through hole at a high temperature and isostatic pressure at the time of fabrication of the piezoelectric element 410.

As described above, the piezoelectric element 410 includes a laminated body 420 having the inactive portion Sa as a laminated portion including a pair of electrode layers 430 (for example, the first layer 430A and the second layer 430B in FIG. 25), the piezoelectric layer 436 interposed between the pair of electrode layers 430, and the through hole conductor 440 (for example, the first through hole conductor 440A in FIG. 25) penetrating the piezoelectric layer 436. In the inactive portion Sa, the recess 440a is formed in each of both end portions of the through hole conductor 440 in the laminating direction of the laminated body 420.

In the piezoelectric element 410, both end portions of the through hole conductor 440 approach each other due to the recesses 440a of the through hole conductor 440, and a thickness of the through hole conductor 440 is small in a portion in which the recesses 440a of both of the end portions face each other.

Figure 26:
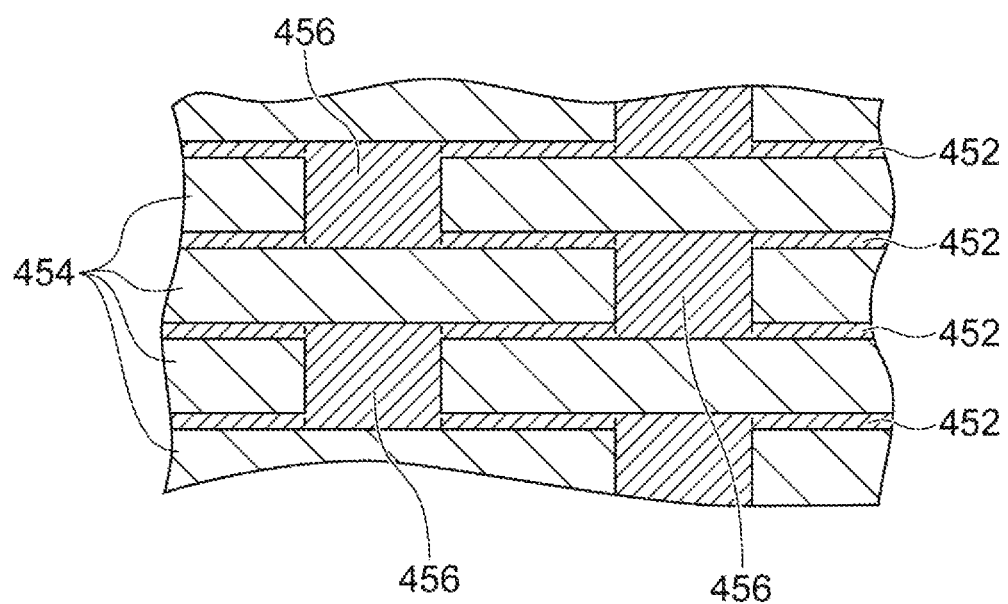
FIG. 26 illustrates an enlarged cross-sectional view of main portions of an inactive portion of the piezoelectric element according to the related art.

FIG. 26 illustrates an enlarged cross-sectional view of main portions in the inactive portion of the piezoelectric element according to the related art. In FIG. 26, reference numerals 452, 454, and 456 indicate the electrode layer, the piezoelectric layer, and the through hole conductor, respectively. In the piezoelectric element according to the related art, since a cross-sectional area of the through hole conductor 456 is usually designed to be smaller than cross-sectional areas of the other portions, it is easy for electrical resistance to increase. Therefore, a voltage equal to or higher than an expected voltage may be applied to the through hole conductors 456. In this case, conduction failure occurs in the through hole conductor 456. As illustrated in FIG. 26, in the inactive portion of the piezoelectric element according to the related art, there are no recesses in the through hole conductor 456, and the through hole conductor 456 has a uniform thickness, which is substantially the same as that of the piezoelectric layer 454.

The value of the electrical resistance is proportional to the length of the conductor. Accordingly, in the above-described embodiment, reduction of the electrical resistance is achieved due to the thin through hole conductor 440, unlike in the through hole conductor 456 according to the related art. Therefore, even when a voltage equal to or higher than an expected voltage is applied to the through hole conductor 440, it is difficult for conduction failure in the through hole conductor 440 to occur, and reliability of connection of the piezoelectric element 410 is improved.

Further, the piezoelectric element 410 includes the active portion Sb that is deformed due to an electric field generated in the piezoelectric layer 436 when a voltage is applied, and the inactive portion Sa in which an electric field is not generated in the piezoelectric layer 436 when a voltage is applied, and in the piezoelectric element 410, the above-described laminated portion is located in the inactive portion Sa. As described above, since the active portion Sb is deformed at the time of polarization or at the time of driving and internal stress or strain is generated, the laminated portion including the through hole conductor 440 is located in the inactive portion Sa in order to avoid an influence of the stress or the strain caused by the deformation as much as possible.

In the piezoelectric element 410, internal stress generated in the inactive portion Sa at the time of sintering (that is, residual stress due to contraction at the time of sintering) when the piezoelectric element 410 is fabricated or stress applied from the outside to the inactive portion Sa is absorbed by the recess 440a of the lower surface of the first through hole conductor 440A and the recess 440a of the upper surface of the second through hole conductor 440B. Thus, for example, deformation, rupture, or the like of the through hole conductor 440 is prevented, and conduction failure or disconnection of the electrode layer 430 or the through hole conductor 440 in the inactive portion Sa is prevented.

Further, in the inactive portion Sa, since the protrusion 436b of the piezoelectric layer 436 enters the recess 440a of the through hole conductor 440, a holding force of the piezoelectric layer 436 with respect to the through hole conductor 440 increases. Therefore, in the configuration in which the protrusion 436b of the piezoelectric layer 436 enters the recess 440a of the through hole conductor 440, displacement or deformation of the through hole conductor 440 is prevented or obstructed, unlike in a configuration in which the end surfaces (the upper and lower surfaces) of the through hole conductor 456 are flat and the piezoelectric layer 454 does not enter (see FIG. 26). As a result, conduction failure or disconnection in the inactive portion Sa is prevented.

In the piezoelectric element 410, since the inactive portion Sa of the one end portion 420a side of the laminated body 420 has the same configuration of the electrode layer 430, the piezoelectric layer 436, and the through hole conductor 440 as the inactive portion Sa on the other end portion 420b side described above, the same effects as described above can be obtained also in the inactive portion Sa on the one end portion 420a side.

Figure 27:
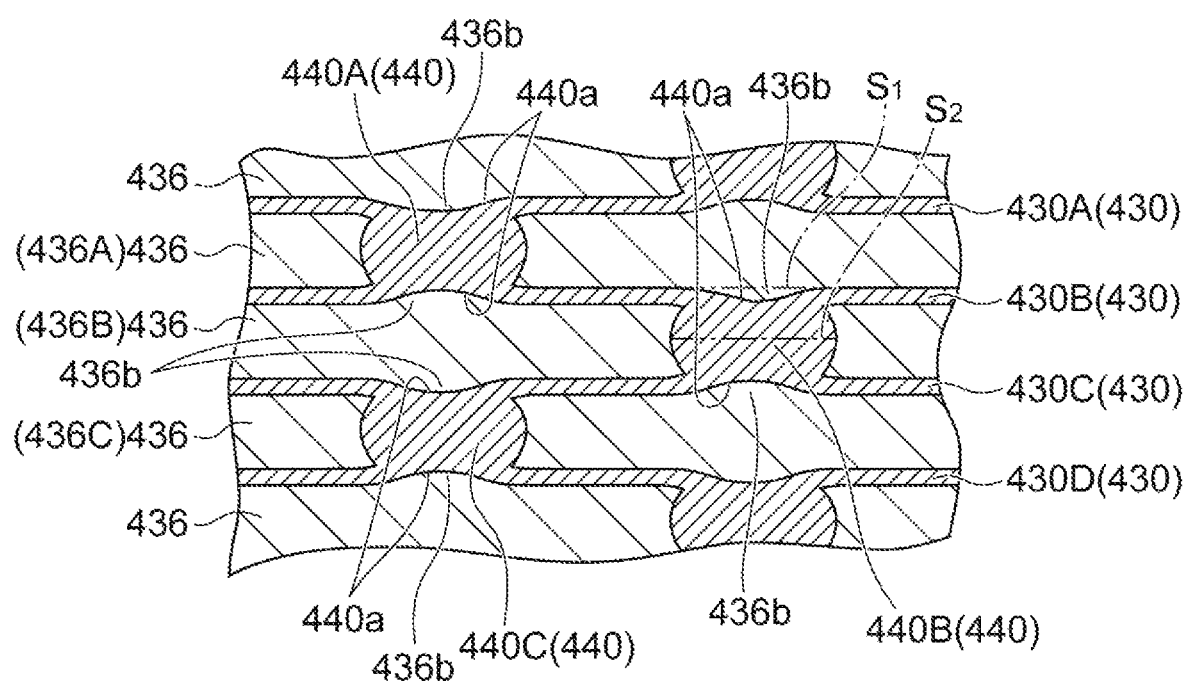
FIG. 27 is a view illustrating an aspect different from that in FIG. 25.

The shape of the through hole conductor 440 can be appropriately changed as long as the recesses 440a are formed in both end portions. For example, the through hole conductor 440 may have a shape bulging at a center position in the thickness direction, as illustrated in FIG. 27. In the through hole conductor 440 illustrated in FIG. 27, an area S1 of the end surfaces of both end portions of the through hole conductor 440 is smaller than an area S2 of the cross section at the center position in the thickness direction of the through hole conductor 440. According to the through hole conductor 440 having such dimensions and a shape, the stress or the strain that is applied to the inactive portion Sa is absorbed. Further, a rate of occurrence of a short-circuit when an overcurrent flows is lower.

Sixth Embodiment

Next, a configuration of the piezoelectric element 500 according to a sixth embodiment will be described with reference to FIGS. 28 to 31.

Figure 28:
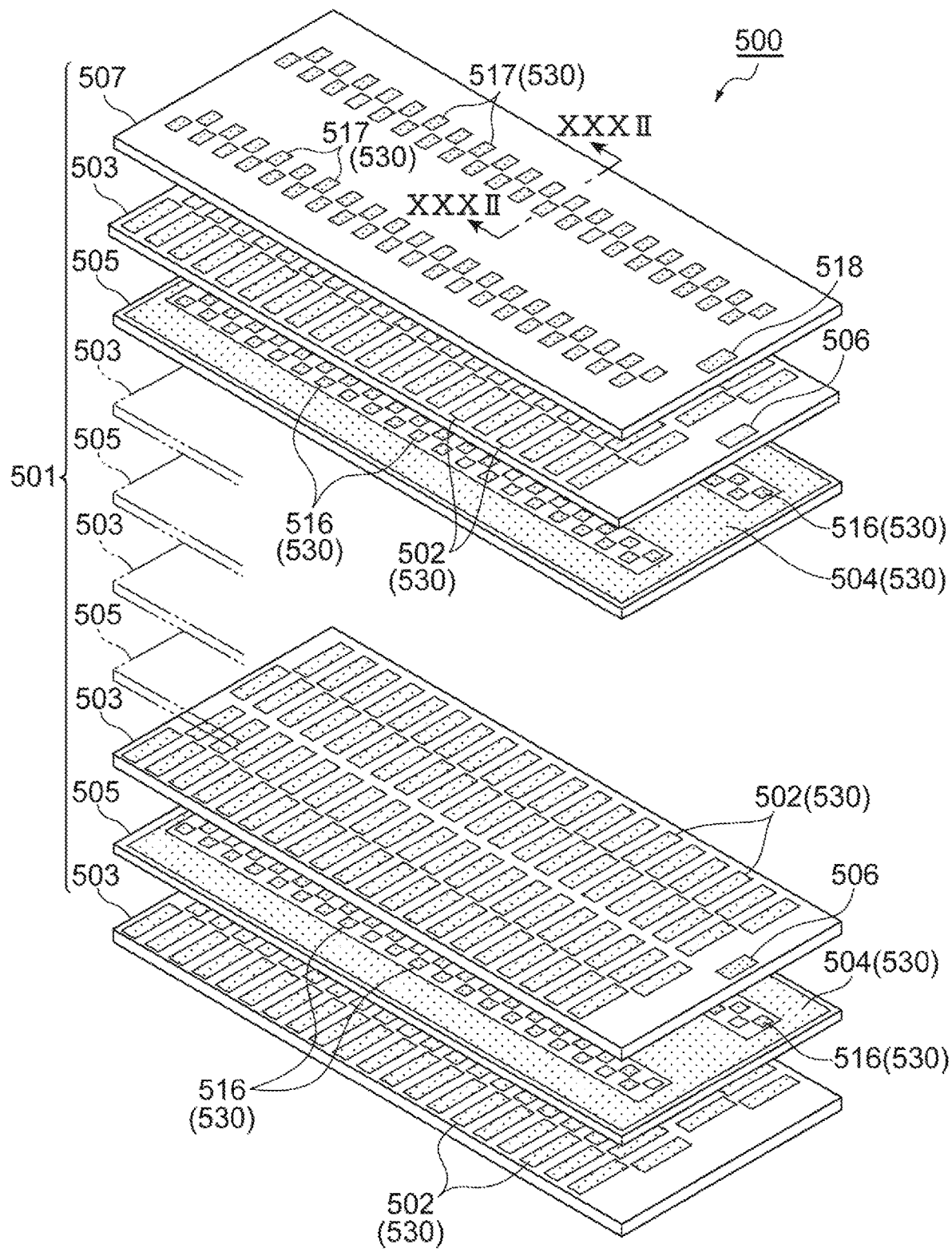
FIG. 28 is an exploded perspective view of a piezoelectric element according to a sixth embodiment of the present disclosure.
Figure 29:
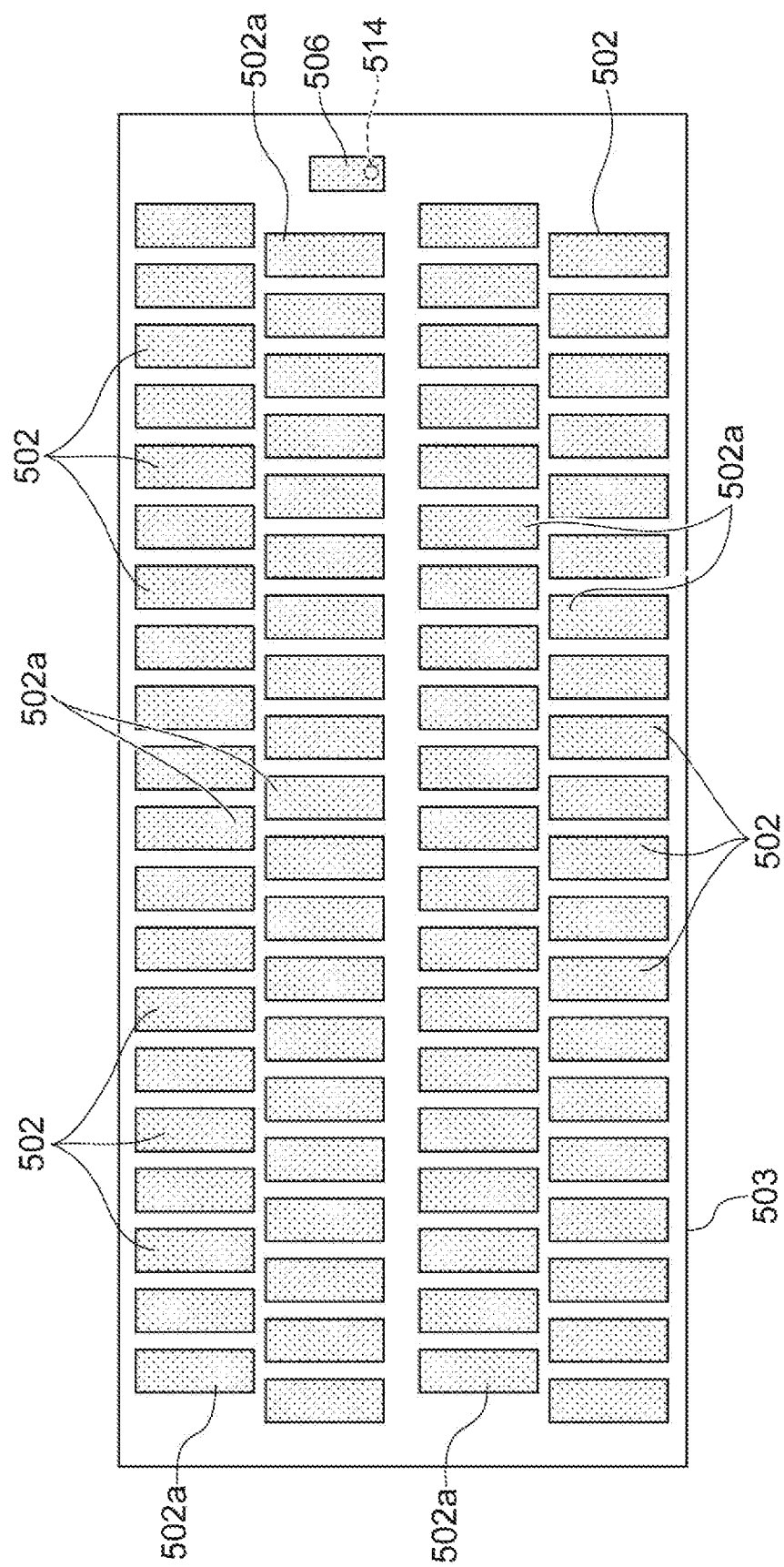
FIG. 29 is a plan view of piezoelectric layers of second, fourth, sixth, and eighth layers of the piezoelectric element illustrated in FIG. 28.

As illustrated in FIG. 28, the piezoelectric element 500 is configured such that a plurality of piezoelectric layers 503 having individual electrodes 502 formed therein and a plurality of piezoelectric layers 505 having a common electrode 504 formed therein are alternately laminated, and a piezoelectric layer 507 having terminal electrodes 517 and 518 formed thereon is laminated on an uppermost layer.

The piezoelectric element 500 includes a laminated body 501 having an outer shape of a rectangular parallelepiped which extends in one direction. The dimensions of the laminated body 501 are, for example, 30.0 mm in a longitudinal direction length, 15.0 mm in a lateral direction length, and 0.30 mm in a thickness.

All of the plurality of piezoelectric layers 503 and 507 have a rectangular flat plate shape and have, for example, a longitudinal direction length of 30.0 mm, a lateral direction length of 15.0 mm, and a thickness of 30 μm. Each piezoelectric layer 36 is formed of, for example, a piezoelectric ceramic material mainly containing lead zirconate titanate, and contains additives such as Nb and Sr.

Each of the piezoelectric layers 503, 505, and 507 is formed of a piezoelectric ceramic material mainly containing lead zirconate titanate and is formed, for example, in a rectangular thin plate shape of "15 mm×30 mm and a thickness of 30 μm". Further, the individual electrode 502, the common electrode 504, and the terminal electrodes 517 and 518 are formed of an Ag—Pd alloy (Ag 70 wt % and Pd 30 wt %), and may be formed of a conductive material (Ag—Pt alloy, Au—Pd alloy, Cu, Ni, or the like) other than an Ag—Pd alloy. The electrodes may be patterned by screen printing.

Figure 30:
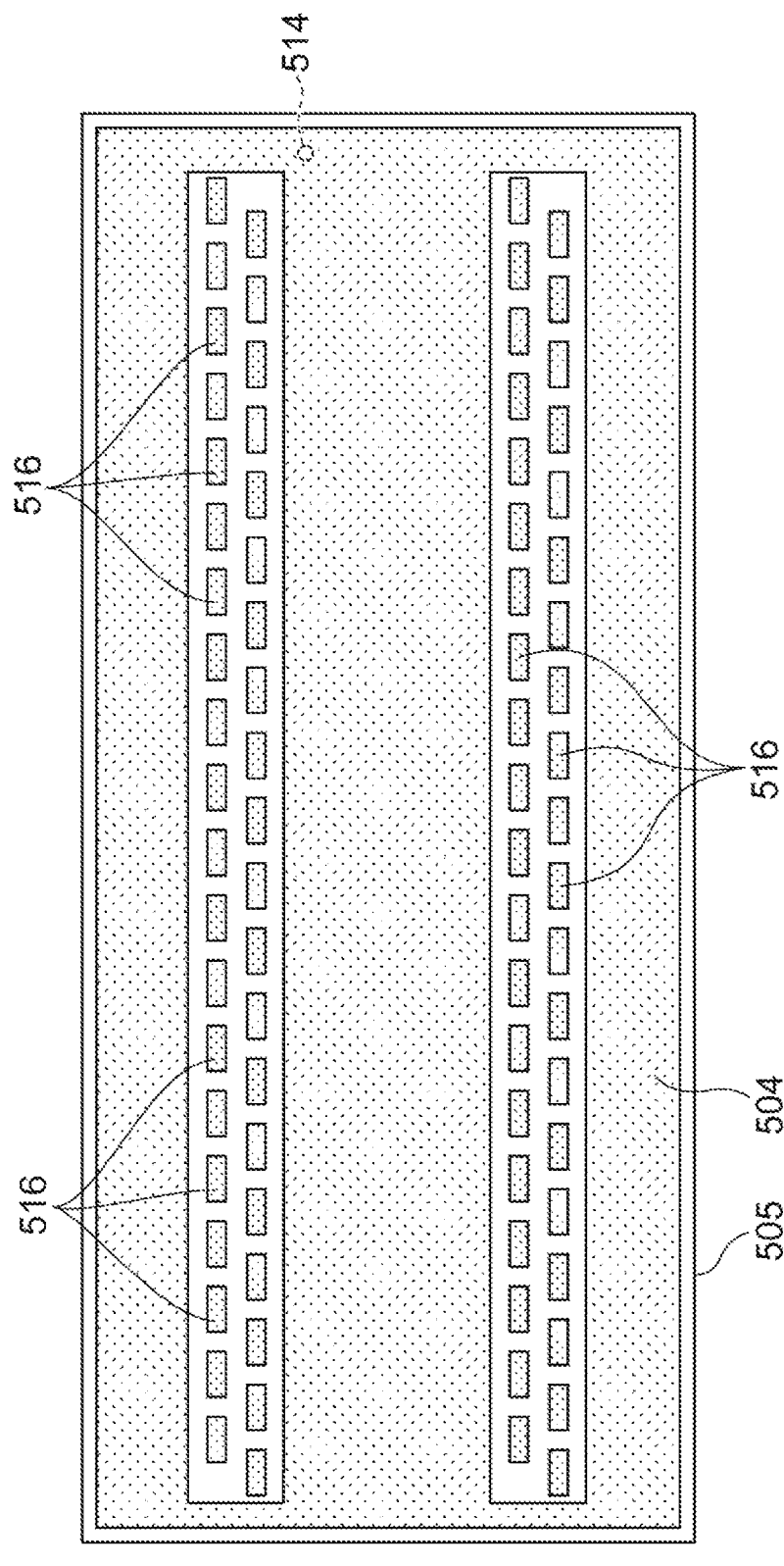
FIG. 30 is a plan view of piezoelectric layers as third, fifth, and seventh layers of the piezoelectric element illustrated in FIG. 28.

A plurality of rectangular individual electrodes 502 are arranged in a zigzag manner on the upper surfaces of the piezoelectric layers 503 as the second layer, the fourth layer, the sixth layer, and the eighth layer from the piezoelectric layer 507 that is an uppermost layer, as illustrated in FIG. 30. The longitudinal direction of each individual electrode 502 is arranged to be orthogonal to the longitudinal direction of the piezoelectric layer 503, and adjacent individual electrodes 502 and 502 are arranged at a predetermined interval such that the adjacent individual electrodes are electrically independent from each other and are prevented from being affected by each other's vibration.

Here, when the longitudinal direction of the piezoelectric layer 3 is a column direction and a direction orthogonal to the longitudinal direction is a row direction, the individual electrodes 502 are arranged, for example, side by side in a zigzag shape in four rows. By arranging the plurality of individual electrodes 502 in a zigzag shape, it becomes possible to efficiently arrange the individual electrodes on the piezoelectric layers 503. Thus, it is possible to achieve a small size of the piezoelectric element 500 and high integration of the individual electrodes 502 while maintaining an area of the active portion contributing to deformation in the piezoelectric layer 503.

Figure 32:
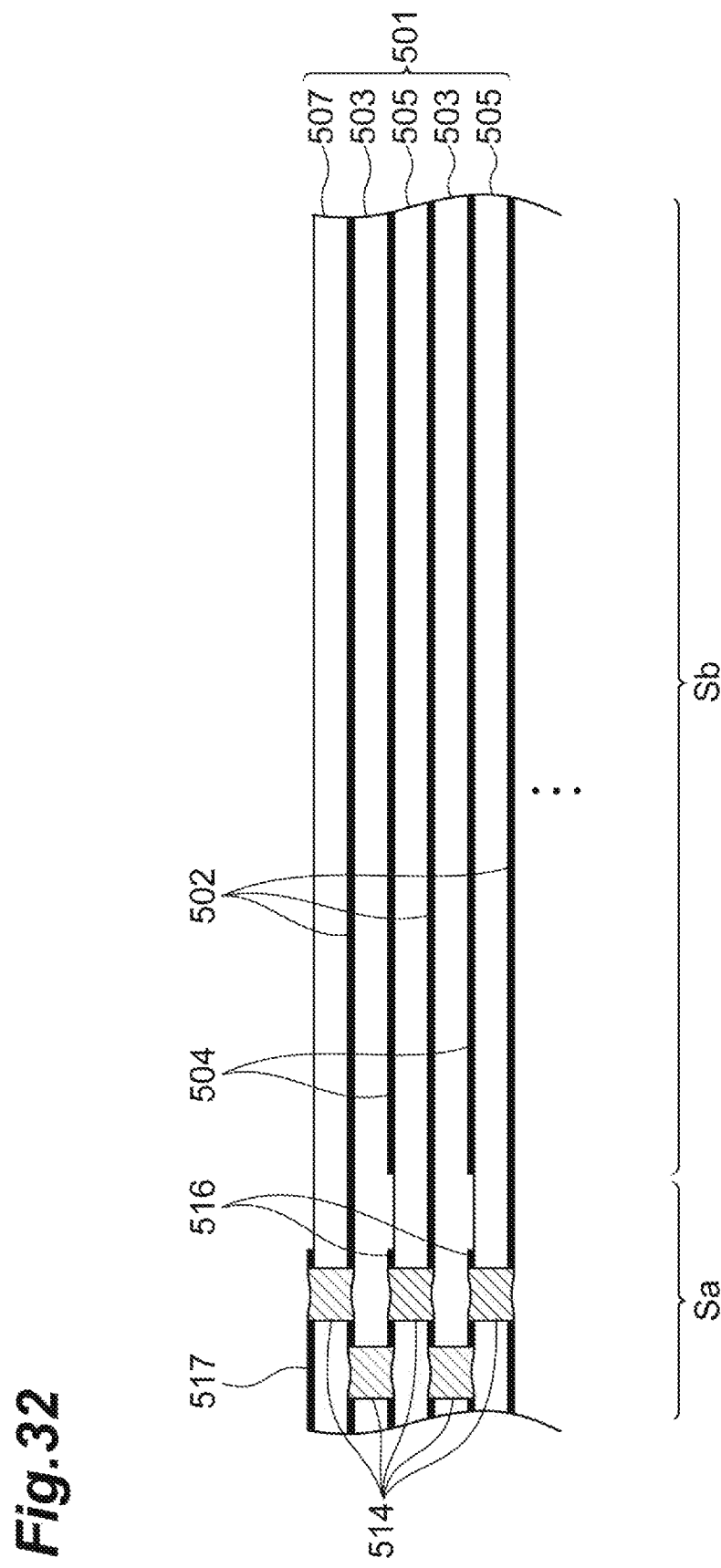
FIG. 32 is a cross-sectional view taken along the line XXXII-XXXII of the piezoelectric element illustrated in FIG. 28.

Each individual electrode 502 has an end portion facing the adjacent individual electrode as a connection end portion 502a, and is connected to the through hole conductor 514 penetrating the piezoelectric layer 503, as illustrated in FIG. 32, immediately below the connection end portion 502a.

The through hole conductor 514 is formed by filling the through hole 536a provided in the piezoelectric layer 503 with an electrode material.

Further, a relay electrode 506 for electrically connecting the common electrodes 504 of the piezoelectric layers 505 located on and beneath the piezoelectric layer 503 is formed in an edge portion of the upper surface of the piezoelectric layer 503. The relay electrode 506 is connected to the through hole conductor 514 penetrating the piezoelectric layer 503 immediately below the relay electrode 506.

The individual electrodes 502 are arranged in a zigzag manner on the upper surface of the piezoelectric layer 503 as the lowermost layer, similar to the piezoelectric layers 503 as the second layer, the fourth layer, the sixth layer, and the eighth layer described above. However, the piezoelectric layer 503 as the lowermost layer is different from the piezoelectric layers 503 of the second layer, fourth layer, the sixth layer, and the eighth layer in that the relay electrode 506 and the through hole conductors 514 are not formed.

Further, a relay electrode 516 is formed to face each connection end portion 502a of the piezoelectric layer 503 in the laminating direction of the laminated body 501 (that is, a thickness direction of the laminated piezoelectric element 500), as illustrated in FIG. 30, on the upper surfaces of the piezoelectric layers 505 of the third layer, the fifth layer, the seventh layer, and the ninth layer from the piezoelectric layer 507 as the uppermost layer. Each relay electrode 516 is connected to the through hole conductor 514 penetrating the piezoelectric layer 505, as illustrated in FIG. 32, directly below the relay electrode 516. The through hole conductor 514 is formed by filling the through hole 536a provided in the piezoelectric layer 505 with an electrode material.

Further, the common electrode 505 is formed on the upper surface of the piezoelectric layer 505. The common electrode 504 surrounds a set of relay electrodes 516 in first and second rows and a set of relay electrodes 516 in the third and fourth rows at a predetermined interval, and overlaps a portion other than the connection end portion 502a of each individual electrode 502 when viewed in the laminating direction. Thus, an entire portion facing the portion other than the connection end portions 502a of each individual electrode 502 in the piezoelectric layers 503 and 505 can be effectively used as an active portion (the active portion Sb in FIG. 32) contributing to the deformation. Further, the common electrode 504 is formed at a predetermined interval from the outer circumferential portion of the piezoelectric layer 505, and is connected to the through hole conductor 514 penetrating the piezoelectric layer 505 to face the relay electrode 506 of the piezoelectric layer 503 in the laminating direction.

The relay electrodes 516 and the common electrode 504 are formed on the upper surface of the piezoelectric layer 505 of the ninth layer, similar to the piezoelectric layers 505 of the third layer, the fifth layer, and the seventh layer described above. However, the piezoelectric layer 505 of the ninth layer is different from the piezoelectric layers 505 of the third layer, the fifth layer, and the seventh layer in that the through hole conductor 514 facing the relay electrode 506 of the piezoelectric layer 503 in the laminating direction is not formed.

Figure 31:
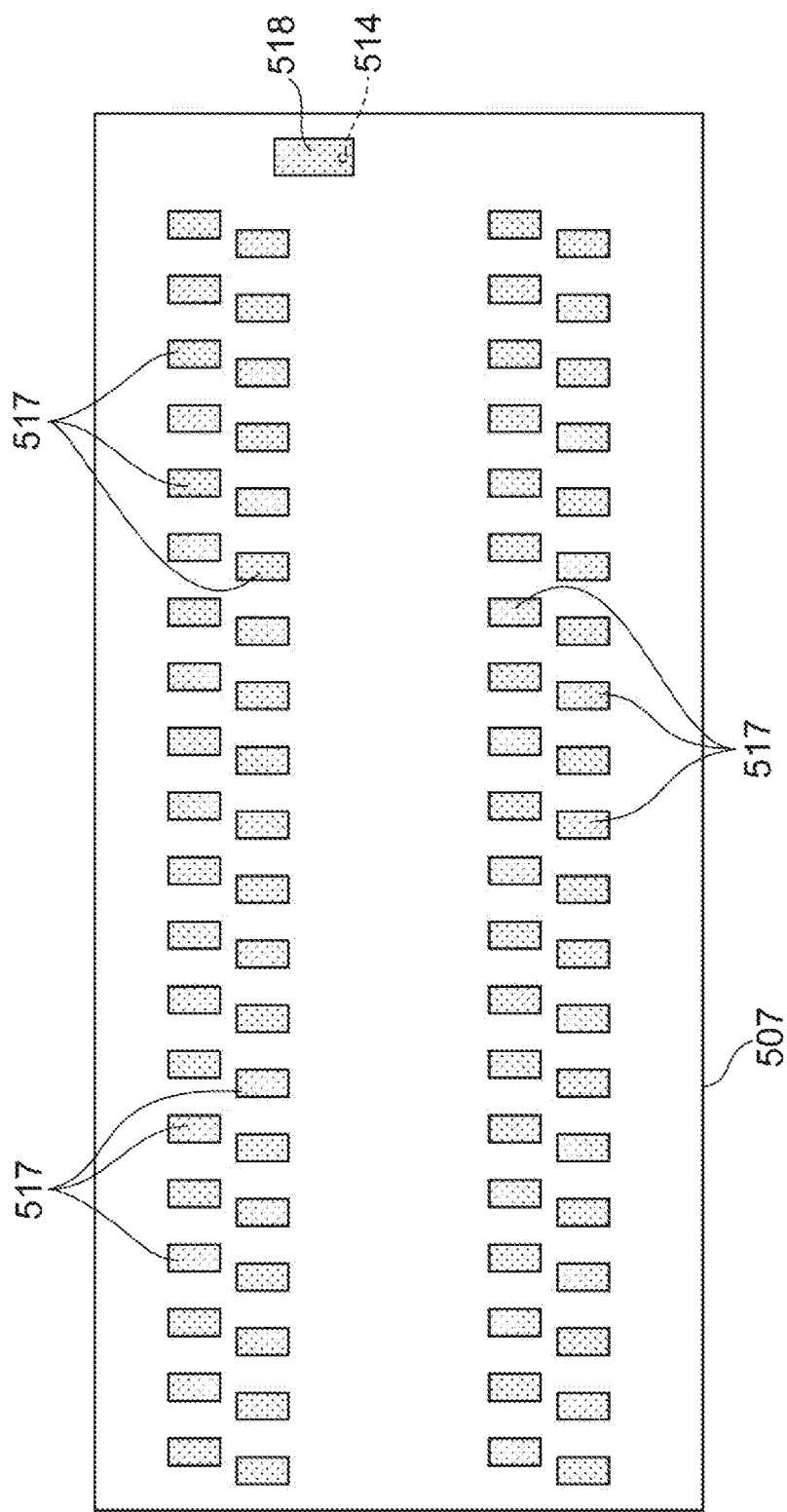
FIG. 31 is a plan view of a piezoelectric layer of an uppermost layer of the piezoelectric element illustrated in FIG. 28.

Further, the terminal electrode 517 is formed to face the connection end portion 502a of each individual electrode 502 of the piezoelectric layer 503 in the laminating direction, as illustrated in FIG. 31, on the upper surface of the piezoelectric layer 507 as the uppermost layer, and the terminal electrode 518 is formed to face the relay electrode 506 of the piezoelectric layer 503 in the laminating direction. The respective terminal electrodes 517 and 518 are connected to the through hole conductor 514 penetrating the piezoelectric layer 507 immediately below the terminal electrodes 517 and 518.

Lead wires of a flexible printed circuit board (FPC) or the like for connection to a driving power supply are soldered to the terminal electrodes 517 and 518. Therefore, in order to easily place solder when lead wires are soldered, a surface electrode layer formed of a conductive material including Ag in order to improve solder wettability in the terminal electrodes 517 and 518 is formed on an underlying electrode layer formed of a conductive material including Ag and Pd.

The thickness of the terminal electrodes 517 and 518 formed on the piezoelectric layer 507 as the uppermost layer is greater than the thickness of the other electrode layers 502, 504, and 516 and is about 1 to 2 µm. The thickness of the terminal electrodes 517 and 518 is, 5 to 50% or 10 to 30% greater than the thickness of the other electrode layer 502, 504, and 516.

A dummy electrode pattern may be arranged in a circumferential portion of the upper surface of the piezoelectric layer 507 as the uppermost layer. By arranging the dummy electrode pattern in the circumferential portion, an effect that a deviation of pressure is reduced at the time of pressing and variation in a green density after pressing can be reduced is obtained.

By laminating the piezoelectric layers 503, 505, and 507 on which the electrode pattern has been formed as described above, four common electrodes 504 are aligned with the relay electrode 506 interposed therebetween in a laminating direction with respect to the terminal electrode 518 as the uppermost layer, and the respective aligned electrode layers 504 and 506 are electrically connected by the through hole conductor 514.

Further, five individual electrodes 502 are aligned with the relay electrode 516 interposed therebetween in the laminating direction with respect to the respective terminal electrodes 517 as the uppermost layer, and the respective aligned electrode layers 502 and 516 are electrically connected by the through hole conductors 514, as illustrated in FIG. 32.

The through hole conductors 514 which are adjacent when viewed in the laminating direction of the laminated body 501 are designed so that central axes thereof do not overlap, as illustrated in FIG. 32, and are formed on the piezoelectric layers 503 and 505 to be adjacent in the extension direction of the individual electrodes 502 at a predetermined interval when viewed in the laminating direction. By arranging adjacent through hole conductors 514 as described above, electrical connection is reliably made by the through hole conductors 514.

The laminated piezoelectric element 500 has the electrical connection as described above. Accordingly, when a voltage is applied between a predetermined terminal electrode 517 and the terminal electrode 518, a voltage is applied between the individual electrodes 502 and the common electrode 504, and the active portion Sb that is a portion in which the piezoelectric layers 503 and 505 are interposed between the individual electrodes 502 and the common electrodes 504 is displaced. Thus, by selecting the terminal electrode 517 to which the voltage is applied, the active portion Sb aligned under the selected terminal electrode 517 among the active portions Sb corresponding to the respective individual electrodes 502 arranged in a matrix form can be displaced in the laminating direction. Such a laminated piezoelectric element 500 is applied to a driving source for various devices requiring small displacement, such as in valve control of a micropump.

On the other hand, since the portion in which the connection end portion 502a of the individual electrode 502 and the relay electrode 516 overlap is a laminated portion in which the electrode layers with the same polarity overlap, the portion is hardly deformed even when a voltage is applied. Therefore, as illustrated in FIG. 32, the portion in which the connection end portion 502a of the individual electrode 502 and the relay electrode 516 overlap is the inactive portion Sa which does not contribute to the deformation. Further, deformation of the piezoelectric layer 507 as the uppermost layer hardly occurs even when a voltage is applied since the individual electrode 502 is located only under the piezoelectric layer 507 as the uppermost layer. In the laminated body 501, the through hole conductor 514 is provided only in the portion in which the deformation does not substantially occur when a voltage is applied (that is, the portion in which the connection end portion 502a of the individual electrode 502 and the relay electrode 516 overlap).

Figure 33:
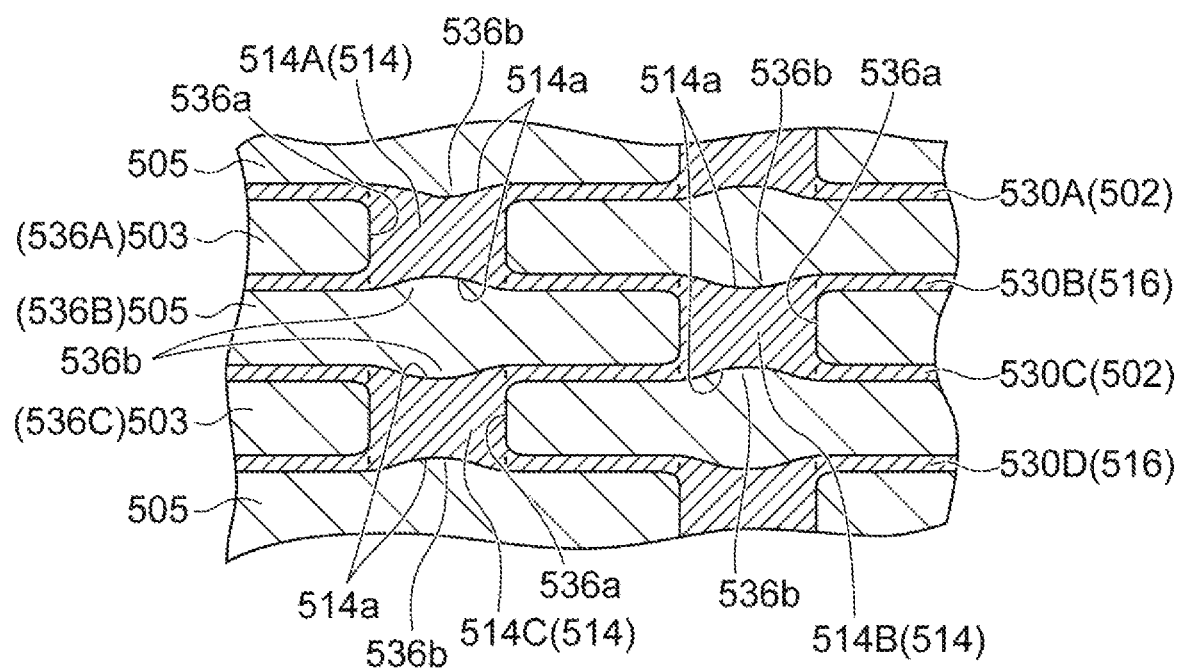
FIG. 33 is an enlarged cross-sectional view of main portions in an inactive portion of the piezoelectric element illustrated in FIG. 28.

As illustrated in FIGS. 32 and 33, in the inactive portion Sa, the electrode layers 530 (more specifically, the individual electrodes 502 and the relay electrodes 516) having the same polarity overlap via the piezoelectric layers 503 and 505. For convenience of description, the overlapping electrode layers 530 are also referred to as a first layer 530A, a second layer 530B, a third layer 530C, and a fourth layer 530D in this order from the upper side. Further, the piezoelectric layer 503 interposed between the first layer 530A and the second layer 530B is particularly referred to as a first piezoelectric layer 536A, the piezoelectric layer 505 interposed between the second layer 530B and the third layer 530C is particularly referred to as a second piezoelectric layer 536B, and the piezoelectric layer 503 interposed between the third layer 530C and the fourth layer 530D is particularly referred to as a third piezoelectric layer 536C.

The first layer 530A, the second layer 530B, the third layer 530C, and the fourth layer 530D that are adjacent are connected by the through hole conductor 514 penetrating the piezoelectric layers 503 and 505. However, vertically adjacent through hole conductors 514 do not overlap when viewed in the thickness direction (the laminating direction of the laminated body 501) and are adjacent. Specifically, the first through hole conductor 514A of the first piezoelectric layer 536A and the second through hole conductor 514B of the second piezoelectric layer 536B do not overlap when viewed in the thickness direction and are arranged to be misaligned in the horizontal direction (that is, the extension direction of the individual electrode 502) in FIG. 32. Further, the second through hole conductor 514B of the second piezoelectric layer 536B and the third through hole conductor 514C of the third piezoelectric layer 536C do not overlap when viewed in the thickness direction and are arranged to be misaligned in a horizontal direction in FIG. 32. The third through hole conductor 514C of the third piezoelectric layer 536C overlaps the first through hole conductor 514A of the first piezoelectric layer 536A when viewed in the thickness direction. The amount of misalignment of the through hole conductors 514 is, for example, equal to or larger than a maximum radius of the through hole conductor 514, or equal to or larger than a maximum diameter of the through hole conductor 514.

A procedure of fabricating the piezoelectric element 500 is the same as the procedure of fabricating the piezoelectric element 410 described above. That is, green sheets coated with a predetermined pattern of electrode paste overlap, and press processing such as warm isostatic pressing is performed to obtain a laminated green sheet. In this case, a portion to be the electrode layer near the through hole is bent at a high temperature and isostatic pressure. The obtained green laminated body is sintered and a predetermined polarization process is performed to complete the piezoelectric element 500.

In the piezoelectric element 500 obtained by the above-described procedure, the recesses 514a are formed in both end portions of the through hole conductor 514 in the laminating direction of the laminated body 501, as illustrated in FIG. 33. For example, the first through hole conductor 514A penetrating the first piezoelectric layer 536A includes the recess 514a recessed toward the first through hole conductor 514A (downward in FIG. 33) on the upper surface, and includes the recess 514a recessed toward the first through hole conductor 514A (upward in FIG. 33) on the lower surface (an end surface on the second piezoelectric layer 536B side). Similarly, the second through hole conductor 514B and the third through hole conductor 514C include recesses 514a on upper and lower surfaces thereof.

The through hole conductor 514 is partially thinned (that is, a length in a laminating direction is made shorter) due to the recess 514a. As illustrated in FIG. 33, thicknesses at portions of the recesses 514a of the respective through hole conductors 514A, 514B, and 514C are smaller than the thicknesses of the piezoelectric layers 536A, 536B, and 536C.

Further, the protrusions 536b of the piezoelectric layer 536A, 536B, and 536C enter the recess 514a formed in the respective through hole conductors 514. For example, the upward protrusion 536b of the second piezoelectric layer 536B enters the recess 514a of the lower surface of the first through hole conductor 514A. Further, the downward protrusion 536b of the first piezoelectric layer 536A enters the recess 514a of the upper surface of the second through hole conductor 514B.

A shape of such a through hole conductor 514, a shape of the electrode layer 530, and shapes of the piezoelectric layers 503 and 505 are considered to be obtained by bending the electrode layer near the through hole at a high temperature and isostatic pressure at the time of fabrication of the piezoelectric element 500.

The piezoelectric element 500 according to the sixth embodiment includes the laminated body 510 having the inactive portion Sa as a laminated portion including a pair of electrode layers 530 (for example, the first layer 530A and the second layer 530B in FIG. 33), the piezoelectric layer 503 interposed between the pair of electrode layers 530, and the through hole conductor 514 (for example, the first through hole conductor 514A in FIG. 33) penetrating the piezoelectric layer 503. In the inactive portion Sa, the recess 514a is formed in each of both end portions of the through hole conductor 514 in the laminating direction of the laminated body 501.

In the piezoelectric element 500, both end portions of the through hole conductor 514 approach each other due to the recesses 514a of the through hole conductor 514, and a thickness of the through hole conductor 514 is small in a portion in which the recesses 514a of both of the end portions face each other.

In the piezoelectric element 500 according to the sixth embodiment, reduction of the electrical resistance is achieved due to the small thickness of the through hole conductor 514 in the portion in which the recesses 514a of both end portions of the through hole conductors 40 face each other, similar to the piezoelectric element 410 according to the fifth embodiment described above, unlike in the through hole conductor 56 according to the related art (see FIG. 26). Therefore, even when a voltage equal to or higher than an expected voltage is applied to the through hole conductor 514, it is difficult for conduction failure in the through hole conductor 514 to occur, and reliability of connection of the piezoelectric element 500 is improved.

Further, the piezoelectric element 500 includes the active portion Sb that is deformed due to an electric field generated in the piezoelectric layers 503 and 505 when a voltage is applied, and the inactive portion Sa in which an electric field is not generated in the piezoelectric layers 503 and 505 when a voltage is applied, and in the piezoelectric element 500, the above-described laminated portion is located in the inactive portion Sa. As described above, since the active portion Sb is deformed at the time of polarization or at the time of driving and internal stress or strain is generated, the laminated portion including the through hole conductor 514 is located in the inactive portion Sa in order to avoid an influence of the stress or the strain caused by the deformation as much as possible.

In the piezoelectric element 500, internal stress generated in the inactive portion Sa at the time of sintering (that is, residual stress due to contraction at the time of sintering) when the piezoelectric element 500 is fabricated or stress applied from the outside to the inactive portion Sa is absorbed by the recess 514a of the lower surface of the first through hole conductor 514A and the recess 514a of the upper surface of the second through hole conductor 540B. Thus, for example, deformation, rupture, or the like of the through hole conductor 514 is prevented, and conduction failure or disconnection of the electrode layer 530 or the through hole conductor 514 in the inactive portion Sa is prevented.

Further, in the inactive portion Sa, since the protrusion 536b of the piezoelectric layers 536A, 536B, and 536C enters the recess 514a of the through hole conductor 514, a holding force of the piezoelectric layers 536A, 536B, and 536C with respect to the through hole conductor 514 increases. Therefore, in the configuration in which the protrusion 536b of the piezoelectric layers 536A, 536B, and 536C enters the recess 514a of the through hole conductor 514, deformation of the through hole conductor 514 is prevented or obstructed, unlike in a configuration in which the end surfaces of the through hole conductor 56 are flat and the piezoelectric layer 54 does not enter (see FIG. 26). As a result, conduction failure or disconnection in the inactive portion Sa is prevented.

The present disclosure is not limited to the fifth embodiment and the sixth embodiment described above. For example, the number of electrode layers or piezoelectric layers of the laminated body of the piezoelectric element can be appropriately increased or decreased as long as the number is equal to or greater than a required minimum number of layers constituting the above-described laminated portion (that is, three or more electrode layers and two or more piezoelectric layers). Further, a total thickness of the laminated body, a thickness of the electrode layer, and a thickness of the piezoelectric layer can be appropriately increased or decreased. Further, the present disclosure is not limited to an aspect in which a thickness of the first through hole conductor, a thickness of the second through hole conductor, and a thickness of the third through hole conductor are all smaller than the thickness of the piezoelectric layer, and may be an aspect in which any of the thickness of the first through hole conductor, the thickness of the second through hole conductor, and the thickness of the third through hole conductor is smaller than the thickness of the piezoelectric layer.

Seventh Embodiment

Next, a configuration of a piezoelectric element 610 according to a seventh embodiment will be described with reference to FIGS. 34 and 35.

Figure 34:
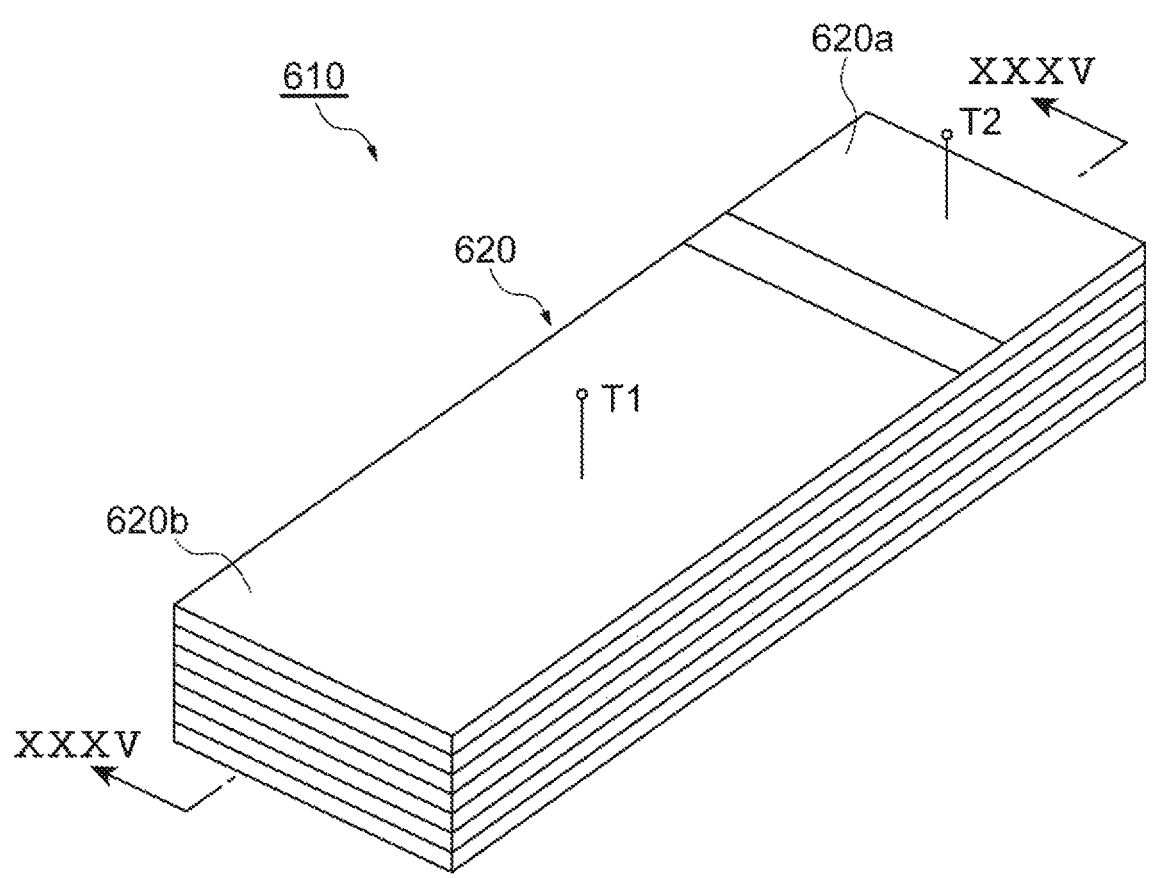
FIG. 34 is a perspective view of a piezoelectric element according to a seventh embodiment of the present disclosure.
Figure 35:
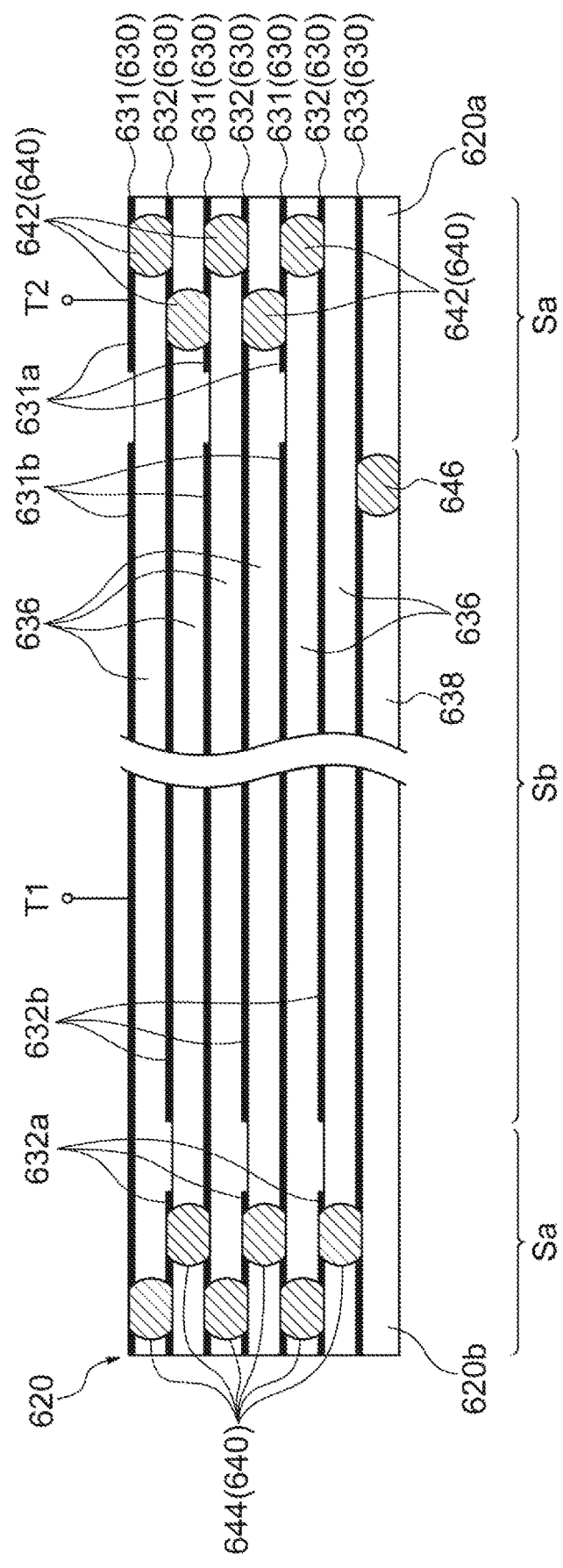
FIG. 35 is a cross-sectional view taken along line XXXV-XXXV of the piezoelectric element illustrated in FIG. 34.

As illustrated in FIG. 34, the piezoelectric element 610 includes a laminated body 620 having an outer shape of a rectangular parallelepiped which extends in one direction. For example, dimensions of the laminated body 620 are 2.0 mm in a longitudinal direction length, 0.5 mm in a lateral direction length, and 0.15 mm in a thickness. As illustrated in FIG. 35, the laminated body 620 includes a plurality of electrode layers 630, and a plurality of piezoelectric layers 636 and 638, and is configured such that the electrode layers 630 and the piezoelectric layers 636 and 638 are alternately laminated. In this embodiment, the laminated body 620 includes three or more electrode layers 630 and two or more piezoelectric layers 636 and 638. In FIGS. 34 and 35, the laminated body 620 includes seven electrode layers 630 and seven piezoelectric layers 636 and 638.

The plurality of electrode layers 630 are formed of Pt, and may be formed of a conductive material (Ag—Pd alloy, Au—Pd alloy, Cu, Ag, Ni, or the like) other than Pt. The plurality of electrode layers 630 are patterned by screen printing or the like. The plurality of electrode layers 630 include a first electrode layer 631, a second electrode layer 632, and a third electrode layer 633 which are different in electrode pattern. In the plurality of electrode layers 630, the first electrode layer 631 and the second electrode layer 632 are alternately arranged in this order from the top, as illustrated in FIG. 35, and the lowermost layer is the third electrode layer 633.

An electrode pattern of the first electrode layer 631 includes a short pattern 631a formed near one end portion 620a of the laminated body 620, and a long pattern 631b extending from the short pattern 631a to the other end portion 620b of the laminated body 620 via a predetermined gap. An electrode pattern of the second electrode layer 632 is a pattern symmetrical to the first electrode layer 631 and includes a short pattern 632a formed near the other end portion 620b of the laminated body 620, and a long pattern 632b extending from the short pattern 632a to the one end portion 620a of the laminated body 620 via a predetermined gap. The third electrode layer 633 is a pattern (so-called solid pattern) formed over an entire region.

All of the plurality of piezoelectric layers 636 and 638 have a rectangular flat plate shape and have, for example, a longitudinal direction length of 2.0 mm, a lateral direction length of 0.5 mm, and a thickness of 20 μm. Each of the piezoelectric layers 636 and 638 is formed of, for example, a piezoelectric ceramic material containing lead zirconate titanate as a main component, and contains additives such as Zn or Nb. The plurality of piezoelectric layers 636 and 638 include the piezoelectric layer 636 on and underneath which the electrode layers 630 are located, and the lowermost piezoelectric layer 638 only on which the electrode layer 630 is located.

In the piezoelectric layer 636, a through hole 636a penetrates therethrough at a predetermined position, and a through hole conductor 640 connecting the electrode layers 630 located on and beneath the piezoelectric layer 636 is formed in a region in which each through hole 636a is formed. That is, the through hole conductor 640 is formed by filling the through hole 636a provided in the piezoelectric layer 636 with an electrode material.

The through hole conductor 640 as the through hole conductor 642 connects the short pattern 631a of the first electrode layer 631 and the long pattern 632b of the second electrode layer 632 in the one end portion 620a of the laminated body 620. Therefore, both of the short pattern 631a of the first electrode layer 631 and the long pattern 632b of the second electrode layer 632 are electrically connected to an external connection terminal T2 connected to the short pattern 631a of the first electrode layer 631 of a surface of the laminated body 620, and have the same polarity.

Further, the through hole conductor 640 as the through hole conductor 644 connects the short pattern 632a of the second electrode layer 632 and the long pattern 631b of the first electrode layer 631 in the other end portion 620b of the laminated body 620. Further, the through hole conductor 640 as the through hole conductor 644 connects the short pattern 632a of the second electrode layer 632 and the third electrode layer 633 in the other end portion 620b of the laminated body 620. Therefore, the short pattern 632a of the second electrode layer 632, the long pattern 631b of the first electrode layer 631, and the third electrode layer 633 are all electrically connected to an external connection terminal T1 connected to the long pattern 631b of the first electrode layer 631 of the surface of the laminated body 620, and have the same polarity.

In the piezoelectric element 610, a pair of external connection terminals T1 and T2 are provided on the surface of the laminated body 620, and since the terminals for two polarities are exposed on one side, conduction can be taken from the one side.

When a voltage is applied between the pair of external connection terminals T1 and T2, an electrode group (that is, the short pattern 631a of the first electrode layer 631 and the long pattern 632b of the second electrode layer 632) connected on the one end portion 620a side of the laminated body 620 and an electrode group (that is, the long pattern 631b of the first electrode layer 631, the short pattern 632a of the second electrode layer 632, and the third electrode layer 633) connected on the other end portion 620b side have different polarities. In this case, an electric field is generated between the long pattern 631b of the first electrode layer 631 and the long pattern 632b of the second electrode layer 632 overlapping in a portion sandwiched between both of the end portions 620a and 620b of the laminated body 620, such as near a center, and a portion of the piezoelectric layer 636 located therebetween is deformed (extends or contracts) according to the polarization direction. Therefore, the portion sandwiched between both of the end portions 620a and 620b of the laminated body 620 is the active portion Sb that is deformed when a voltage is applied between the pair of external connection terminals T1 and T2.

Since the vicinity of the one end portion 620a of the laminated body 620 is a laminated portion in which the electrode layer portions 631a and 632b having the same polarity overlap, deformation hardly occurs even when a voltage is applied between the pair of external connection terminals T1 and T2. Therefore, the vicinity of the one end portion 620a of the laminated body 620 is an inactive portion Sa which is not deformed even when a voltage is applied. The inactive portion Sa is suitable for installation of the above-described through hole conductor 640 because no large displacement occurs. Since the vicinity of the other end portion 620b of the laminated body 620 is a laminated portion in which the electrode layer portions 631b and 632a having the same polarity overlap, the vicinity of the other end portion 620b of the laminated body 620 is an inactive portion Sa which is not deformed even when a voltage is applied, similar to the vicinity of the one end portion 620a. Thus, in the piezoelectric element 610, the inactive portions Sa and the active portion Sb are arranged side by side in the longitudinal direction of the laminated body 620.

Since the third electrode layer 633 is located only on the piezoelectric layer 638, deformation hardly occurs even when a voltage is applied between the pair of external connection terminals T1 and T2, similar to both the end portions 620a and 620b of the laminated body 620. A through hole conductor 646 is penetrating through the piezoelectric layer 638. The through hole conductor 646 can be formed by filling the through hole provided in the piezoelectric layer 638 with an electrode material. The through hole conductor 646 is a dummy through hole conductor which is not intended to allow conduction to the electrode layer 630, and can be used for identifying, for example, a front and a back or a polarity of a component.

In the laminated body 620, the through hole conductors 642, 644, and 646 are provided only in a portion in which deformation does not substantially occur even when a voltage is applied between the pair of external connection terminals T1 and T2 (that is, both the end portions 620a and 620b and the piezoelectric layer 638 as the lowermost layer).

Figure 36:
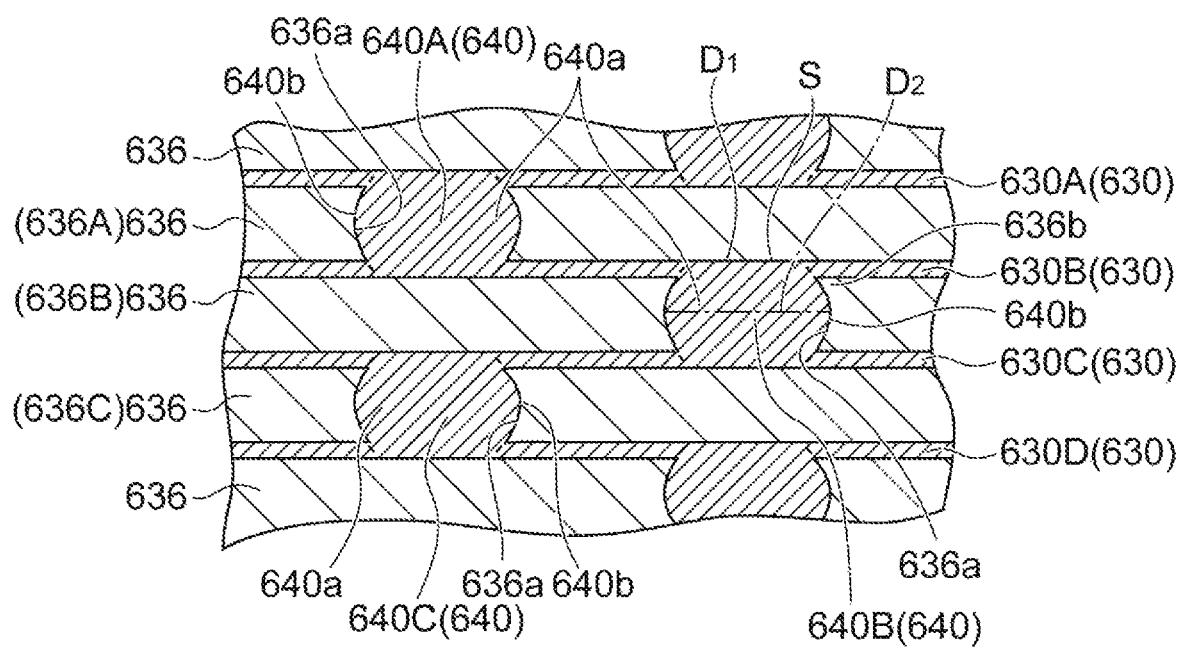
FIG. 36 is an enlarged view of main portions in an inactive portion of the piezoelectric element illustrated in FIG. 34.

Next, a configuration of the electrode layer 630 and the piezoelectric layer 636 in the inactive portion Sa will be described with reference to FIG. 36. FIG. 36 illustrates a cross section of the inactive portion Sa on the side of the other end portion 620b of the laminated body 620.

As illustrated in FIG. 36, in the inactive portion Sa, the electrode layers 630 (more specifically, the electrode layers 631a and 632a) having the same polarity overlap via the piezoelectric layer 636. For convenience of description, the overlapping electrode layers 630 are also referred to as a first layer 630A, a second layer 630B, a third layer 630C, and a fourth layer 630D in this order from the upper side. Further, the piezoelectric layer 636 interposed between the first layer 630A and the second layer 630B is particularly referred to as a first piezoelectric layer 636A, the piezoelectric layer 636 interposed between the second layer 630B and the third layer 630C is particularly referred to as a second piezoelectric layer 636B, and the piezoelectric layer 636 interposed between the third layer 630C and the fourth layer 630D is particularly referred to as a third piezoelectric layer 636C.

The first layer 630A, the second layer 630B, the third layer 630C, and the fourth layer 630D that are adjacent are connected by the through hole conductors 640 penetrating the piezoelectric layers 636. For example, the first through hole conductor 640A penetrating the first piezoelectric layer 636A connects the first layer 630A and the second layer 630B located on and beneath the first through hole conductor 640A. The second through hole conductor 640B penetrating the second piezoelectric layer 636B connects the second layer 630B and the third layer 630C located on and beneath the second through hole conductor 640B. The third through hole conductor 640C penetrating the third piezoelectric layer 636C connects the third layer 630C and the fourth layer 630D located on and beneath the third through hole conductor 640C.

However, vertically adjacent through hole conductors 640 do not overlap when viewed in the thickness direction (the laminating direction of the laminated body 620) and are adjacent. Specifically, the first through hole conductor 640A for connection of the first piezoelectric layer 636A and the second through hole conductor 640B of the second piezoelectric layer 636B do not overlap when viewed in the thickness direction and are arranged to be misaligned in the longitudinal direction (that is, the horizontal direction in FIG. 36) of the laminated body 620. Further, the second through hole conductor 640B and the third through hole conductor 640C of the third piezoelectric layer 636C do not overlap when viewed in the thickness direction and are arranged to be misaligned in a horizontal direction in FIG. 36. The third through hole conductor 640C of the third piezoelectric layer 636C overlaps the first through hole conductor 640A of the first piezoelectric layer 636A when viewed in the thickness direction. The amount of misalignment of the through hole conductors 640 is, for example, equal to or larger than a maximum radius of the through hole conductor 640, or equal to or larger than a maximum diameter of the through hole conductor 640.

Next, a procedure for fabricating the above-described piezoelectric element 610 will be described.

First, a binder, an organic solvent, or the like is applied to piezoelectric ceramic powder that is used for formation of the piezoelectric layer 636, resulting in a paste. With the obtained paste, a plurality of green sheets having a predetermined size are fabricated, for example, using a doctor blade method. In this case, a plasticizer to binder ratio is adjusted so that sufficient deformation is obtained.

In each green sheet, a through hole is formed in a portion in which the through hole conductor 640 is formed, using a YAG laser.

An electrode paste serving as the electrode layer 630 (for example, a Pd—Ag alloy (Pd:Ag=3:7)) is coated on each green sheet using a screen printing method and formed so that the electrode paste becomes the above-described pattern. When the electrode paste is applied, the through hole formed in the green sheet is filled with the electrode paste, but a rate of filling of the through hole with the electrode paste is adjusted according to a contraction rate of the electrode paste.

Subsequently, a plurality of green sheets on which the electrode paste has been printed are overlapped, and press processing such as warm isostatic pressing (WIP) is performed to obtain a green laminated body. In the warm isostatic press, pressing is performed, for example, for 10 minutes at about 170 MPa at a temperature of about 80° C. In this case, the through hole conductor is crushed or deformed by adjusting press process conditions such as the pressure, and portions to be the electrode layer and the piezoelectric layer near the through hole conductor are also deformed according to such deformation.

The obtained green laminated body is sintered. Specifically, the green laminated body is placed on a setter including stabilized zirconia, a binder removal process is performed, and the setter having the green laminated body placed thereon is put into a stabilized zirconia sagger and sintered at about 1100° C.

After sintering, a predetermined polarization process is performed to complete the piezoelectric element 610. In the polarization process, for example, a voltage with an electric field intensity of 2 kV/mm is applied for 3 minutes at a temperature of 100° C.

In the piezoelectric element 610 obtained by the above-described procedure, each through hole conductor 640 includes a widened portion 640a, as illustrated in FIG. 36. The widened portion 640a includes a protrusion 640b projecting in a direction perpendicular to the laminating direction of the laminated body 620, and is a portion of which a cross-sectional area D2 of a cross section perpendicular to the laminating direction of the laminated body 620 is greater than that of other portions. More specifically, the cross-sectional area D2 of the widened portion 640a is greater than the area D1 of the end surface S of the through hole conductor 640 in the thickness direction (the laminating direction of the laminated body 620) of the through hole conductor 640 (that is, D1<D2). The cross-sectional area D2 has, for example, a range that is 1.2 to 3 times the area D1 and is, for example, 1.4 times. In the configuration illustrated in FIG. 36, the widened portion 640a of the through hole conductor 640 is at a center position in the thickness direction of the through hole conductor 640.

A portion 636b of the piezoelectric layer 636 enters between the protrusion 640b of the widened portion 640a of the through hole conductor 640 and the electrode layer 630 in contact with the through hole conductor 640.

A shape of the through hole conductor 640, a shape of the electrode layer 630, and a shape of the piezoelectric layer 636 may be considered to be obtained by crushing the through hole conductor at a high temperature and isostatic pressure at the time of fabrication of the piezoelectric element 610.

According to the through hole conductor 640 described above, the widened portion 640a minimizes the strain of the through hole conductor 640. Specifically, when the strain in the thickness direction is applied to the through hole conductor 640, the strain is prevented due to an anchor effect of the through hole conductor 640 itself.

In the piezoelectric element 610 described above, strain in the thickness direction can be applied to the inactive portion Sa due to internal stress generated in the inactive portion Sa at the time of sintering (that is, residual stress due to contraction at the time of sintering) when the piezoelectric element 610 is fabricated or stress applied from the outside to the inactive portion Sa. Further, even when the active portion Sb is deformed and, for example, extends, contracts, or is vibrated in the longitudinal direction by applying a voltage between the pair of external connection terminals T1 and T2, the strain in the thickness direction can be applied to the inactive portion Sa according to the deformation.

Figure 37:
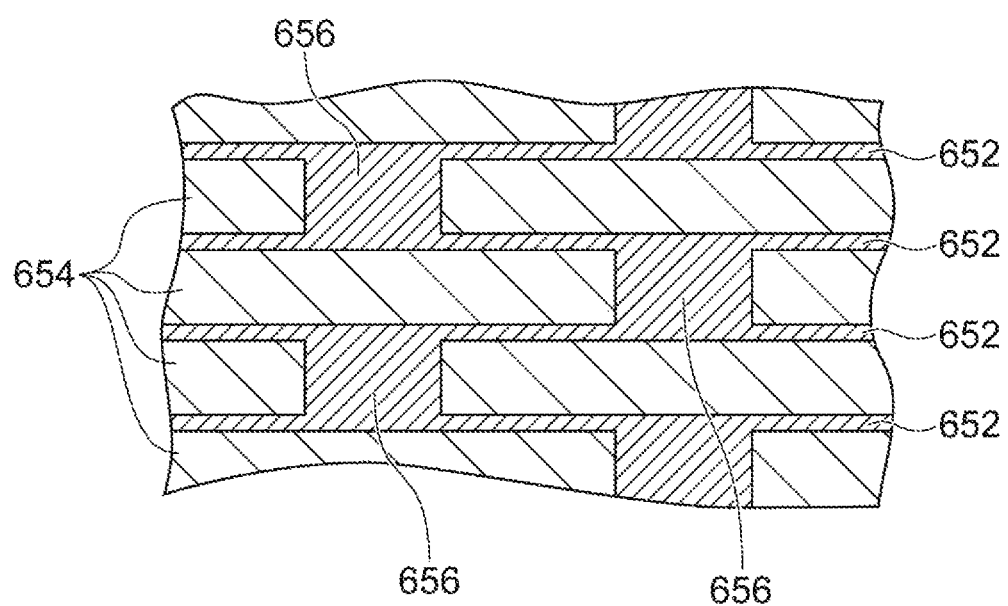
FIG. 37 illustrates an enlarged cross-sectional view of main portions of an inactive portion of a piezoelectric element according to the related art.

FIG. 37 illustrates an enlarged cross-sectional view of main portions in the inactive portion of the piezoelectric element according to the related art. In FIG. 37, reference numerals 652, 654, and 656 indicate the electrode layer, the piezoelectric layer, and the through hole conductor, respectively. The piezoelectric element according to the related art includes the laminated body in which the electrode layer 652 and the piezoelectric layer 654 alternately overlap each other, and the laminated body is obtained by sintering an object obtained by overlapping the electrode materials and the piezoelectric materials, but it is easy for residual stress caused by contraction at the time of sintering to be generated inside the laminated body. Particularly, since constituent materials or physical properties are different between the electrode layer 652 and the piezoelectric layer 654, there is a tendency for stress to be concentrated on an interface therebetween or near the interface. The stress generated at the time of sintering or the like may cause conduction failure or disconnection in the electrode layers 652 or the through hole conductors 656 and degrade connection reliability of the piezoelectric element. As illustrated in FIG. 37, the through hole conductor 656 according to the related art does not include the widened portion as described above, and has a uniform cross-sectional area and width in the thickness direction. Therefore, in the piezoelectric element according to the related art, when the strain in the thickness direction is applied to the through hole conductor 656, the strain is not prevented. As a result, the electrode layer 652 may detach or be disconnected from the through hole conductor 656.

In the piezoelectric element 610, since the through hole conductor 640 includes the widened portion 640a as described above, conduction failure or disconnection of the electrode layer 630 or the through hole conductor 40 is prevented, unlike in the piezoelectric element of the related art including the through hole conductor 656 including no widened portion.

Particularly, in the piezoelectric element 610 described above, since there is the widened portion 640a at a center position in the thickness direction of the through hole conductor 406, concentration of stress or strain in the thickness direction on any one of the upper and lower portions is prevented, and accordingly, a uniform distribution of the stress or the strain is realized.

Further, in the piezoelectric element 610 described above, since the portion 636b of the piezoelectric layer 636 enters between the protrusion 640b of the widened portion 640a of the through hole conductor 406 and the electrode layer 630, that portion of the piezoelectric layer 636 inhibits strain of the through hole conductor 640. Accordingly, conduction failure or disconnection of the electrode layer 630 or the through hole conductor 640 in the inactive portion Sa is further prevented.

In the piezoelectric element 610, since the inactive portion Sa of the one end portion 620a side of the laminated body 620 has the same configuration of the electrode layer 630, the piezoelectric layer 636, and the through hole conductor 640 as the inactive portion Sa on the other end portion 620b side described above, the same effects as described above can be obtained also in the inactive portion Sa on the one end portion 620a side.

Eighth Embodiment

Next, a configuration of the piezoelectric element 700 according to an eighth embodiment will be described with reference to FIGS. 38 to 41.

Figure 38:
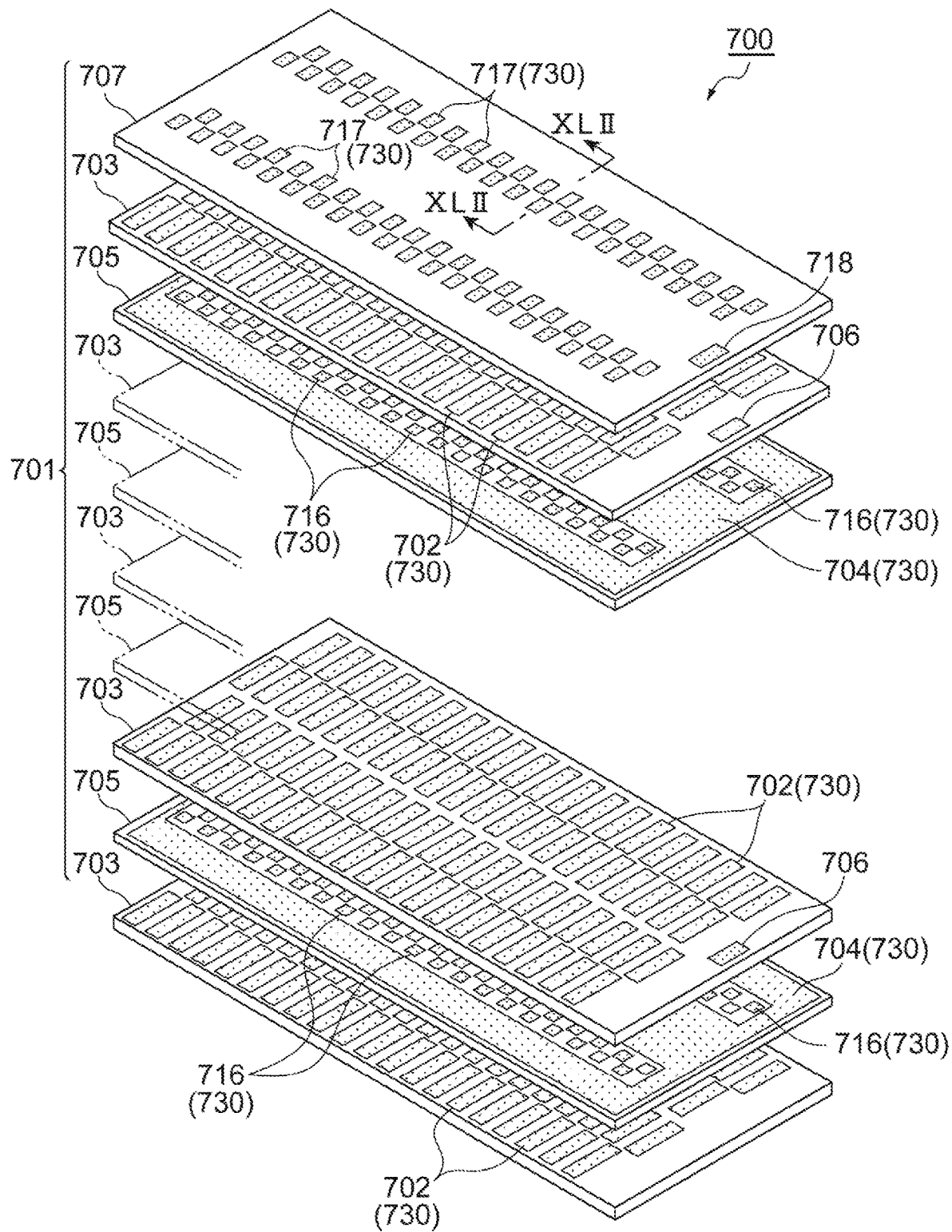
FIG. 38 is an exploded perspective view of a piezoelectric element according to an eighth embodiment of the present disclosure.

As illustrated in FIG. 38, the piezoelectric element 700 is configured such that a plurality of piezoelectric layers 703 having individual electrodes 702 formed therein and a plurality of piezoelectric layers 705 having a common electrode 104 formed therein are alternately laminated, and a piezoelectric layer 707 having terminal electrodes 717 and 718 formed thereon is laminated on an uppermost layer.

The piezoelectric element 700 includes a laminated body 701 having an outer shape of a rectangular parallelepiped which extends in one direction. The dimensions of the laminated body 701 are, for example, 30.0 mm in a longitudinal direction length, 15.0 mm in a lateral direction length, and 0.30 mm in a thickness.

All of the plurality of piezoelectric layers 703 and 707 have a rectangular flat plate shape and have, for example, a longitudinal direction length of 30.0 mm, a lateral direction length of 15.0 mm, and a thickness of 30 μm. Each piezoelectric layer 36 is formed of, for example, a piezoelectric ceramic material mainly containing lead zirconate titanate, and contains additives such as Nb and Sr.

Each of the piezoelectric layers 703, 705, and 707 is formed of a piezoelectric ceramic material mainly containing lead zirconate titanate and is formed, for example, in a rectangular thin plate shape of "15 mm×30 mm and a thickness of 30 μm". Further, the individual electrode 702, the common electrode 704, and the terminal electrodes 717 and 718 are formed of an Ag—Pd alloy (Ag 70 wt % and Pd 30 wt %), and may be formed of a conductive material (Ag—Pt alloy, Au—Pd alloy, Cu, Ni, or the like) other than an Ag—Pd alloy. The electrodes may be patterned by screen printing.

Figure 39:
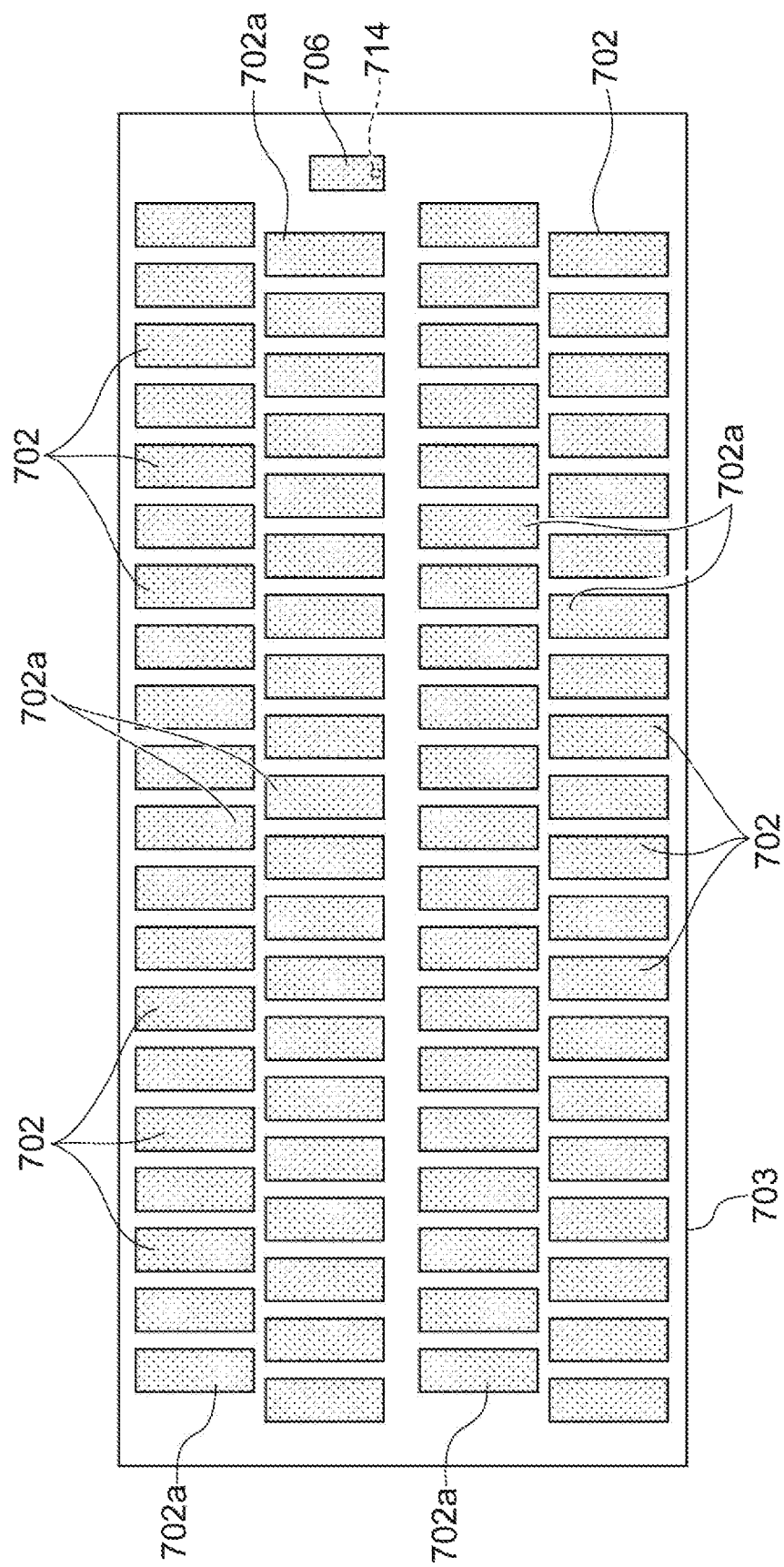
FIG. 39 is a plan view of piezoelectric layers of second, fourth, sixth, and eighth layers of the piezoelectric element illustrated in FIG. 38.

A plurality of rectangular individual electrodes 702 are arranged in a zigzag manner on the upper surfaces of the piezoelectric layers 703 as the second layer, the fourth layer, the sixth layer, and the eighth layer from the piezoelectric layer 707 that is an uppermost layer, as illustrated in FIG. 39. The longitudinal direction of each individual electrode 702 is arranged to be orthogonal to the longitudinal direction of the piezoelectric layer 703, and adjacent individual electrodes 702 and 702 are arranged at a predetermined interval such that the adjacent individual electrodes are electrically independent from each other and are prevented from being affected by each other's vibration.

Here, when the longitudinal direction of the piezoelectric layer 3 is a column direction and a direction orthogonal to the longitudinal direction is a row direction, the individual electrodes 702 are arranged, for example, side by side in a zigzag shape in four rows. By arranging the plurality of individual electrodes 702 in a zigzag shape, it becomes possible to efficiently arrange the individual electrodes on the piezoelectric layers 703. Thus, it is possible to achieve a small size of the piezoelectric element 700 and high integration of the individual electrodes 702 while maintaining an area of the active portion contributing to deformation in the piezoelectric layer 703.

Figure 42:
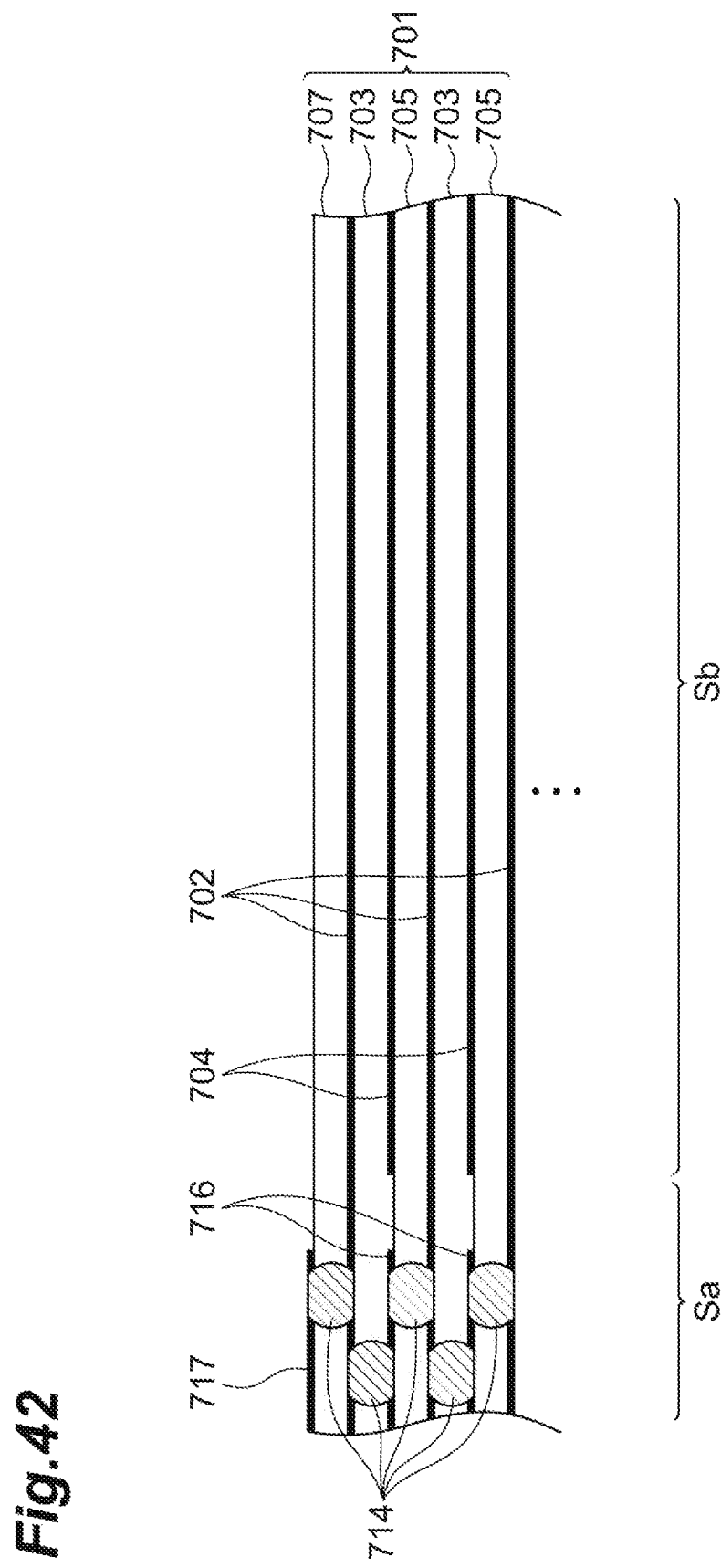
FIG. 42 is a cross-sectional view taken along line XLII-XLII of the piezoelectric element illustrated in FIG. 38.

Each individual electrode 702 has an end portion facing the adjacent individual electrode as a connection end portion 702a, and is connected to the through hole conductor 714 penetrating the piezoelectric layer 703, as illustrated in FIG. 42, immediately below the connection end portion 702a. The through hole conductor 714 is formed by filling the through hole 736a provided in the piezoelectric layer 703 with an electrode material.

Further, a relay electrode 706 for electrically connecting the common electrodes 704 of the piezoelectric layers 705 located on and beneath the piezoelectric layer 703 is formed in an edge portion of the upper surface of the piezoelectric layer 703. The relay electrode 706 is connected to the through hole conductor 714 penetrating the piezoelectric layer 703 immediately below the relay electrode 706.

The individual electrodes 702 are arranged in a zigzag manner on the upper surface of the piezoelectric layer 703 as the lowermost layer, similar to the piezoelectric layers 703 as the second layer, the fourth layer, the sixth layer, and the eighth layer described above. However, the piezoelectric layer 703 as the lowermost layer is different from the piezoelectric layers 703 of the second layer, fourth layer, the sixth layer, and the eighth layer in that the relay electrode 706 and the through hole conductors 714 are not formed.

Figure 40:
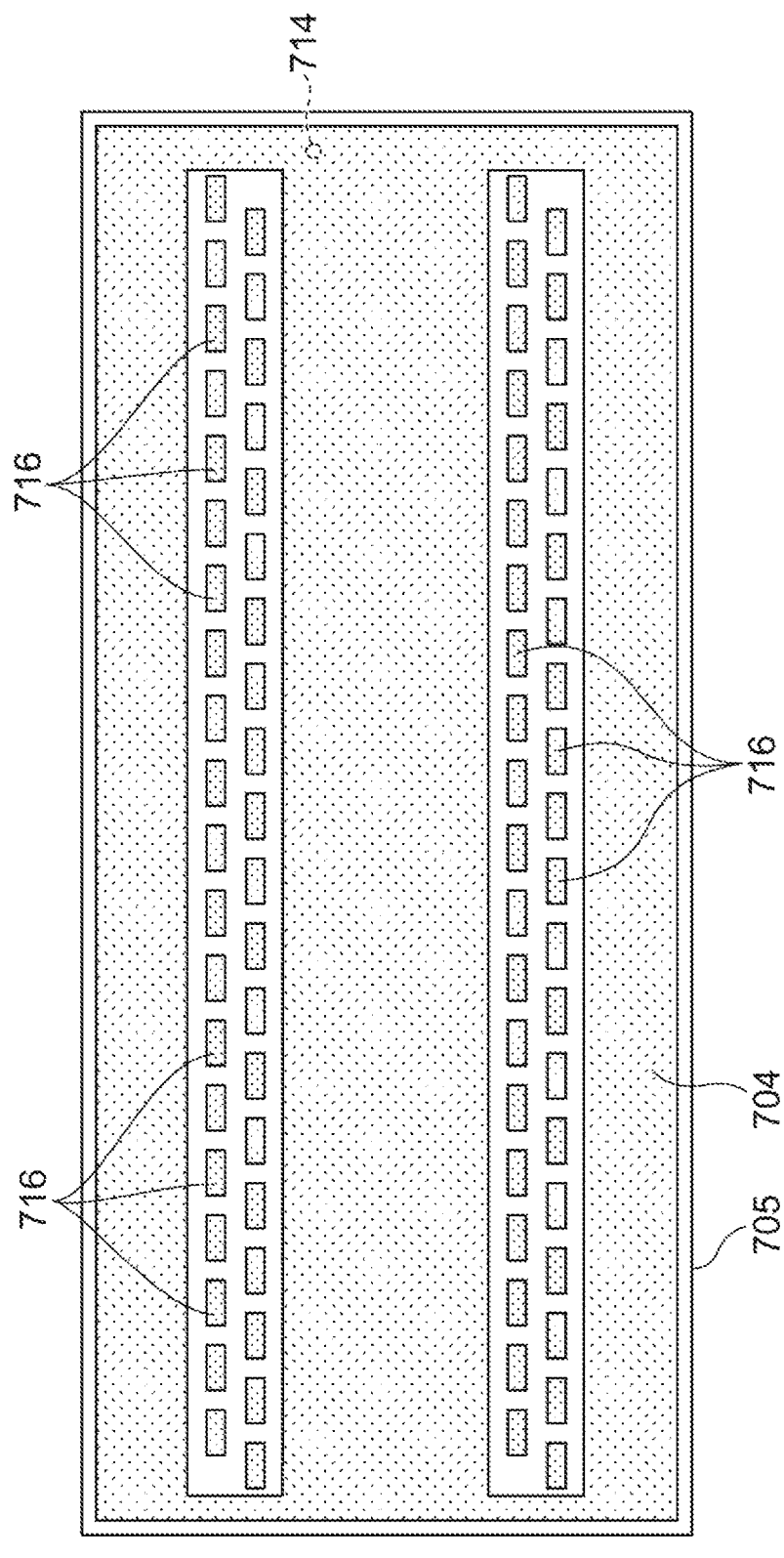
FIG. 40 is a plan view of piezoelectric layers as third, fifth, and seventh layers of the piezoelectric element illustrated in FIG. 38.

Further, a relay electrode 716 is formed to face each connection end portion 702a of the piezoelectric layer 703 in the laminating direction of the laminated body 701 (that is, a thickness direction of the laminated piezoelectric element 700), as illustrated in FIG. 40, on the upper surfaces of the piezoelectric layers 705 of the third layer, the fifth layer, the seventh layer, and the ninth layer from the piezoelectric layer 707 as the uppermost layer. Each relay electrode 716 is connected to the through hole conductor 714 penetrating the piezoelectric layer 705, as illustrated in FIG. 42, directly below the relay electrode 716. The through hole conductor 714 is formed by filling the through hole 736a provided in the piezoelectric layer 705 with an electrode material.

Further, the common electrode 704 is formed on the upper surface of the piezoelectric layer 705. The common electrode 704 surrounds a set of relay electrodes 716 in first and second rows and a set of relay electrodes 716 in the third and fourth rows at a predetermined interval, and overlaps a portion other than the connection end portion 702a of each individual electrode 702 when viewed in the laminating direction. Thus, an entire portion facing the portion other than the connection end portions 702a of each individual electrode 702 in the piezoelectric layers 703 and 705 can be effectively used as an active portion (the active portion Sb in FIG. 42) contributing to the deformation. Further, the common electrode 704 is formed at a predetermined interval from the outer circumferential portion of the piezoelectric layer 705, and is connected to the through hole conductor 714 penetrating the piezoelectric layer 705 to face the relay electrode 706 of the piezoelectric layer 703 in the laminating direction.

The relay electrodes 716 and the common electrode 704 are formed on the upper surface of the piezoelectric layer 705 of the ninth layer, similar to the piezoelectric layers 705 of the third layer, the fifth layer, and the seventh layer described above. However, the piezoelectric layer 705 of the ninth layer is different from the piezoelectric layers 705 of the third layer, the fifth layer, and the seventh layer in that the through hole conductor 714 facing the relay electrode 706 of the piezoelectric layer 703 in the laminating direction is not formed.

Figure 41:
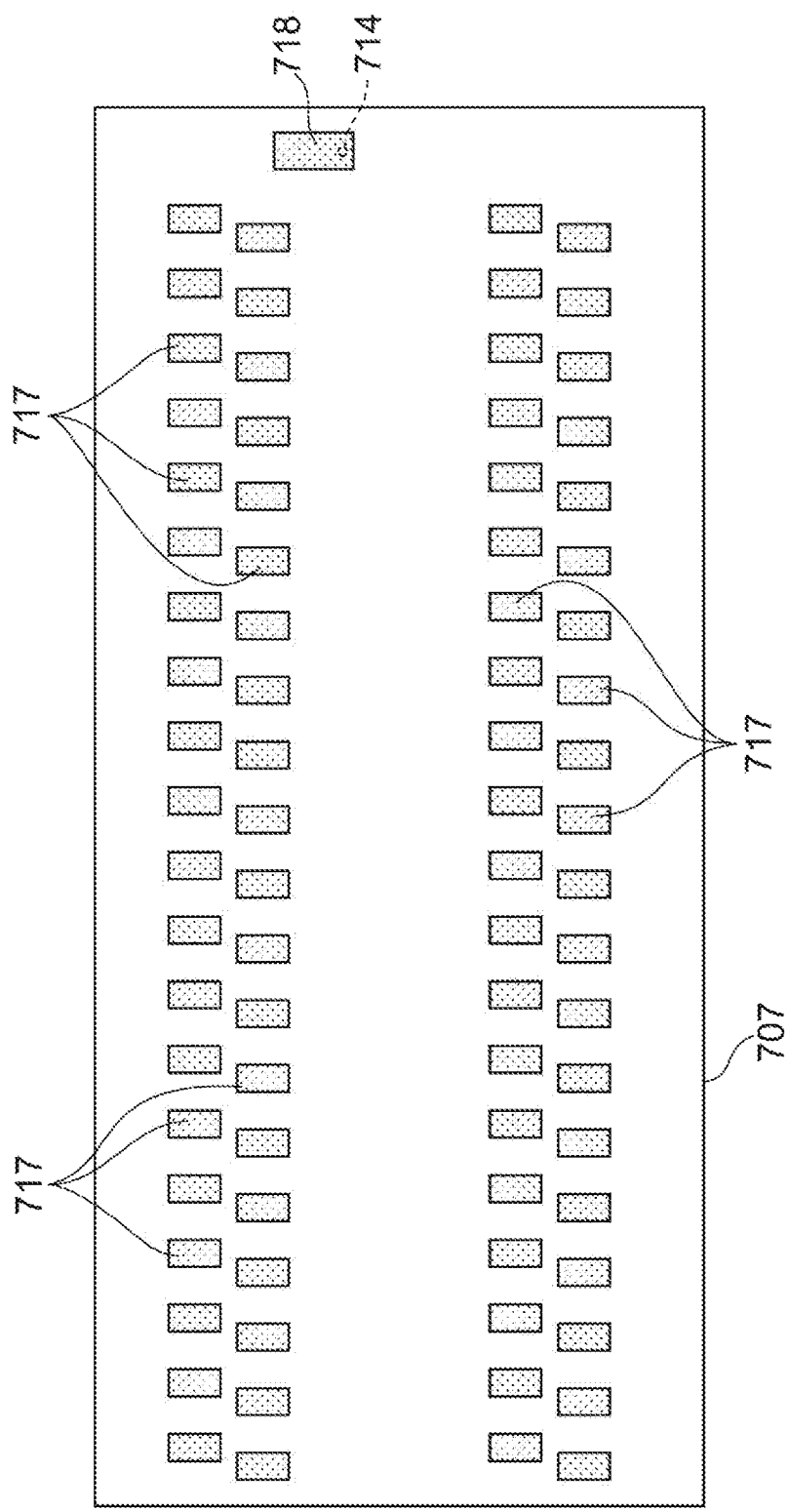
FIG. 41 is a plan view of a piezoelectric layer of an uppermost layer of the piezoelectric element illustrated in FIG. 38.

Further, the terminal electrode 717 is formed to face the connection end portion 702a of each individual electrode 702 of the piezoelectric layer 703 in the laminating direction, as illustrated in FIG. 41, on the upper surface of the piezoelectric layer 707 as the uppermost layer, and the terminal electrode 718 is formed to face the relay electrode 706 of the piezoelectric layer 703 in the laminating direction. The respective terminal electrodes 717 and 718 are connected to the through hole conductor 714 penetrating the piezoelectric layer 707 immediately below the terminal electrodes 717 and 718.

Lead wires of a flexible printed circuit board (FPC) or the like for connection to a driving power supply are soldered to the terminal electrodes 717 and 718. Therefore, in order to easily place solder when lead wires are soldered, a surface electrode layer formed of a conductive material including Ag in order to improve solder wettability in the terminal electrodes 717 and 718 is formed on an underlying electrode layer formed of a conductive material including Ag and Pd.

The thickness of the terminal electrodes 717 and 718 formed on the piezoelectric layer 707 as the uppermost layer is greater than the thickness of the other electrode layers 702, 704, and 716 and is about 1 to 2 μm. The thickness of the terminal electrodes 717 and 718 is, for example, 5 to 50% or 10 to 30% greater than the thickness of the other electrode layer 702, 704, and 716.

A dummy electrode pattern may be arranged in a circumferential portion of the upper surface of the piezoelectric layer 707 as the uppermost layer. By arranging the dummy electrode pattern in the circumferential portion, an effect that a deviation of pressure is reduced at the time of pressing and variation in a green density after pressing can be reduced is obtained.

By laminating the piezoelectric layers 703, 705, and 707 on which the electrode pattern has been formed as described above, four common electrodes 704 are aligned with the relay electrode 706 interposed therebetween in a laminating direction with respect to the terminal electrode 718 as the uppermost layer, and the respective aligned electrode layers 704 and 706 are electrically connected by the through hole conductor 714.

Further, five individual electrodes 702 are aligned with the relay electrode 716 interposed therebetween in the laminating direction with respect to the respective terminal electrodes 717 as the uppermost layer, and the respective aligned electrode layers 702 and 716 are electrically connected by the through hole conductors 714, as illustrated in FIG. 42.

The through hole conductors 714 which are adjacent when viewed in the laminating direction of the laminated body 701 are designed so that central axes thereof do not overlap, as illustrated in FIG. 42, and are formed on the piezoelectric layers 703 and 705 to be adjacent in the extension direction of the individual electrodes 702 at a predetermined interval when viewed in the laminating direction. By arranging adjacent through hole conductors 714 as described above, electrical connection is reliably made by the through hole conductors 574.

The laminated piezoelectric element 700 has the electrical connection as described above. Accordingly, when a voltage is applied between a predetermined terminal electrode 717 and the terminal electrode 718, a voltage is applied between the individual electrodes 702 and the common electrode 704, and the active portion Sb that is a portion in which the piezoelectric layers 703 and 705 are interposed between the individual electrodes 702 and the common electrodes 704 is displaced. Thus, by selecting the terminal electrode 717 to which the voltage is applied, the active portion Sb aligned under the selected terminal electrode 717 among the active portions Sb corresponding to the respective individual electrodes 702 arranged in a matrix form can be displaced in the laminating direction. Such a laminated piezoelectric element 700 is applied to a driving source for various devices requiring small displacement, such as in valve control of a micropump.

On the other hand, since the portion in which the connection end portion 702a of the individual electrode 702 and the relay electrode 716 overlap is a laminated portion in which the electrode layers with the same polarity overlap, the portion is hardly deformed even when a voltage is applied. Therefore, as illustrated in FIG. 42, the portion in which the connection end portion 702a of the individual electrode 702 and the relay electrode 716 overlap is the inactive portion Sa which does not contribute to the deformation. Further, deformation of the piezoelectric layer 707 as the uppermost layer hardly occurs even when a voltage is applied since the individual electrode 702 is located only under the piezoelectric layer 707 as the uppermost layer. In the laminated body 701, the through hole conductor 714 is provided only in the portion in which the deformation does not substantially occur when a voltage is applied (that is, the portion in which the connection end portion 702a of the individual electrode 702 and the relay electrode 716 overlap).

Figure 43:
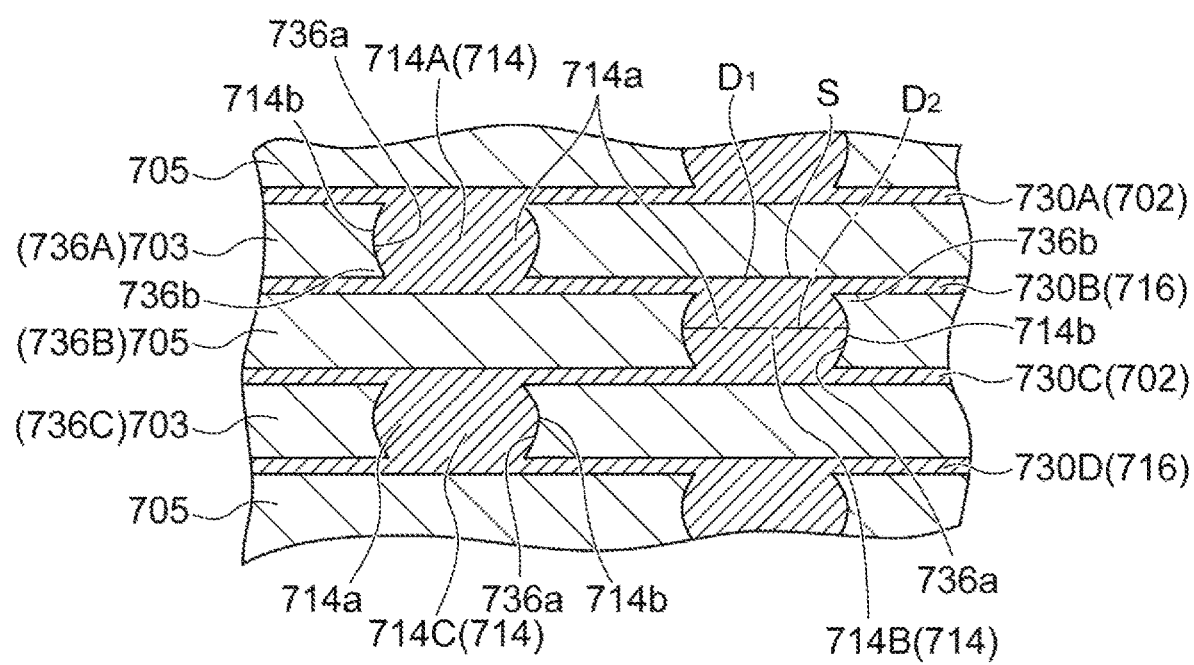
FIG. 43 is an enlarged cross-sectional view of main portions in an inactive portion of the piezoelectric element illustrated in FIG. 38.

As illustrated in FIGS. 42 and 43, in the inactive portion Sa, the electrode layers 730 (more specifically, the individual electrodes 702 and the relay electrodes 716) having the same polarity overlap via the piezoelectric layers 703 and 705. For convenience of description, the overlapping electrode layers 730 are also referred to as a first layer 730A, a second layer 730B, a third layer 730C, and a fourth layer 730D in this order from the upper side. Further, the piezoelectric layer 703 interposed between the first layer 730A and the second layer 730B is particularly referred to as a first piezoelectric layer 736A, the piezoelectric layer 705 interposed between the second layer 730B and the third layer 730C is particularly referred to as a second piezoelectric layer 736B, and the piezoelectric layer 703 interposed between the third layer 730C and the fourth layer 730D is particularly referred to as a third piezoelectric layer 736C.

The first layer 730A, the second layer 730B, the third layer 730C, and the fourth layer 730D that are adjacent are connected by the through hole conductor 714 penetrating the piezoelectric layers 703 and 705. However, vertically adjacent through hole conductors 714 do not overlap when viewed in the thickness direction (the laminating direction of the laminated body 701) and are adjacent. Specifically, the first through hole conductor 714A of the first piezoelectric layer 736A and the second through hole conductor 714B of the second piezoelectric layer 736B do not overlap when viewed in the thickness direction and are arranged to be misaligned in the horizontal direction (that is, the extension direction of the individual electrode 702) in FIG. 42. Further, the second through hole conductor 714B and the third through hole conductor 714C of the third piezoelectric layer 736C do not overlap when viewed in the thickness direction and are arranged to be misaligned in a horizontal direction in FIG. 42. The third through hole conductor 714C of the third piezoelectric layer 736C overlaps the first through hole conductor 714A of the first piezoelectric layer 736A when viewed in the thickness direction. The amount of misalignment of the through hole conductors 714 is, for example, equal to or larger than a maximum radius of the through hole conductor 714, or equal to or larger than a maximum diameter of the through hole conductor 714.

A procedure of fabricating the piezoelectric element 700 is the same as the procedure of fabricating the piezoelectric element 610 described above. That is, green sheets coated with a predetermined pattern of electrode paste overlap, and press processing such as warm isostatic pressing is performed to obtain a laminated green sheet. In this case, the through hole conductor is crushed or deformed by adjusting press process conditions such as the pressure, and portions to be the electrode layer and the piezoelectric layer near the through hole conductor are also deformed according to such deformation. The obtained green laminated body is sintered and a predetermined polarization process is performed to complete the piezoelectric element 700.

In the piezoelectric element 700 obtained by the above-described procedure, each through hole conductor 714 includes the same widened portion 714a as the widened portion 40a of the above-described through hole conductor 40, as illustrated in FIG. 43. That is, the widened portion 714a includes a protrusion 714b projecting in a direction perpendicular to the laminating direction of the laminated body 710, and is a portion of which a cross-sectional area D2 of a cross section perpendicular to the laminating direction of the laminated body 701 is greater than that of other portions. More specifically, the cross-sectional area D2 of the widened portion 714a is greater than the area D1 of the end surface S of the through hole conductor 714 in the thickness direction (the laminating direction of the laminated body 701) of the through hole conductor 714 (that is, D1<D2). In the configuration illustrated in FIG. 43, the widened portion 714a of the through hole conductor 714 is at a center position in the thickness direction of the through hole conductor 714.

Further, a portion 736b of the piezoelectric layers 703 and 705 enters between the protrusion 714b of the widened portion 714a of the through hole conductor 714 and the electrode layer 730 in contact with the through hole conductor 714.

A shape of the through hole conductor 714, a shape of the electrode layer 730, and a shape of the piezoelectric layers 703 and 705 may be considered to be obtained by crushing the through hole conductor at a high temperature and isostatic pressure at the time of fabrication of the piezoelectric element 700.

According to the through hole conductor 714 described above, the widened portion 714a minimizes the strain of the through hole conductor 714, similar to the through hole conductor 640 according to the seventh embodiment. Specifically, when the strain in the thickness direction is applied to the through hole conductor 714, the strain is prevented due to an anchor effect of the through hole conductor 714 itself. Strain in the thickness direction may be applied to the inactive portion Sa of the piezoelectric element 700 due to the same cause as in the inactive portion Sa of the piezoelectric element 610 according to the seventh embodiment.

Therefore, in the piezoelectric element 700, since the through hole conductor 714 includes the widened portion 714a, conduction failure or disconnection of the electrode layer 730 or the through hole conductor 714 is prevented, unlike in the piezoelectric element of the related art including the through hole conductor 56 including no widened portion.

Particularly, in the piezoelectric element 700 described above, since there is the widened portion 714a at a center position in the thickness direction of the through hole conductor 714, concentration of stress or strain in the thickness direction on any one of the upper and lower portions is prevented, and accordingly, a uniform distribution of the stress or the strain is realized.

Further, in the piezoelectric element 700 described above, since the portion 736b of the piezoelectric layers 703 and 705 enters between the protrusion 714b of the widened portion 714a of the through hole conductor 714 and the electrode layer 730, that portion of the piezoelectric layers 703 and 705 inhibits strain of the through hole conductor 714. Accordingly, conduction failure or disconnection of the electrode layer 730 or the through hole conductor 714 in the inactive portion Sa is further prevented.

The present disclosure is not limited to the seventh embodiment and the eighth embodiment described above. For example, the number of electrode layers or piezoelectric layers of the laminated body of the piezoelectric element can be appropriately increased or decreased as long as the number is equal to or greater than a required minimum number of layers constituting the above-described laminated portion (that is, three or more electrode layers and two or more piezoelectric layers). Further, a total thickness of the laminated body, a thickness of the electrode layer, and a thickness of the piezoelectric layer can be appropriately increased or decreased.

Ninth Embodiment

Next, a configuration of the piezoelectric element 810 according to a ninth embodiment will be described with reference to FIGS. 44 and 45.

Figure 44:
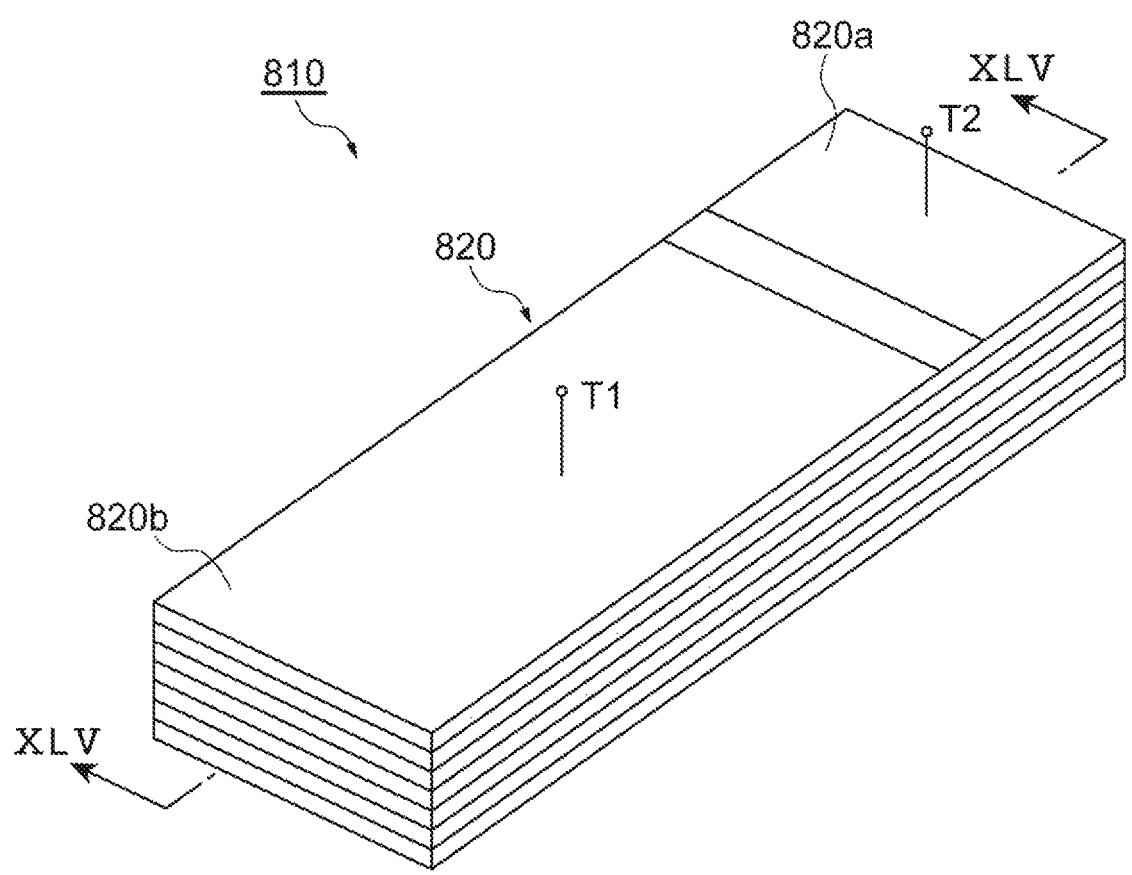
FIG. 44 is a perspective view of a piezoelectric element according to a ninth embodiment of the present disclosure.
Figure 45:
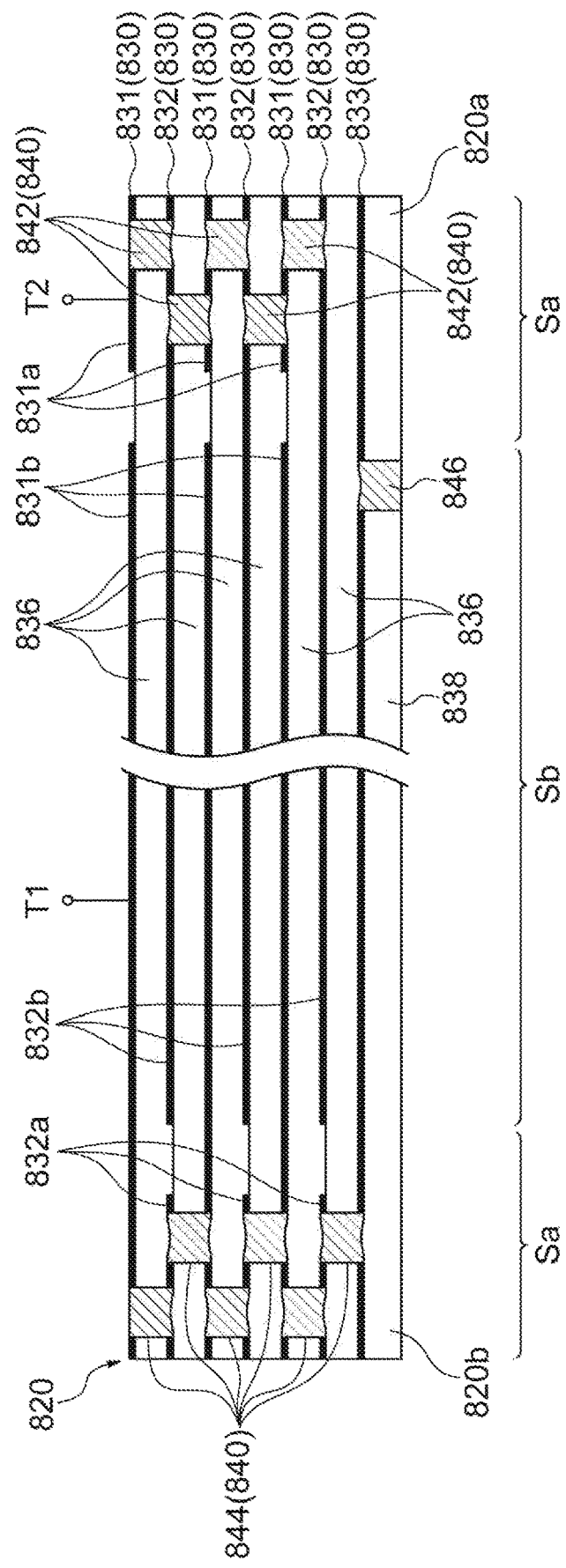
FIG. 45 is a cross-sectional view taken along line XLV-XLV of the piezoelectric element illustrated in FIG. 44.

As illustrated in FIG. 44, the piezoelectric element 810 includes a laminated body 820 having an outer shape of a rectangular parallelepiped which extends in one direction. For example, dimensions of the laminated body 820 are 2.0 mm in a longitudinal direction length, 0.5 mm in a lateral direction length, and 0.15 mm in a thickness. As illustrated in FIG. 45, the laminated body 820 includes a plurality of electrode layers 830, and a plurality of piezoelectric layers 836 and 838, and is configured such that the electrode layers 830 and the piezoelectric layers 836 and 838 are alternately laminated. In this embodiment, the laminated body 820 includes three or more electrode layers 830 and two or more piezoelectric layers 836 and 838. In FIGS. 44 and 45, the laminated body 820 includes seven electrode layers 830 and seven piezoelectric layers 836 and 838.

The plurality of electrode layers 830 are formed of Pt, and may be formed of a conductive material (Ag—Pd alloy, Au—Pd alloy, Cu, Ag, Ni, or the like) other than Pt. The plurality of electrode layers 830 are patterned by screen printing or the like. The plurality of electrode layers 830 include a first electrode layer 831, a second electrode layer 832, and a third electrode layer 833 which are different in electrode pattern. In the plurality of electrode layers 830, the first electrode layer 831 and the second electrode layer 832 are alternately arranged in this order from the top, as illustrated in FIG. 45, and the lowermost layer is the third electrode layer 833.

An electrode pattern of the first electrode layer 831 includes a short pattern 831a formed near one end portion 820a of the laminated body 820, and a long pattern 831b extending from the short pattern 831a to the other end portion 820b of the laminated body 820 via a predetermined gap. An electrode pattern of the second electrode layer 832 is a pattern symmetrical to the first electrode layer 831 and includes a short pattern 832a formed near the other end portion 820b of the laminated body 820, and a long pattern 832b extending from the short pattern 832a to the one end portion 820a of the laminated body 820 via a predetermined gap. The third electrode layer 833 is a pattern (so-called solid pattern) formed over an entire region.

All of the plurality of piezoelectric layers 836 and 838 have a rectangular flat plate shape and have, for example, a longitudinal direction length of 2.0 mm, a lateral direction length of 0.5 mm, and a thickness of 20 μm. Each of the piezoelectric layers 836 and 838 is formed of, for example, a piezoelectric ceramic material containing lead zirconate titanate as a main component, and contains additives such as Zn or Nb. The plurality of piezoelectric layers 836 and 838 include the piezoelectric layer 836 on and underneath which the electrode layers 830 are located, and the lowermost piezoelectric layer 838 only on which the electrode layer 830 is located.

In the piezoelectric layer 836, a through hole 836a penetrates therethrough at a predetermined position, and a through hole conductor 840 connecting the electrode layers 830 located on and beneath the piezoelectric layer 836 is formed in a region in which each through hole 836a is formed. That is, the through hole conductor 840 is formed by filling the through hole 836a provided in the piezoelectric layer 836 with an electrode material.

The through hole conductor 840 as the through hole conductor 842 connects the short pattern 831a of the first electrode layer 831 and the long pattern 832b of the second electrode layer 832 in the one end portion 820a of the laminated body 820. Therefore, both of the short pattern 831a of the first electrode layer 831 and the long pattern 832b of the second electrode layer 832 are electrically connected to an external connection terminal T2 connected to the short pattern 831a of the first electrode layer 831 of a surface of the laminated body 820, and have the same polarity.

Further, the through hole conductor 840 as the through hole conductor 844 connects the short pattern 832a of the second electrode layer 832 and the long pattern 831b of the first electrode layer 831 in the other end portion 820b of the laminated body 820. Further, the through hole conductor 840 as the through hole conductor 844 connects the short pattern 832a of the second electrode layer 832 and the third electrode layer 833 in the other end portion 820b of the laminated body 820. Therefore, the short pattern 832a of the second electrode layer 832, the long pattern 831b of the first electrode layer 831, and the third electrode layer 833 are all electrically connected to an external connection terminal T1 connected to the long pattern 831b of the first electrode layer 831 of the surface of the laminated body 820, and have the same polarity.

In the piezoelectric element 810, a pair of external connection terminals T1 and T2 are provided on the surface of the laminated body 820, and since the terminals for two polarities are exposed on one side, conduction can be taken from the one side.

When a voltage is applied between the pair of external connection terminals T1 and T2, an electrode group (that is, the short pattern 831a of the first electrode layer 831 and the long pattern 432b of the second electrode layer 832) connected on the one end portion 820a side of the laminated body 820 and an electrode group (that is, the long pattern 831b of the first electrode layer 831, the short pattern 832a of the second electrode layer 832, and the third electrode layer 833) connected on the other end portion 820b side have different polarities. In this case, an electric field is generated between the long pattern 831b of the first electrode layer 831 and the long pattern 832b of the second electrode layer 832 overlapping in a portion sandwiched between both of the end portions 820a and 820b of the laminated body 820, such as near a center, and a portion of the piezoelectric layer 836 located therebetween is deformed (extends or contracts) according to the polarization direction. Therefore, the portion sandwiched between both of the end portions 820a and 820b of the laminated body 820 is the active portion Sb that is deformed when a voltage is applied between the pair of external connection terminals T1 and T2.

Since the vicinity of the one end portion 820a of the laminated body 820 is a laminated portion in which the electrode layer portions 831a and 832b having the same polarity overlap, deformation hardly occurs even when a voltage is applied between the pair of external connection terminals T1 and T2. Therefore, the vicinity of the one end portion 820a of the laminated body 820 is an inactive portion Sa which is not deformed even when a voltage is applied. The inactive portion Sa is suitable for installation of the above-described through hole conductor 840 because no large displacement occurs. Since the vicinity of the other end portion 820b of the laminated body 820 is a laminated portion in which the electrode layer portions 831b and 832a having the same polarity overlap, the vicinity of the other end portion 820b of the laminated body 820 is an inactive portion Sa which is not deformed even when a voltage is applied, similar to the vicinity of the one end portion 820a. Thus, in the piezoelectric element 810, the inactive portions Sa and the active portion Sb are arranged side by side in the longitudinal direction of the laminated body 820.

Since the third electrode layer 833 is located only on the piezoelectric layer 838, deformation hardly occurs even when a voltage is applied between the pair of external connection terminals T1 and T2, similar to both the end portions 820a and 820b of the laminated body 820. A through hole conductor 846 is penetrating through the piezoelectric layer 838. The through hole conductor 846 can be formed by filling the through hole provided in the piezoelectric layer 838 with an electrode material. The through hole conductor 846 is a dummy through hole conductor which is not intended to allow conduction to the electrode layer 830, and can be used for identifying, for example, a front and a back or a polarity of a component.

In the laminated body 820, the through hole conductors 842, 844, and 846 are provided only in a portion in which deformation does not substantially occur even when a voltage is applied between the pair of external connection terminals T1 and T2 (that is, both the end portions 820a and 820b and the piezoelectric layer 838 as the lowermost layer).

Figure 46:
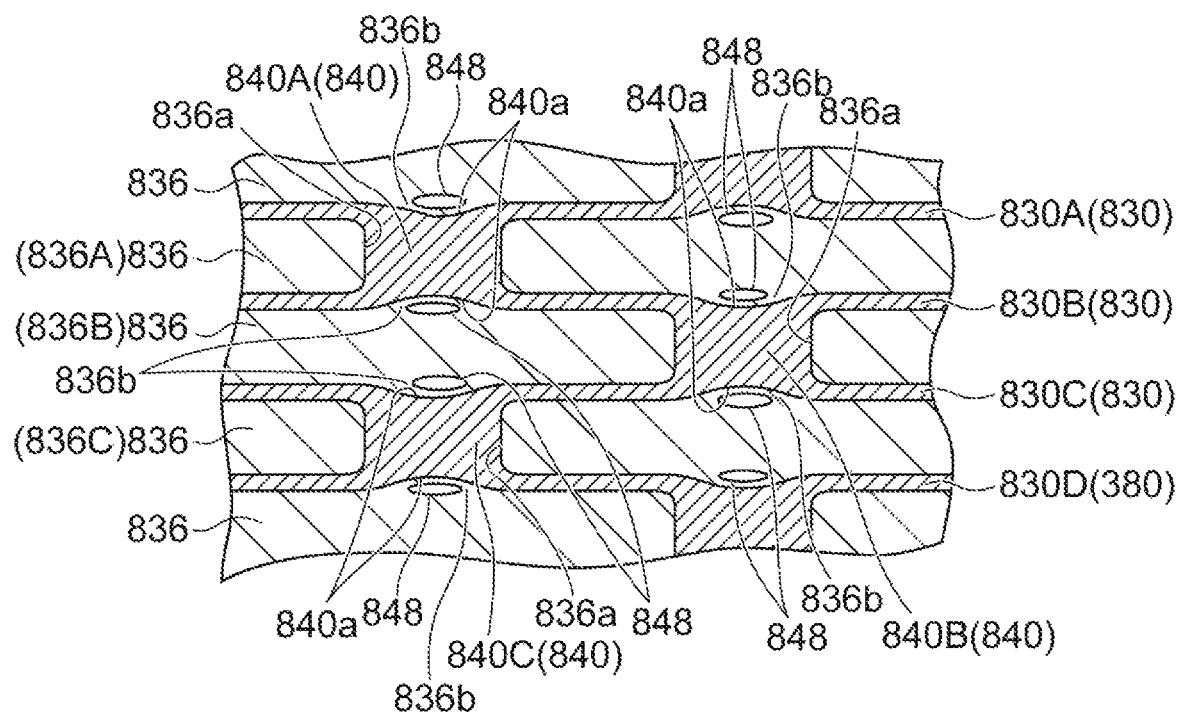
FIG. 46 is an enlarged view of main portions in the inactive portion of the piezoelectric element illustrated in FIG. 44.

Next, a configuration of the electrode layer 830 and the piezoelectric layer 836 in the inactive portion Sa will be described with reference to FIG. 46. FIG. 46 illustrates a cross section of the inactive portion Sa on the side of the other end portion 820b of the laminated body 820.

As illustrated in FIG. 46, in the inactive portion Sa, the electrode layers 830 (more specifically, the electrode layers 831a and 832a) having the same polarity overlap via the piezoelectric layer 836. For convenience of description, the overlapping electrode layers 830 are also referred to as a first layer 830A, a second layer 830B, a third layer 830C, and a fourth layer 830D in this order from the upper side. Further, the piezoelectric layer 836 interposed between the first layer 830A and the second layer 830B is particularly referred to as a first piezoelectric layer 836A, the piezoelectric layer 836 interposed between the second layer 830B and the third layer 830C is particularly referred to as a second piezoelectric layer 836B, and the piezoelectric layer 836 interposed between the third layer 830C and the fourth layer 830D is particularly referred to as a third piezoelectric layer 836C.

The first layer 830A, the second layer 830B, the third layer 830C, and the fourth layer 830D that are adjacent are connected by the through hole conductors 840 penetrating the piezoelectric layers 836. For example, the first through hole conductor 840A penetrating the first piezoelectric layer 836A connects the first layer 830A and the second layer 830B located on and beneath the first through hole conductor 840A. The second through hole conductor 840B penetrating the second piezoelectric layer 836B connects the second layer 830B and the third layer 830C located on and beneath the second through hole conductor 840B. The third through hole conductor 840C penetrating the third piezoelectric layer 836C connects the third layer 830C and the fourth layer 830D located on and beneath the third through hole conductor 840C.

However, vertically adjacent through hole conductors 840 do not overlap when viewed in the thickness direction (the laminating direction of the laminated body 20) and are adjacent. Specifically, the first through hole conductor 840A of the first piezoelectric layer 836A and the second through hole conductor 840B of the second piezoelectric layer 836B do not overlap when viewed in the thickness direction and are arranged to be misaligned in the longitudinal direction (that is, the horizontal direction in FIG. 46) of the laminated body 820. Further, the second through hole conductor 840B and the third through hole conductor 840C of the third piezoelectric layer 836C do not overlap when viewed in the thickness direction and are arranged to be misaligned in a horizontal direction in FIG. 46. The third through hole conductor 840C of the third piezoelectric layer 836C overlaps the first through hole conductor 840A of the first piezoelectric layer 836A when viewed in the thickness direction. The amount of misalignment of the through hole conductors 840 is, for example, equal to or larger than a maximum radius of the through hole conductor 840, or equal to or larger than a maximum diameter of the through hole conductor 840.

Next, a procedure for fabricating the above-described piezoelectric element 610 will be described.

First, a binder, an organic solvent, or the like is applied to piezoelectric ceramic powder that is used for formation of the piezoelectric layer 636, resulting in a paste. With the obtained paste, a plurality of green sheets having a predetermined size are fabricated, for example, using a doctor blade method. In this case, a plasticizer to binder ratio is adjusted so that sufficient deformation is obtained.

In each green sheet, a through hole is formed in a portion in which the through hole conductor 840 is formed, using a YAG laser.

An electrode paste serving as the electrode layer 830 (for example, a Pd—Ag alloy (Pd:Ag=3:7)) is coated on each green sheet using a screen printing method and formed so that the electrode paste becomes the above-described pattern. When the electrode paste is applied, the through hole formed in the green sheet is filled with the electrode paste, but a rate of filling of the through hole with the electrode paste is adjusted according to a contraction rate at the time of drying of the electrode paste. Further, by causing the contraction rate at the time of sintering to be equal to or smaller than 80%, a recess 40a to be described below is efficiently formed.

Subsequently, a plurality of green sheets on which the electrode paste has been printed are overlapped, and press processing such as warm isostatic pressing (WIP) is performed to obtain a green laminated body. In the warm isostatic pressing, pressing is performed, for example, at about 250 MPa at a temperature of about 80° C. In this case, a portion that becomes the electrode layer near the through hole portion is bent at a high temperature and under an isostatic pressure.

The obtained green laminated body is sintered. Specifically, the green laminated body is placed on a setter including stabilized zirconia, a binder removal process is performed, and the setter having the green laminated body placed thereon is put into a stabilized zirconia sagger and sintered at about 1100° C.

After sintering, a predetermined polarization process is performed to complete the piezoelectric element 810. In the polarization process, for example, a voltage with an electric field intensity of 2 kV/mm is applied for 3 minutes at a temperature of 100° C.

In the piezoelectric element 810 obtained by the above-described procedure, the recesses 840a are formed in both end portions of the through hole conductor 840 in the laminating direction of the laminated body 820, as illustrated in FIG. 46. For example, the first through hole conductor 840A penetrating the first piezoelectric layer 836A includes the recess 840a recessed toward the first through hole conductor 840A (downward in FIG. 46) on the upper surface, and includes the recess 840a recessed toward the first through hole conductor 840A (upward in FIG. 46) on the lower surface (an end surface on the second piezoelectric layer 836B side). Similarly, the second through hole conductor 840B and the third through hole conductor 840C include recesses 840a on upper and lower surfaces thereof.

The through hole conductor 840 is partially thinned (that is, a length in a laminating direction is made shorter) due to the recess 840a. As illustrated in FIG. 46, thicknesses at portions of the recesses 840a of the respective through hole conductors 840A, 840B, and 840C are smaller than the thickness of the piezoelectric layer 836.

Further, a protrusion 836b of the piezoelectric layer 836 enters the recess 840a formed in each through hole conductor 840. For example, the upward protrusion 836b of the second piezoelectric layer 836B enters the recess 840a of the lower surface of the first through hole conductor 840A. Further, the downward protrusion 836b of the first piezoelectric layer 836A enters the recess 840a of the upper surface of the second through hole conductor 840B.

A shape of such a through hole conductor 840, a shape of the electrode layer 830, and a shape of the piezoelectric layer 836 are considered to be obtained by bending the electrode layer near the through hole at a high temperature and isostatic pressure at the time of fabrication of the piezoelectric element 810.

Further, in the piezoelectric element 810 obtained in the above-described procedure, a plurality of voids 848 adjacent to the respective through hole conductors 840 are formed. More particularly, each of the plurality of voids 848 is adjacent to the end portion of each through hole conductor 840 in the laminating direction of the laminated body 820, and is located to enter the recess 840a of each through hole conductor 840. More particularly, the void 848 is located at the protrusion 836b of the piezoelectric layer 836 entering the recess 840a of the through hole conductor 840. Each void 848 has a cross section extending in one direction along the extension direction of the electrode layer 830, as illustrated in FIG. 46. Further, the inside of each void 848 is filled with an inert gas.

As described above, the piezoelectric element 800 is a piezoelectric element including the laminated body 820 in which the electrode layers 830 and the piezoelectric layers 836 are alternately laminated, and the laminated body 820 is a laminated portion including the first through hole conductor 840A penetrating the first piezoelectric layer 836A laminated on one surface of the electrode layer 830B and the second through hole conductor 840B penetrating the second piezoelectric layer 836B laminated on the other surface of the electrode layer 830B, and includes the inactive portion Sa. In the inactive portion Sa, the first through hole conductor 840A includes the first recess 840a on the lower surface (the end surface on the second piezoelectric layer 836B side), the second piezoelectric layer 836B includes the protrusion 836b that enters the first recess 840a, the second through hole conductor 840B includes the second recess 840a on the upper surface (the end surface on the first piezoelectric layer 836A side), and the first piezoelectric layer 836A includes the protrusion 836b that enters the second recess 840a. There are the plurality of voids 848 adjacent to the first recess 840a of the first through hole conductor 840A and the second recess 840a of the second through hole conductor 840B.

In the piezoelectric element 810 described above, internal stress generated in the inactive portion Sa at the time of sintering (that is, residual stress due to contraction at the time of sintering) when the piezoelectric element 810 is fabricated or stress applied from the outside to the inactive portion Sa is absorbed by the recess 840a of the lower surface of the first through hole conductor 840A and the recess 840a of the upper surface of the second through hole conductor 840B. Thus, for example, deformation, rupture, or the like of the through hole conductor 840 is prevented, and conduction failure or disconnection of the electrode layer 830 or the through hole conductor 840 in the inactive portion Sa is prevented.

In addition, in the inactive portion Sa, since the protrusion 836b of the piezoelectric layer 836 enters the recess 840a of the through hole conductor 840, a holding force of the piezoelectric layer 836 with respect to the through hole conductor 836 increases. In a configuration in which the protrusion 836b of the piezoelectric layer 836 enters the recess 840a of the through hole conductors 840, displacement or deformation of the through hole conductor 840 is prevented or obstructed, unlike in a configuration in which end portions (the upper and lower surfaces) of the through hole conductor 840 are flat and the piezoelectric layer does not enter. As a result, conduction failure or disconnection in the inactive portion Sa is further prevented.

In addition, since the void 848 adjacent to the through hole conductors 840 alleviates stress or strain around the through hole conductors 840 in the inactive portion Sa, conduction failure or disconnection of the electrode layer 830 or the through hole conductor 840 is further prevented. Particularly, in the above-described embodiment, there are the plurality of voids 848 in the inactive portion Sa, and the void 848 is adjacent to each of a plurality of through hole conductors 840. Therefore, stress or strain is absorbed in each of the plurality of through hole conductors 840, and conduction failure or disconnection in the inactive portion Sa is further prevented.

A position of the void 848 is not limited to the position adjacent to the through hole conductors 840 in the laminating direction of the laminated body 820 (that is, a vertically-aligned position), and may be a position adjacent to the through hole conductors 840 in a direction orthogonal to the laminating direction (that is, a horizontally-aligned position).

In order to alleviate stresses or strains having a variety of directions or magnitudes, positions (positions relative to the through hole conductors 840) or dimensions of the plurality of voids 848 may not be uniform, and can be nonuniform and irregular. The position is not limited to the position adjacent to the through hole conductors 840 in the laminating direction of the laminated body 820 (that is, a vertically-aligned position), and may be a position adjacent to the through hole conductors 840 in a direction orthogonal to the laminating direction (that is, a horizontally-aligned position).

In the piezoelectric element 810, since the inactive portion Sa of the one end portion 820a side of the laminated body 820 has the same configuration of the electrode layer 830, the piezoelectric layer 836, and the through hole conductor 840 as the inactive portion Sa on the other end portion 820b side described above, the same effects as described above can be obtained also in the inactive portion Sa on the one end portion 820a side.

Further, in the piezoelectric element 810, when stress or the strain is applied from the active portion Sb to the inactive portion Sa with the deformation such as extension, contraction, or vibration in the active portion Sb, such stress or strain is absorbed by the second layer 830B or the third layer 830C.

Stress or strain that is applied from the active portion Sb to the inactive portion Sa will be described herein with reference to FIGS. 47 and 48.

Figure 47:
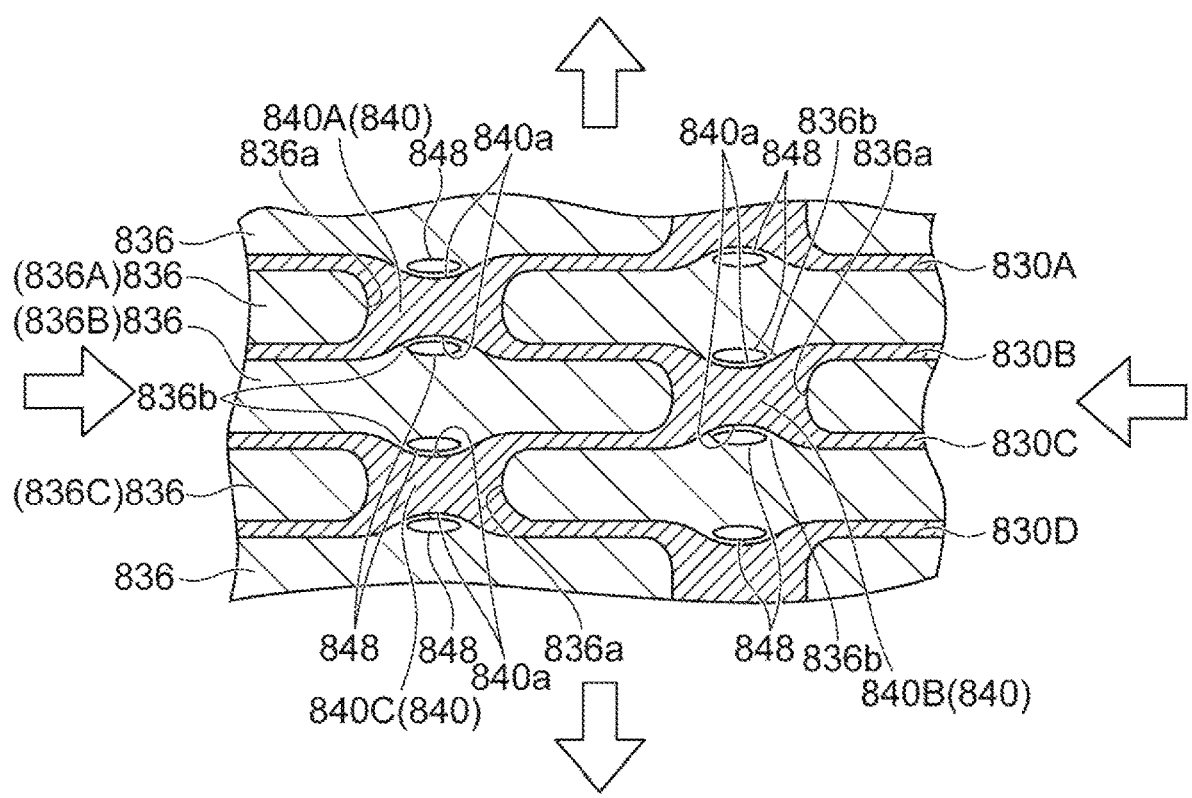
FIG. 47 is a view illustrating a state in which pressure is applied to a piezoelectric element.

FIG. 47 illustrates a state of the inactive portion Sa when the active portion Sb extends in the longitudinal direction of the laminated body 820 due to application of a voltage between the pair of external connection terminals T1 and T2. In this case, compressive stress or compressive strain in the longitudinal direction of the laminated body 820 that is a direction of alignment of the active portion Sb and the inactive portion Sa is applied to the inactive portion Sa. Therefore, the inactive portion Sa generally contracts in the longitudinal direction of the laminated body 820. However, since the through hole conductor 840 and the piezoelectric layer 836 in the inactive portion Sa have the above-described configuration, a depth of the recess 840a is increased according to the contraction of the inactive portion Sa. Thus, the compressive stress and compressive strain with respect to the electrode layer 830 are absorbed. Such deepening of the recess 840a of the through hole conductors 840 may occur even when the inactive portion Sa is pulled in the height direction.

Figure 48:
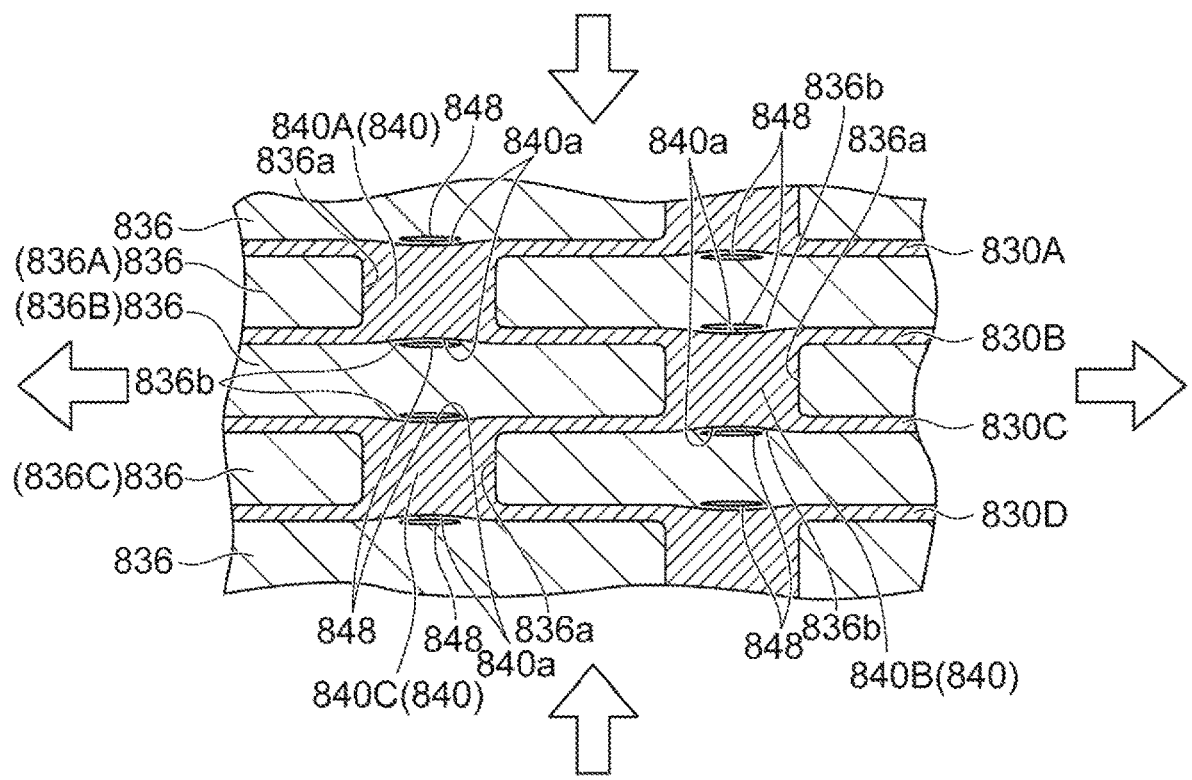
FIG. 48 is a view illustrating a state in which pressure is applied to a piezoelectric element.

FIG. 48 illustrates a state of the inactive portion Sa when the active portion Sb contracts in the longitudinal direction of the laminated body 820 due to application of a voltage between the pair of external connection terminals T1 and T2. In this case, tensile stress or tensile strain in the longitudinal direction of the laminated body 820 that is a direction of alignment of the active portion Sb and the inactive portion Sa is applied to the inactive portion Sa. Therefore, the inactive portion Sa generally extends in the longitudinal direction of the laminated body 820. However, since the through hole conductor 840 and the piezoelectric layer 836 in the inactive portion Sa have the above-described configuration, a depth of the recess 840a is decreased according to the elongation of the inactive portion Sa. Thus, the tensile stress and tensile strain with respect to the electrode layer 830 are absorbed. Such flattening of the recess 840a of the through hole conductors 840 may occur even when the inactive portion Sa is compressed in the height direction.

Figure 49:
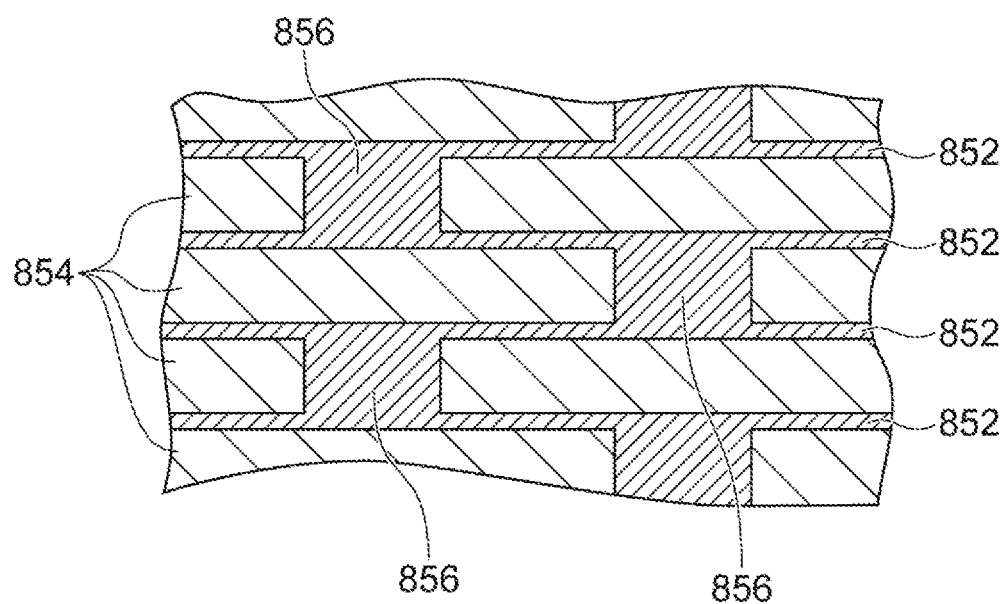
FIG. 49 illustrates an enlarged cross-sectional view of main portions of an inactive portion of the piezoelectric element according to the related art.

FIG. 49 illustrates an enlarged cross-sectional view of main portions in the inactive portion of the piezoelectric element according to the related art. In FIG. 49, reference numerals 852, 854, and 856 indicate the electrode layer, the piezoelectric layer, and the through hole conductor, respectively. The piezoelectric element according to the related art includes the laminated body in which the electrode layer 852 and the piezoelectric layer 854 alternately overlap each other, and the laminated body is obtained by sintering an object obtained by overlapping the electrode materials and the piezoelectric materials, but it is easy for residual stress caused by contraction at the time of sintering to be generated inside the laminated body. Particularly, since constituent materials or physical properties are different between the electrode layer 852 and the piezoelectric layer 854, there is a tendency for stress to be concentrated on an interface therebetween or near the interface. The stress generated at the time of sintering or the like may cause conduction failure or disconnection in the electrode layers 852 or the through hole conductors 856 and degrade connection reliability of the piezoelectric element.

As illustrated in FIG. 49, end surfaces (upper and lower surfaces) of the through hole conductor 856 according to the related art are flat and have no recesses. Therefore, in the piezoelectric element according to the related art, it is not possible to alleviate the stress or the strain that is applied to the inactive portion. As a result, the electrode layer 852 may detach or be disconnected from the through hole conductor 856.

In the piezoelectric element 810 described above, the stress or the strain that is applied from the active portion Sb to the inactive portion Sa at the time of polarization or at the time of driving is absorbed. Accordingly, conduction failure or disconnection of the electrode layer 830 or the through hole conductor 840 in the laminated portion is prevented.

Tenth Embodiment

Next, a configuration of the piezoelectric element 900 according to a tenth embodiment will be described with reference to FIGS. 50 to 53.

Figure 50:
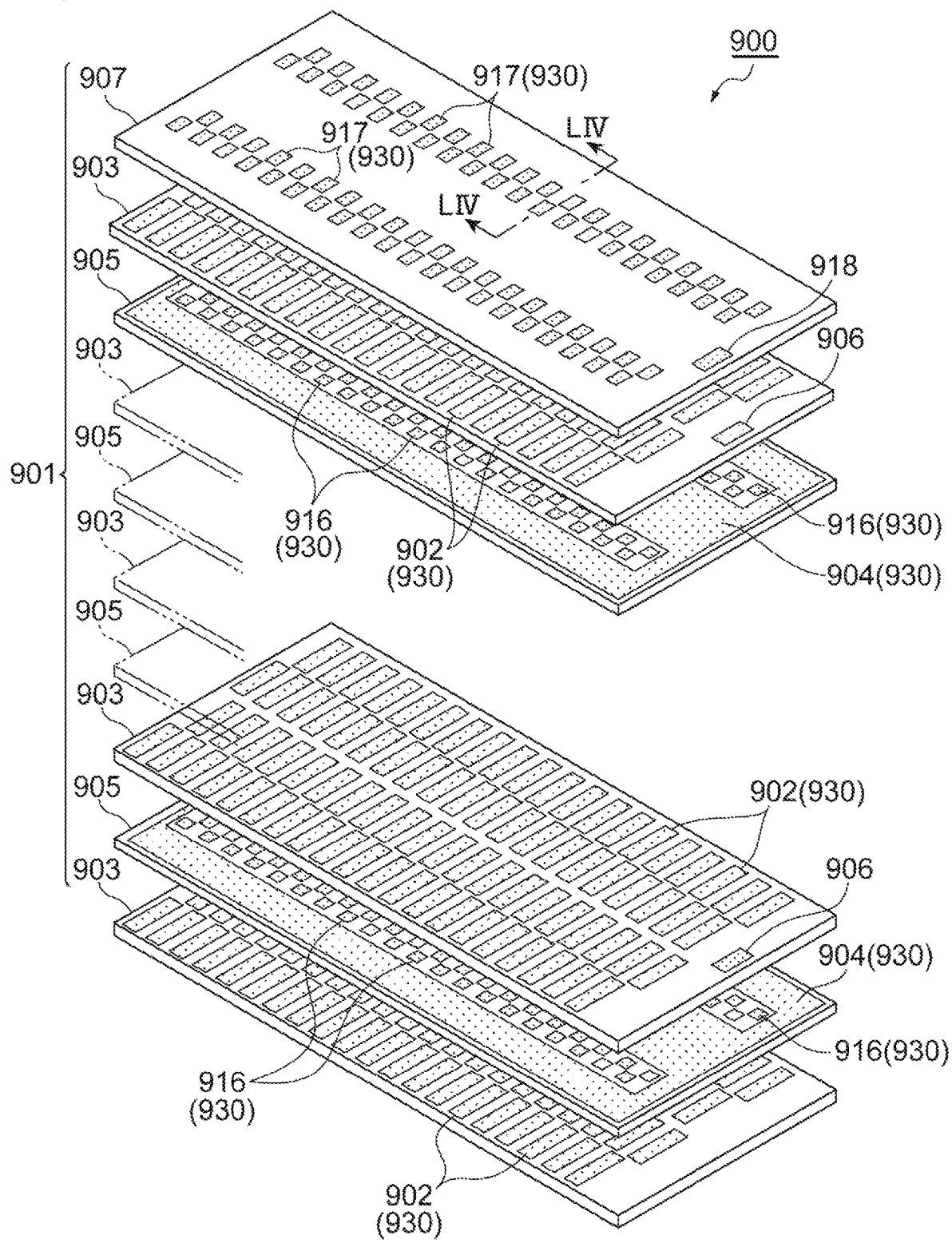
FIG. 50 is an exploded perspective view of a piezoelectric element according to a tenth embodiment of the present disclosure.

As illustrated in FIG. 50, the piezoelectric element 900 is configured such that a plurality of piezoelectric layers 903 having individual electrodes 902 formed therein and a plurality of piezoelectric layers 905 having a common electrode 904 formed therein are alternately laminated, and a piezoelectric layer 907 having terminal electrodes 917 and 918 formed thereon is laminated on an uppermost layer.

The piezoelectric element 900 includes a laminated body 901 having an outer shape of a rectangular parallelepiped which extends in one direction. The dimensions of the laminated body 901 are, for example, 30.0 mm in a longitudinal direction length, 15.0 mm in a lateral direction length, and 0.30 mm in a thickness.

All of the plurality of piezoelectric layers 903 and 907 have a rectangular flat plate shape and have, for example, a longitudinal direction length of 30.0 mm, a lateral direction length of 15.0 mm, and a thickness of 30 µm. Each piezoelectric layer 36 is formed of, for example, a piezoelectric ceramic material mainly containing lead zirconate titanate, and contains additives such as Nb and Sr.

Each of the piezoelectric layers 903, 905, and 907 is formed of a piezoelectric ceramic material mainly containing lead zirconate titanate and is formed, for example, in a rectangular thin plate shape of "15 mm×30 mm and a thickness of 30 µm". Further, the individual electrode 902, the common electrode 904, and the terminal electrodes 917 and 918 are formed of an Ag—Pd alloy (Ag 70 wt % and Pd 30 wt %), and may be formed of a conductive material (Ag—Pt alloy, Au—Pd alloy, Cu, Ni, or the like) other than an Ag—Pd alloy. The electrodes may be patterned by screen printing.

Figure 51:
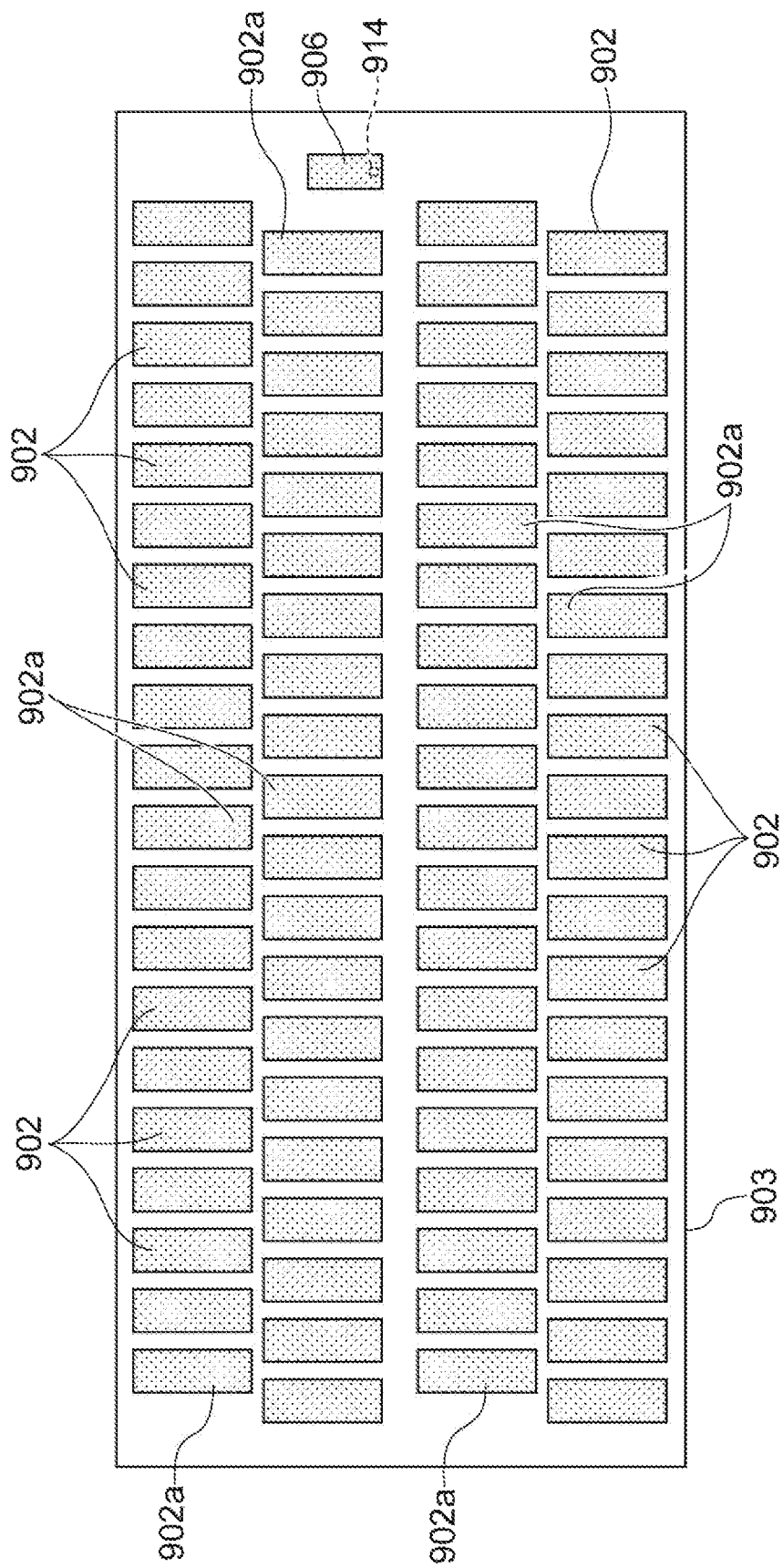
FIG. 51 is a plan view of piezoelectric layers of a second layer, a fourth layer, a sixth layer, and an eighth layer of the piezoelectric element illustrated in FIG. 50.

A plurality of rectangular individual electrodes 902 are arranged in a zigzag manner on the upper surfaces of the piezoelectric layers 903 as the second layer, the fourth layer, the sixth layer, and the eighth layer from the piezoelectric layer 907 that is an uppermost layer, as illustrated in FIG. 51. The longitudinal direction of each individual electrode 902 is arranged to be orthogonal to the longitudinal direction of the piezoelectric layer 903, and adjacent individual electrodes 902 and 902 are arranged at a predetermined interval such that the adjacent individual electrodes are electrically independent from each other and are prevented from being affected by each other's vibration.

Here, when the longitudinal direction of the piezoelectric layer 3 is a column direction and a direction orthogonal to the longitudinal direction is a row direction, the individual electrodes 902 are arranged, for example, side by side in a zigzag shape in four rows. By arranging the plurality of individual electrodes 902 in a zigzag shape, it becomes possible to efficiently arrange the individual electrodes on the piezoelectric layers 903. Thus, it is possible to achieve a small size of the piezoelectric element 900 and high integration of the individual electrodes 902 while maintaining an area of the active portion contributing to deformation in the piezoelectric layer 903.

Figure 54:
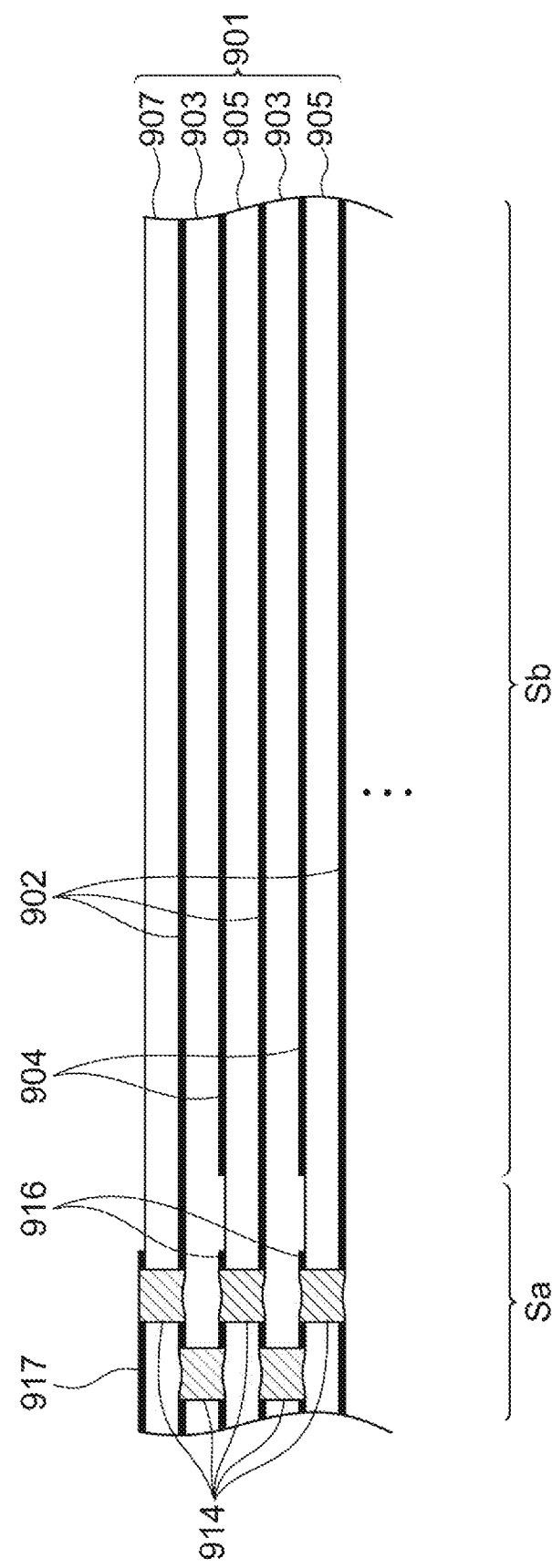
FIG. 54 is a cross-sectional view taken along line LIV-LIV of the piezoelectric element illustrated in FIG. 50.

Each individual electrode 902 has an end portion facing the adjacent individual electrode as a connection end portion 902a, and is connected to the through hole conductor 914 penetrating the piezoelectric layer 903, as illustrated in FIG. 54, immediately below the connection end portion 902a. The through hole conductor 914 is formed by filling the through hole 936a provided in the piezoelectric layer 903 with an electrode material.

Further, a relay electrode 906 for electrically connecting the common electrodes 904 of the piezoelectric layers 905 located on and beneath the piezoelectric layer 903 is formed in an edge portion of the upper surface of the piezoelectric layer 903. The relay electrode 906 is connected to the through hole conductor 914 penetrating the piezoelectric layer 903 immediately below the relay electrode 906.

The individual electrodes 902 are arranged in a zigzag manner on the upper surface of the piezoelectric layer 903 as the lowermost layer, similar to the piezoelectric layers 903 as the second layer, the fourth layer, the sixth layer, and the eighth layer described above. However, the piezoelectric layer 903 as the lowermost layer is different from the piezoelectric layers 903 of the second layer, fourth layer, the sixth layer, and the eighth layer in that the relay electrode 906 and the through hole conductors 914 are not formed.

Figure 52:
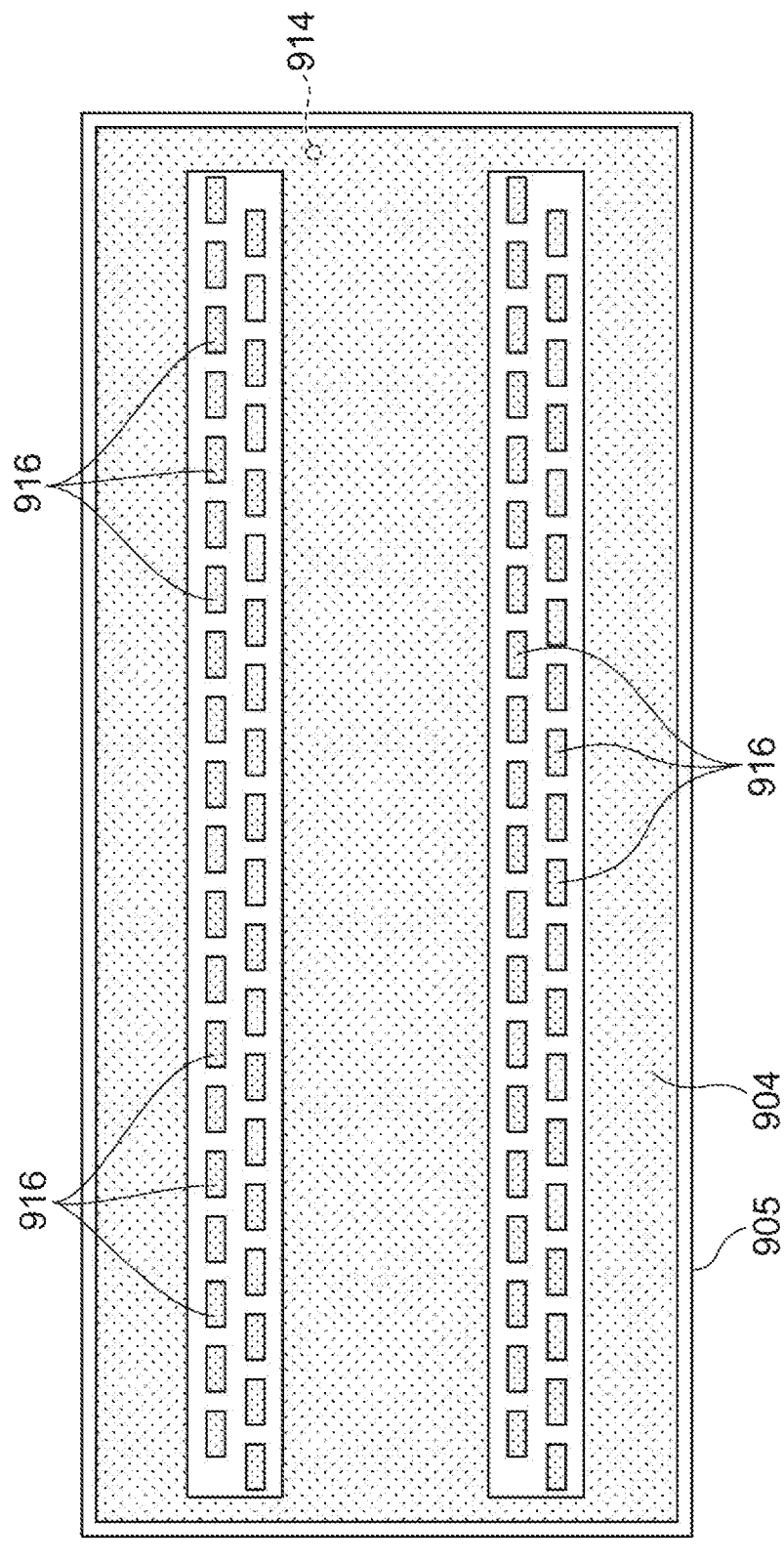
FIG. 52 is a plan view of piezoelectric layers of a third layer, a fifth layer, and a seventh layer of the piezoelectric element illustrated in FIG. 50.

Further, a relay electrode 916 is formed to face each connection end portion 902a of the piezoelectric layer 903 in the laminating direction of the laminated body 901 (that is, a thickness direction of the laminated piezoelectric element 900), as illustrated in FIG. 52, on the upper surfaces of the piezoelectric layers 905 of the third layer, the fifth layer, the seventh layer, and the ninth layer from the piezoelectric layer 907 as the uppermost layer. Each relay electrode 916 is connected to the through hole conductor 914 penetrating the piezoelectric layer 905, as illustrated in FIG. 54, directly below the relay electrode 916. The through hole conductor 914 is formed by filling the through hole 936a provided in the piezoelectric layer 905 with an electrode material.

Further, the common electrode 904 is formed on the upper surface of the piezoelectric layer 905. The common electrode 904 surrounds a set of relay electrodes 916 in first and second rows and a set of relay electrodes 916 in the third and fourth rows at a predetermined interval, and overlaps a portion other than the connection end portion 902a of each individual electrode 902 when viewed in the laminating direction. Thus, an entire portion facing the portion other than the connection end portions 902a of each individual electrode 902 in the piezoelectric layers 903 and 905 can be effectively used as an active portion (the active portion Sb in FIG. 54) contributing to the deformation. Further, the common electrode 904 is formed at a predetermined interval from the outer circumferential portion of the piezoelectric layer 905, and is connected to the through hole conductor 914 penetrating the piezoelectric layer 905 to face the relay electrode 906 of the piezoelectric layer 903 in the laminating direction.

The relay electrodes 916 and the common electrode 904 are formed on the upper surface of the piezoelectric layer 905 of the ninth layer, similar to the piezoelectric layers 905 of the third layer, the fifth layer, and the seventh layer described above. However, the piezoelectric layer 905 of the ninth layer is different from the piezoelectric layers 905 of the third layer, the fifth layer, and the seventh layer in that the through hole conductor 914 facing the relay electrode 906 of the piezoelectric layer 903 in the laminating direction is not formed.

Figure 53:
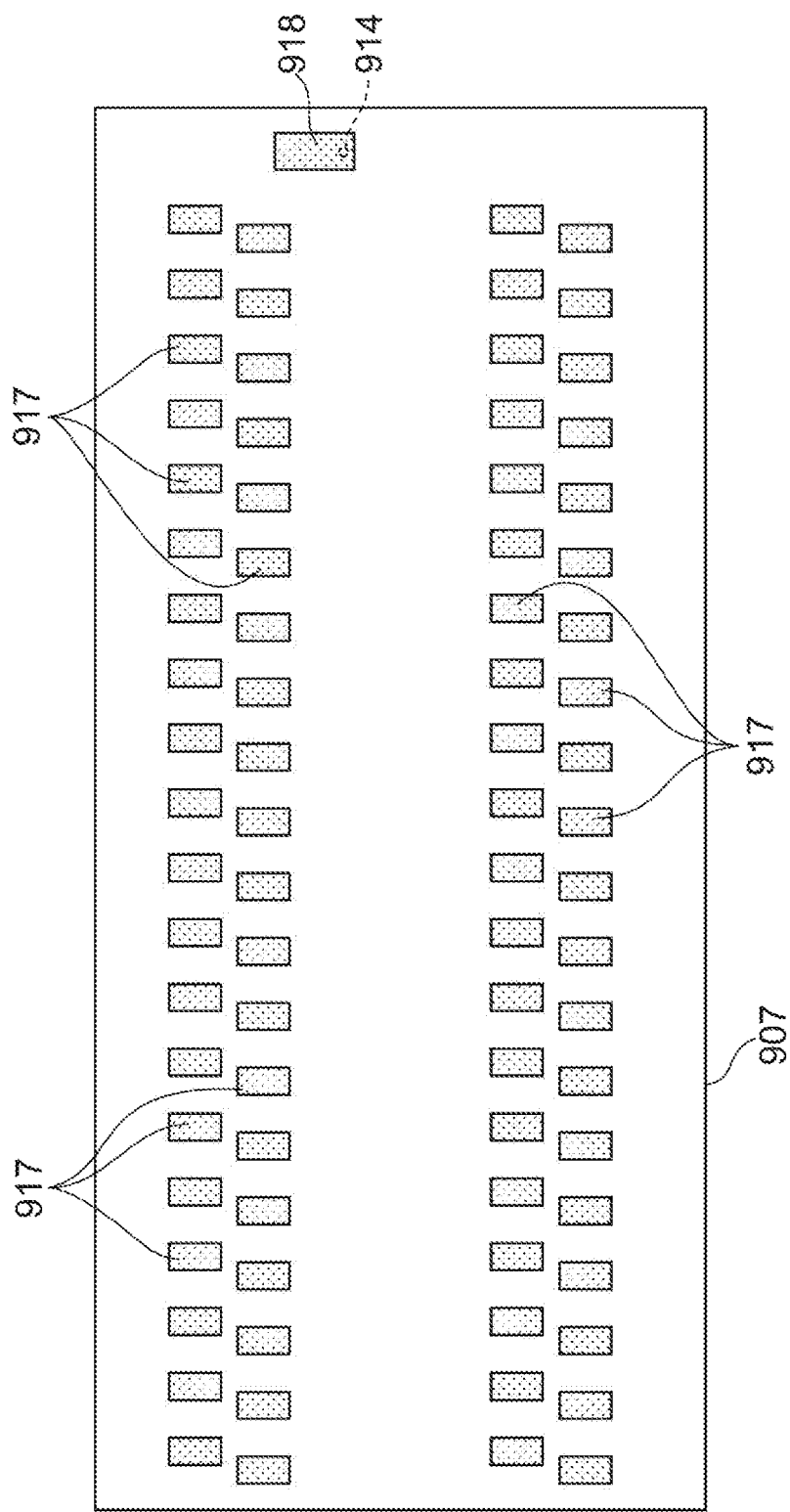
FIG. 53 is a plan view of a piezoelectric layer of an uppermost layer of the piezoelectric element illustrated in FIG. 50.

Further, the terminal electrode 917 is formed to face the connection end portion 902a of each individual electrode 902 of the piezoelectric layer 903 in the laminating direction, as illustrated in FIG. 53, on the upper surface of the piezoelectric layer 907 as the uppermost layer, and the terminal electrode 918 is formed to face the relay electrode 906 of the piezoelectric layer 903 in the laminating direction. The respective terminal electrodes 917 and 918 are connected to the through hole conductor 914 penetrating the piezoelectric layer 907 immediately below the terminal electrodes 917 and 918.

Lead wires of a flexible printed circuit board (FPC) or the like for connection to a driving power supply are soldered to the terminal electrodes 917 and 918. Therefore, in order to easily place solder when lead wires are soldered, a surface electrode layer formed of a conductive material including Ag in order to improve solder wettability in the terminal electrodes 917 and 918 is formed on an underlying electrode layer formed of a conductive material including Ag and Pd.

The thickness of the terminal electrodes 917 and 918 formed on the piezoelectric layer 907 as the uppermost layer is greater than the thickness of the other electrode layers 902, 904, and 916 and is about 1 to 2 μm. The thickness of the terminal electrodes 917 and 918 is, 5 to 50% or 10 to 30% greater than the thickness of the other electrode layer 902, 904, and 916.

A dummy electrode pattern may be arranged in a circumferential portion of the upper surface of the piezoelectric layer 907 as the uppermost layer. By arranging the dummy electrode pattern in the circumferential portion, an effect that a deviation of pressure is reduced at the time of pressing and variation in a green density after pressing can be reduced is obtained.

By laminating the piezoelectric layers 903, 905, and 907 on which the electrode pattern has been formed as described above, four common electrodes 904 are aligned with the relay electrode 906 interposed therebetween in a laminating direction with respect to the terminal electrode 918 as the uppermost layer, and the respective aligned electrode layers 904 and 906 are electrically connected by the through hole conductor 914.

Further, five individual electrodes 902 are aligned with the relay electrode 916 interposed therebetween in the laminating direction with respect to the respective terminal electrodes 917 as the uppermost layer, and the respective aligned electrode layers 902 and 916 are electrically connected by the through hole conductors 914, as illustrated in FIG. 54.

The through hole conductors 914 which are adjacent when viewed in the laminating direction of the laminated body 901 are designed so that central axes thereof do not overlap, as illustrated in FIG. 54, and are formed on the piezoelectric layers 903 and 905 to be adjacent in the extension direction of the individual electrodes 902 at a predetermined interval when viewed in the laminating direction. By arranging adjacent through hole conductors 914 as described above, electrical connection is reliably made by the through hole conductors 574.

The laminated piezoelectric element 900 has the electrical connection as described above. Accordingly, when a voltage is applied between a predetermined terminal electrode 917 and the terminal electrode 918, a voltage is applied between the individual electrodes 902 and the common electrode 904, and the active portion Sb that is a portion in which the piezoelectric layers 903 and 905 are interposed between the individual electrodes 902 and the common electrodes 904 is displaced. Thus, by selecting the terminal electrode 917 to which the voltage is applied, the active portion Sb aligned under the selected terminal electrode 917 among the active portions Sb corresponding to the respective individual electrodes 902 arranged in a matrix form can be displaced in the laminating direction. Such a laminated piezoelectric element 900 is applied to a driving source for various devices requiring small displacement, such as in valve control of a micropump.

On the other hand, since the portion in which the connection end portion 902a of the individual electrode 902 and the relay electrode 916 overlap is a laminated portion in which the electrode layers with the same polarity overlap, the portion is hardly deformed even when a voltage is applied. Therefore, as illustrated in FIG. 54, the portion in which the connection end portion 902a of the individual electrode 902 and the relay electrode 916 overlap is the inactive portion Sa which does not contribute to the deformation. Further, deformation of the piezoelectric layer 907 as the uppermost layer hardly occurs even when a voltage is applied since the individual electrode 902 is located only under the piezoelectric layer 907 as the uppermost layer. In the laminated body 901, the through hole conductor 914 is provided only in the portion in which the deformation does not substantially occur when a voltage is applied (that is, the portion in which the connection end portion 902a of the individual electrode 902 and the relay electrode 916 overlap).

Figure 55:
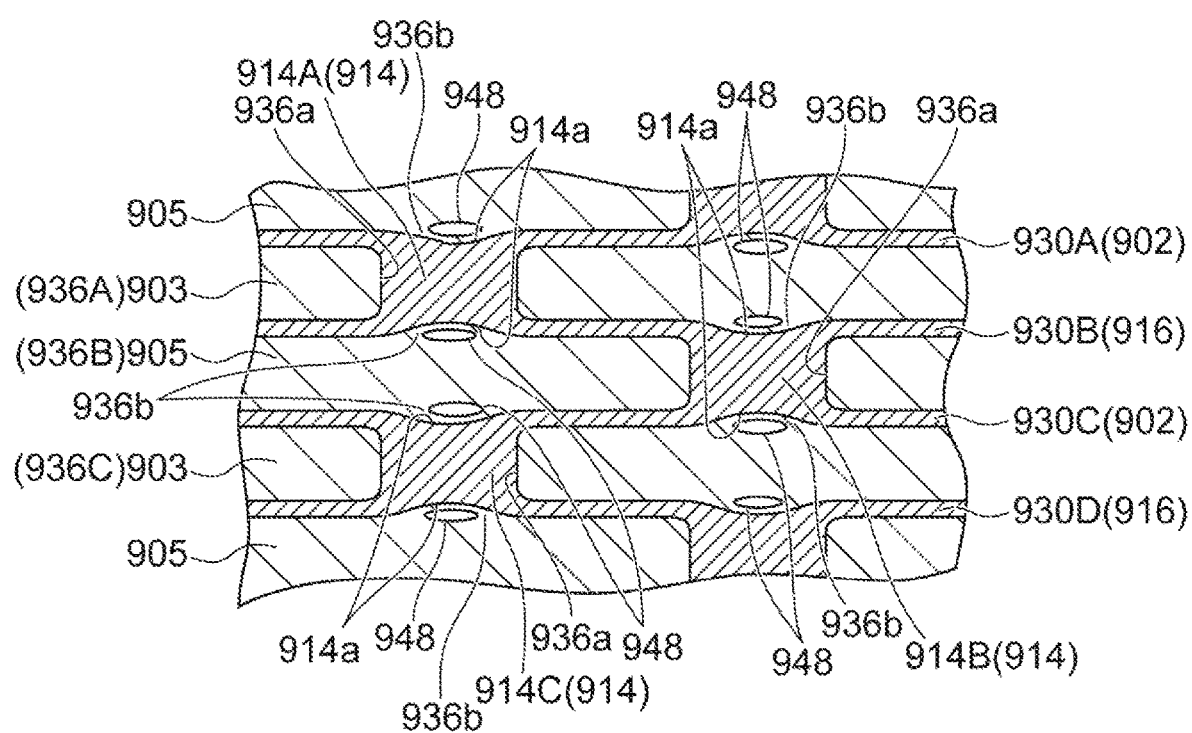
FIG. 55 is an enlarged cross-sectional view of main portions in the inactive portion of the piezoelectric element illustrated in FIG. 50.

As illustrated in FIGS. 54 and 55, in the inactive portion Sa, the electrode layers 930 (more specifically, the individual electrodes 902 and the relay electrodes 916) having the same polarity overlap via the piezoelectric layers 903 and 905. For convenience of description, the overlapping electrode layers 930 are also referred to as a first layer 930A, a second layer 930B, a third layer 930C, and a fourth layer 930D in this order from the upper side. Further, the piezoelectric layer 903 interposed between the first layer 930A and the second layer 930B is particularly referred to as a first piezoelectric layer 936A, the piezoelectric layer 905 interposed between the second layer 930B and the third layer 930C is particularly referred to as a second piezoelectric layer 936B, and the piezoelectric layer 903 interposed between the third layer 930C and the fourth layer 930D is particularly referred to as a third piezoelectric layer 936C.

The first layer 930A, the second layer 930B, the third layer 930C, and the fourth layer 930D that are adjacent are connected by the through hole conductor 914 penetrating the piezoelectric layers 903 and 905. However, vertically adjacent through hole conductors 914 do not overlap when viewed in the thickness direction (the laminating direction of the laminated body 901) and are adjacent. Specifically, the first through hole conductor 914A of the first piezoelectric layer 936A and the second through hole conductor 914B of the second piezoelectric layer 936B do not overlap when viewed in the thickness direction and are arranged to be misaligned in the horizontal direction (that is, the extension direction of the individual electrode 902) in FIG. 54. Further, the second through hole conductor 914B and the third through hole conductor 914C of the third piezoelectric layer 936C do not overlap when viewed in the thickness direction and are arranged to be misaligned in a horizontal direction in FIG. 54. The third through hole conductor 914C of the third piezoelectric layer 936C overlaps the first through hole conductor 914A of the first piezoelectric layer 936A when viewed in the thickness direction. The amount of misalignment of the through hole conductors 914 is, for example, equal to or larger than a maximum radius of the through hole conductor 514, or equal to or larger than a maximum diameter of the through hole conductor 914.

A procedure of fabricating the piezoelectric element 900 is the same as the procedure of fabricating the piezoelectric element 810 described above. That is, green sheets coated with a predetermined pattern of electrode paste overlap, and press processing such as warm isostatic pressing is performed to obtain a laminated green sheet. In this case, a portion to be the electrode layer near the through hole is bent at a high temperature and isostatic pressure. The obtained green laminated body is sintered and a predetermined polarization process is performed to complete the piezoelectric element 900.

In the piezoelectric element 900 obtained by the above-described procedure, the recesses 914a are formed in both end portions of the through hole conductor 914 in the laminating direction of the laminated body 901, as illustrated in FIG. 55. For example, the first through hole conductor 914A penetrating the first piezoelectric layer 936A includes the recess 914a recessed toward the first through hole conductor 914A (downward in FIG. 54) on the upper surface, and includes the recess 914a recessed toward the first through hole conductor 914A (upward in FIG. 54) on the lower surface (an end surface on the second piezoelectric layer 936B side). Similarly, the second through hole conductor 914B and the third through hole conductor 914C include recesses 914a on upper and lower surfaces thereof.

The through hole conductor 914 is partially thinned (that is, a length in a laminating direction is made shorter) due to the recess 914a. As illustrated in FIG. 54, thicknesses at portions of the recesses 914a of the respective through hole conductors 914A, 914B, and 914C are smaller than the thicknesses of the piezoelectric layers 936A, 936B, and 936C.

Further, the protrusions 936b of the piezoelectric layers 936A, 936B, and 936C enter the recesses 914a formed in the respective through hole conductors 440. For example, the upward protrusion 936b of the second piezoelectric layer 936B enters the recess 914a of the lower surface of the first through hole conductor 914A. Further, the downward protrusion 936b of the first piezoelectric layer 936A enters the recess 914a of the upper surface of the second through hole conductor 914B.

A shape of such a through hole conductor 914, a shape of the electrode layer 930, and shapes of the piezoelectric layers 903 and 905 are considered to be obtained by bending the electrode layer near the through hole at a high temperature and isostatic pressure at the time of fabrication of the piezoelectric element 900.

Further, in the piezoelectric element 900 obtained in the above-described procedure, a plurality of voids 948 adjacent to the respective through hole conductors 914 are formed. More particularly, each of the plurality of voids 948 is adjacent to the end portion of each through hole conductor 914 in the laminating direction of the laminated body 901, and is located to enter the recess 914a of each through hole conductor 914. More particularly, the void 948 is located at the protrusion 936b of the piezoelectric layers 936A, 936B, and 936C entering the recess 914a of the through hole conductor 914. Each void 948 has a cross section extending in one direction along the extension direction of the electrode layer 930, as illustrated in FIG. 55. Further, the inside of each void 948 is filled with an inert gas.

The piezoelectric element 900 according to the tenth embodiment is a piezoelectric element including the laminated body 901 in which the electrode layers 930 and the piezoelectric layers 903 and 905 are alternately laminated, and the laminated body 901 is a laminated portion including the first through hole conductor 914A penetrating the first piezoelectric layer 936A laminated on one surface of the electrode layer 930B and the second through hole conductor 914B penetrating the second piezoelectric layer 936B laminated on the other surface of the electrode layer 930B, and includes the inactive portion Sa. In the inactive portion Sa, the first through hole conductor 914A includes the first recess 914a on the lower surface (the end surface on the second piezoelectric layer 936B side), the second piezoelectric layer 936B includes the protrusion 936b that enters the first recess 914a, the second through hole conductor 914B includes the second recess 914a on the upper surface (the end surface on the first piezoelectric layer 936A side), and the first piezoelectric layer 936A includes the protrusion 936b that enters the second recess 914a. There are a plurality of voids 948 adjacent to the first recess 914a of the first through hole conductor 914A and the second recess 914a of the second through hole conductor 914B.

In the piezoelectric element 900 according to the tenth embodiment, internal stress generated in the inactive portion Sa at the time of sintering when the piezoelectric element 900 is fabricated or stress applied from the outside to the inactive portion Sa is absorbed by the recess 914a of the lower surface of the first through hole conductor 914A and the recess 914a of the upper surface of the second through hole conductor 914B, similar to the piezoelectric element 810 according to the ninth embodiment described above. Thus, for example, deformation, rupture, or the like of the through hole conductor 914 is prevented, and conduction failure or disconnection of the electrode layer 930 or the through hole conductor 914 is prevented.

In addition, in the inactive portion Sa, since the protrusions 936b of the piezoelectric layers 903 and 905 enter the recesses 914a of the through hole conductor 914, a holding force of the piezoelectric layers 903 and 905 with respect to the through hole conductor 914 increases. In the configuration in which the protrusions 936b of the piezoelectric layers 903 and 905 enter the recesses 914a of the through hole conductor 914, displacement or deformation of the through hole conductor 914 is prevented or obstructed, unlike in a configuration in which end surfaces (the upper and lower surfaces) of the through hole conductor 40 are flat and the piezoelectric layer does not enter. As a result, conduction failure or disconnection in the inactive portion Sa is further prevented.

In addition, since the void 948 adjacent to the through hole conductors 914 alleviates stress or strain around the through hole conductors 914 in the inactive portion Sa, conduction failure or disconnection of the electrode layer 930 or the through hole conductor 914 is further prevented. Particularly, in the above-described embodiment, there are the plurality of voids 948 in the inactive portion Sa, and the void 948 is adjacent to each of a plurality of through hole conductors 914. Therefore, stress or strain is absorbed in each of the plurality of through hole conductors 914, and conduction failure or disconnection in the inactive portion Sa is further prevented.

A position of the void 948 may be a vertically-aligned position or a horizontally-aligned position with respect to the through hole conductor 914, similar to the position of the void 848 of the ninth embodiment described above.

Further, in the piezoelectric element 900 according to the tenth embodiment, the stress or the strain that is applied from the active portion Sb to the inactive portion Sa at the time of polarization or at the time of driving is absorbed since the through hole conductors 914 and the piezoelectric layer 903 and 905 have the above configuration in the laminated portion of the inactive portion Sa, similar to the piezoelectric element 810 according to the ninth embodiment described above. Accordingly, conduction failure or disconnection of the electrode layer 930 or the through hole conductor 914 in the laminated portion is prevented.

The present disclosure is not limited to the ninth embodiment and the tenth embodiment described above. For example, the number of electrode layers or piezoelectric layers of the laminated body of the piezoelectric element can be appropriately increased or decreased as long as the number is equal to or greater than a required minimum number of layers constituting the above-described laminated portion (that is, three or more electrode layers and two or more piezoelectric layers). Further, a total thickness of the laminated body, a thickness of the electrode layer, and a thickness of the piezoelectric layer can be appropriately increased or decreased. Further, the number of voids in the inactive portion Sa can be appropriately increased or decreased, and an aspect in which there is only one void in the inactive portion Sa (for example, a void adjacent to any one of the first through hole conductor and the second through hole conductor), an aspect in which there is a void for each through hole conductor, or an aspect in which there are a plurality of voids for each through hole conductor may be adopted.

What is claimed is:

1. A piezoelectric element comprising a laminated body having electrode layers and piezoelectric layers laminated alternately,
wherein:
the laminated body includes a first through hole conductor penetrating a first piezoelectric layer laminated on one surface of an electrode layer, and a second through hole conductor penetrating a second piezoelectric layer laminated on a second surface of the electrode layer, the first surface and the second surface are opposing surfaces;
the first through hole conductor includes a first recess on a first end surface facing the second piezoelectric layer and the second piezoelectric layer includes a first protrusion entering the first recess; and
the second through hole conductor includes a second recess on a second end surface facing the first piezoelectric layer, and the first piezoelectric layer includes a second protrusion entering the second recess.

2. The piezoelectric element according to claim 1, wherein the laminated body includes:
an active portion configured to be deformed in which an electric field is generated in the piezoelectrics layers when a voltage is applied; and
an inactive portion in which an electric field is not generated in the piezoelectric layers even when a voltage is applied,
wherein the first through hole conductor and the second through hole conductor are adjacent in a direction in which the active portion and the inactive portion are aligned when viewed in a laminating direction of the laminated body.

3. The piezoelectric element according to claim 1, wherein a thickness of the first through hole conductor is smaller than a thickness of the first piezoelectric layer, or a thickness of the second through hole conductor is smaller than a thickness of the second piezoelectric layer.

4. A piezoelectric element, comprising:
a laminated body having a pair of electrode layers, a piezoelectric layer interposed between the pair of electrode layers, and a through hole conductor penetrating the piezoelectric layer,
wherein there is a void adjacent to the through hole conductor.

5. The piezoelectric element according to claim 4, further comprising:
an active portion configured to be deformed in which an electric field is generated in the piezoelectric layer when a voltage is applied, and
an inactive portion in which an electric field is not generated in the piezoelectric layer when a voltage is applied.

6. The piezoelectric element according to claim 4, wherein an area of an end surface of the through hole conductor is smaller than an area of a cross section at a center position of the through hole conductor in a laminating direction of the laminated body.

7. A piezoelectric element, comprising:
a laminated body having a pair of electrode layers, a piezoelectric layer interposed between the pair of electrode layers, and a through hole conductor penetrating the piezoelectric layer,
wherein a recess is formed in each of both end portions of the through hole conductor in a laminating direction of the laminated body.

8. The piezoelectric element according to claim 7, further comprising:
an active portion configured to be deformed in which an electric field is generated in the piezoelectric layer when a voltage is applied, and
an inactive portion in which an electric field is not generated in the piezoelectric layer when a voltage is applied.

9. The piezoelectric element according to claim 7, wherein the piezoelectric layer includes a protrusion entering the recess of the through hole conductor.

10. The piezoelectric element according to claim 7, wherein an area of end surfaces of the both end portions of the through hole conductor is smaller than an area of a cross section at a center position of the through hole conductor in the laminating direction of the laminated body.

11. A piezoelectric element, comprising:
a laminated body including a pair of electrode layers, a piezoelectric layer interposed between the pair of electrode layers, and a through hole conductor penetrating the piezoelectric layer,
wherein the through hole conductor includes a widened portion between both end surfaces of the through hole conductor in a laminating direction of the laminated body in which a cross section perpendicular to the laminating direction is larger than an area of each of the both end surfaces.

12. The piezoelectric element according to claim 11, wherein the laminated body includes:
an active portion configured to be deformed in which an electric field is generated in the piezoelectric layer when a voltage is applied; and
an inactive portion in which an electric field is not generated in the piezoelectric layer when a voltage is applied.

13. The piezoelectric element according to claim 11, wherein the widened portion of the through hole conductor is at a center position of the through hole conductor in the laminating direction of the laminated body.

14. The piezoelectric element according to claim 11, wherein:
the widened portion forms a protrusion of the through hole conductor into the piezoelectric layer; and
the piezoelectric, layer extends between the protrusion and the electrode layers.

15. A piezoelectric element comprising a laminated body having electrode layers and piezoelectric layers laminated alternately,
wherein:
the laminated body includes a first through hole conductor penetrating a first piezoelectric layer laminated on one surface of an electrode layer, and a second through hole conductor penetrating a second piezoelectric layer laminated on a second surface of the electrode layer, the first surface and the second surface are opposing surfaces;
the first through hole conductor includes a first recess on a first end surface facing the second piezoelectric layer and the second piezoelectric layer includes a first protrusion entering the first recess;

the second through hole conductor includes a second recess on a second end surface facing the first piezoelectric layer and the first piezoelectric layer includes a second protrusion entering the second recess; and there is at least one void adjacent to at least one of the first recess of the first through hole conductor and the second recess of the second through hole conductor.

16. The piezoelectric element according to claim 15, comprising:

an active portion configured to be deformed in which an electric field is generated in a piezoelectric layer when a voltage is applied, and an inactive portion in which an electric field is not generated in the piezoelectric layer when a voltage is applied wherein the laminated portion is located in the inactive portion, and the first through hole conductor and the second through hole conductor are adjacent in a direction in which the active portion and the inactive portion are aligned when viewed in a laminating direction of the laminated body.

17. The piezoelectric element according to claim 15, comprising:

a plurality of voids, wherein one of the plurality of voids is adjacent to each of the first recess of the first through hole conductor and the second recess of the second through hole conductor.

18. The piezoelectric element according to claim 11, wherein the widened portion includes a protrusion projecting in a direction perpendicular to the laminating direction.

* * * * *